(12) United States Patent
Nakatani

(10) Patent No.: US 8,175,199 B2
(45) Date of Patent: May 8, 2012

(54) WIRELESS RECEIVER

(75) Inventor: Toshifumi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 1132 days.

(21) Appl. No.: 11/916,000

(22) PCT Filed: Jun. 15, 2006

(86) PCT No.: PCT/JP2006/312036
§ 371 (c)(1),
(2), (4) Date: Nov. 29, 2007

(87) PCT Pub. No.: WO2006/137324
PCT Pub. Date: Dec. 28, 2006

(65) Prior Publication Data
US 2009/0310712 A1 Dec. 17, 2009

(30) Foreign Application Priority Data
Jun. 22, 2005 (JP) .................................. 2005-182096

(51) Int. Cl.
*H04L 27/06* (2006.01)
(52) U.S. Cl. ............. 375/344; 375/324; 375/340; 331/4
(58) Field of Classification Search ................... 375/324, 375/340, 344; 331/34
See application file for complete search history.

(56) References Cited

U.S. PATENT DOCUMENTS

| | | | |
|---|---|---|---|
| 5,940,746 A | 8/1999 | Otting et al. | |
| 6,307,896 B1 | 10/2001 | Gumm et al. | |
| 6,803,970 B1 * | 10/2004 | Limberg et al. | 348/725 |
| 2003/0203720 A1 | 10/2003 | Oosawa et al. | |
| 2005/0068119 A1 | 3/2005 | Uozumi et al. | |

FOREIGN PATENT DOCUMENTS

| | | |
|---|---|---|
| JP | 08-265382 | 10/1996 |
| JP | 09-232989 | 9/1997 |
| JP | 11-355810 | 12/1999 |
| JP | 2001-103024 | 4/2001 |
| JP | 2001-510672 | 7/2001 |
| JP | 2003-318732 | 11/2003 |
| JP | 2004-260775 | 9/2004 |
| JP | 2005-109618 | 4/2005 |
| KR | 2001-0027389 | 4/2001 |
| WO | 99/30420 | 6/1999 |

OTHER PUBLICATIONS

International Search Report mailed Sep. 19, 2006 for International Application No. PCT/JP2006/312036.

* cited by examiner

*Primary Examiner* — Curtis Odom
(74) *Attorney, Agent, or Firm* — Wenderoth, Lind & Ponack, L.L.P.

(57) ABSTRACT

A wireless receiver realizes multi-band and multi-mode operations while reducing power consumption of a local oscillator. The receiver includes the local oscillator for discontinuously changing a band of a local oscillation signal corresponding to a frequency band of an RF signal to be received and outputting the local oscillation signal, a frequency converter for converting the RF signal into an IF signal by using the local oscillation signal, and a demodulator for demodulating the IF signal. The local oscillator detects a frequency variation range of the local oscillation signal, obtains a frequency equivalent to an integral multiple of a symbol rate from the frequency variation range, and outputs the local oscillation signal having a local oscillatory frequency, causing a center frequency of a channel to be received, which channel is included in the intermediate frequency signal, to be equivalent to the integral multiple of the symbol rate.

24 Claims, 37 Drawing Sheets

CONTROL VOLTAGE

| fRF | SymRate | fIF | fLO |
|---|---|---|---|
| (MHz) | (MHz) | (MHz) | (MHz) |
| 2110 | 3.84 | 130.56 | 2240.56 |
| 2115 | 3.84 | 126.72 | 2241.72 |
| 2120 | 3.84 | 119.04 | 2239.04 |
| 2125 | 3.84 | 115.20 | 2240.20 |
| 2130 | 3.84 | 111.36 | 2241.36 |
| 2135 | 3.84 | 103.68 | 2238.68 |
| 2140 | 3.84 | 99.84 | 2239.84 |
| 2145 | 3.84 | 96.00 | 2241.00 |
| 2150 | 3.84 | 88.32 | 2238.32 |
| 2155 | 3.84 | 84.48 | 2239.48 |
| 2160 | 3.84 | 80.64 | 2240.64 |
| 2165 | 3.84 | 72.96 | 2237.96 |
| 2170 | 3.84 | 69.12 | 2239.12 |

| $f_{LO\_min}$ | $f_{LO\_max}$ | $\Delta f_{LO}$ | |
|---|---|---|---|
| (MHz) | (MHz) | (MHz) | (%) |
| 2237.96 | 2241.72 | 3.76 | 0.17 |

| fRF (MHz) | SymRate (MHz) | fIF (MHz) | fLO (MHz) |
|---|---|---|---|
| 2110 | 3.84 | 168.96 | 2278.96 |
| 2115 | 3.84 | 165.12 | 2280.12 |
| 2120 | 3.84 | 157.44 | 2277.44 |
| 2125 | 3.84 | 153.60 | 2278.60 |
| 2130 | 3.84 | 149.76 | 2279.76 |
| 2135 | 3.84 | 142.08 | 2277.08 |
| 2140 | 3.84 | 138.24 | 2278.24 |
| 2145 | 3.84 | 134.40 | 2279.40 |
| 2150 | 3.84 | 126.72 | 2276.72 |
| 2155 | 3.84 | 122.88 | 2277.88 |
| 2160 | 3.84 | 119.04 | 2279.04 |
| 2165 | 3.84 | 111.36 | 2276.36 |
| 2170 | 3.84 | 107.52 | 2277.52 |

| fLO_min (MHz) | fLO_max (MHz) | ΔfLO (MHz) | (%) |
|---|---|---|---|
| 2276.36 | 2280.12 | 3.76 | 0.17 |

TIME

F I G. 2 5
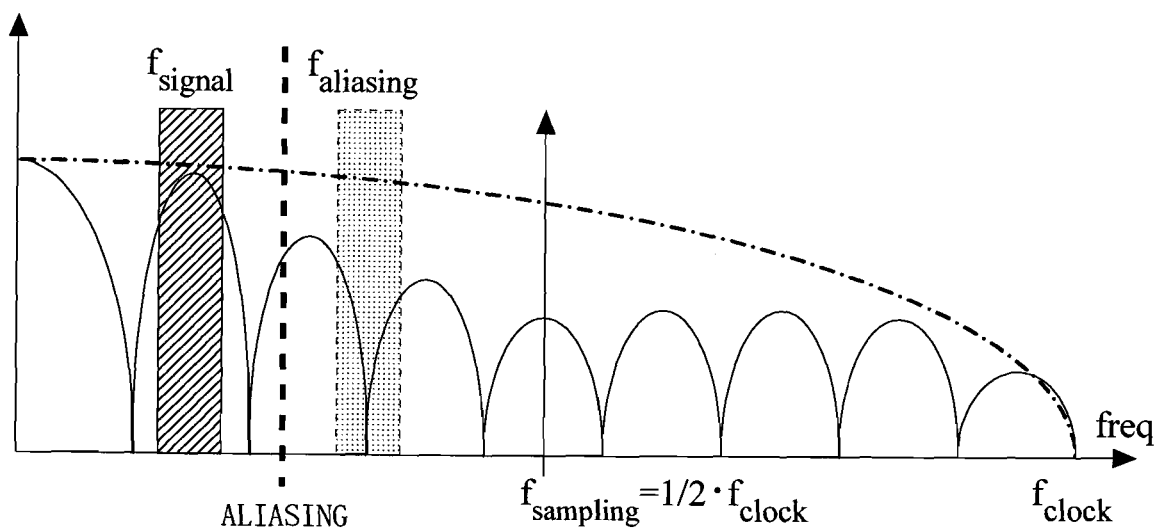

WIRELESS RECEIVER

TECHNICAL FIELD

The present invention relates to a wireless receiver used in a mobile terminal, and more particularly to a multi-band or multi-mode wireless receiver.

BACKGROUND ART

In recent years, mobile communication has been developing globally. In order to realize communication by using a single terminal irrespective of a region, data amount, population density and the like, a wireless circuit included in the terminal requires a multi-mode (also referred to as a multi-rate or a multi-carrier) operation which can support different communication modes and/or a multi-band operation which can support different frequency bands.

As a matter of course, such operations can be realized if a plurality of wireless circuits are provided for respective modes or bands. However, if the single terminal contains the plurality of wireless circuits in the interior thereof, the number of components and the number of wirings used for supplying current need to be increased, and thus a size of the terminal would be too large to be carried. At the same time, a cost would be high. Therefore, such operations must be realized by using a single wireless circuit.

Patent document 1 discloses a conventional multi-band reception circuit. The multi-band reception circuit of patent document 1 comprises a band selecting local oscillator and a channel selecting local oscillator. The multi-band reception circuit uses a signal obtained by mixing outputs of the both oscillators as a local signal of an RF mixer. A configuration disclosed in patent document 1 allows the band selecting local oscillator to oscillate in a wide loop bandwidth. Therefore, a C/N is improved, and electric power consumption can be reduced correspondingly. Therefore, since an oscillatory frequency is low, the electric power consumption of the channel selecting local oscillator is smaller than that of an RF channel selecting oscillator. As a result, the conventional multi-band reception circuit of patent document 1 can reduce a total electric power consumption more than a single RF channel selecting oscillator.

Patent document 2 discloses a conventional multi-band/multi-rate reception circuit. In the conventional multi-band/multi-rate reception circuit of patent document 2, a first local oscillator is selected so as to pass all reception signals including a plurality of channels through a single IF filter. Thereafter, a demodulation result is selected by using a plurality of quadrature demodulators, thereby realizing a multi-rate operation. Furthermore, according to patent document 2, in order to realize the multi-rate operation for a plurality of reception signals including different bands, a plurality of first local oscillators are provided so as to cause frequencies of all the reception signals to be within a passing bandwidth of the IF filter.

Patent document 3 discloses a conventional multi-carrier reception circuit. In the conventional multi-carrier reception circuit of patent document 3, reception signals including a plurality of channels are down-converted by an RF mixer to signals having IF frequencies, and then the IF frequencies are divided into a plurality of paths. A filter for passing a different frequency is provided for each of the paths, and the filter passes only a signal including each channel therethrough. The signal which has been passed through the filter is demodulated. With such a configuration, a multi-carrier reception circuit can be realized by using a single RF path.

[Patent document 1] Japanese Unexamined Patent Publication No. 2001-510672, FIG. 1
[Patent document 2] Japanese Laid-Open Patent Publication No. 2001-103024, FIG. 7
[Patent document 3] Japanese Laid-Open Patent Publication No. 2004-260775, FIG. 1

SUMMARY OF THE INVENTION

Problems to be Solved by the Invention

There is a problem in that the conventional multi-band reception circuit of patent document 1 needs to have two analog oscillators. Furthermore, an analog mixer is also needed for mixing the output signals of the two oscillators. In consideration of the necessity of correction, the analog circuit can reduce only a limited amount of electric power consumption. Furthermore, a band is significantly changed in a multi-mode or multi-band system of recent years. However, the conventional multi-band reception circuit of patent document 1 cannot support such a significantly changing band.

In the conventional multi-band/multi-rate reception circuit of patent document 2, when switching from a certain reception channel to another reception channel within a common band, a frequency of the first local oscillator needs to be changed. Therefore, the frequency of the first local oscillator needs to be changed in increments at channel intervals. A large amount of the electric power consumption is required for performing switching in minute increments. Furthermore, since the plurality of oscillators are used for the respective different bands, a size cannot be reduced.

The conventional multi-carrier reception circuit of patent document 3 requires a plurality of IF circuits. Therefore, a size of the reception circuit is large. Furthermore, in the case where a channel, other than channels which can be supported by the IF circuits, exists within a reception band, the conventional multi-carrier reception circuit of patent document 3 cannot support the channel. Thus, the aforementioned multi-carrier reception circuit cannot support the multi-band system.

In general, manufacturing variations exist between RF analog local oscillators. Therefore, in order to support the multi-mode or multi-band operation by using the RF analog local oscillator, the manufacturing variations need to be compensated for. For compensating for the manufacturing variations so as to obtain an appropriate local oscillation signal corresponding to each mode or each band, a bandwidth of the local oscillation signal needs to have an allowance (margin). Therefore, in a conventional configuration, a local oscillator having an oscillatory frequency range which is wider by an amount corresponding to the margin is required in order to lock the local oscillatory frequency at an appropriate value. Therefore, a large amount of electric power consumption is required.

Therefore, an object of the present invention is to provide a wireless receiver capable of realizing the multi-band and multi-mode operations, while reducing the electric power consumption of the RF analog local oscillator.

Solution to the Problems

To achieve the above objects, the present invention has the following aspects. The present invention is a wireless receiver which converts a received radio frequency signal into an intermediate frequency signal and demodulates the intermediate frequency signal, comprising: a local oscillator for discontinuously changing a band of a local oscillation signal corresponding to a frequency band of the radio frequency signal to be received in accordance with the frequency band, and outputting the local oscillation signal; a frequency converter for converting the radio frequency signal into the intermediate frequency signal by using the local oscillation signal outputted from the local oscillator, and outputting the intermediate frequency signal; and a demodulator for demodulating the intermediate frequency signal outputted from the frequency converter. The local oscillator detects a frequency variation range of the local oscillation signal within the frequency band, obtains a frequency equivalent to an integral multiple of a symbol rate from the frequency variation range, and outputs the local oscillation signal having a local oscillatory frequency, causing a center frequency of a channel to be received, which channel is included in the intermediate frequency signal, to be equivalent to an integral multiple of the symbol rate.

According to the present invention, the local oscillator outputs the local oscillation signal having the frequency causing the intermediate frequency to be equivalent to an integral multiple of the symbol rate. By causing the intermediate frequency to be equivalent to an integral multiple of the symbol rate, the demodulator easily performs an analog/digital conversion and easily selects a desired channel. The desired channel is selected in the demodulator. Therefore, in a preceding portion of the demodulator, only a band is selected. There are a plurality of local oscillatory frequencies, each of which can cause the intermediate frequency to be equivalent to an integral multiple of the symbol rate. Thus, even if a frequency outputted from the local oscillator has a variation, such local oscillatory frequencies can be selected. Therefore, the local oscillator can discontinuously change a band, and needs to have only a characteristic in which the local oscillatory frequency is moderately changed with respect to a control voltage. Such a voltage controlled oscillator 116 may have reduced electric power consumption as compared to the conventional art. Therefore, it becomes possible to provide a wireless receiver capable of realizing the multi-band and multi-mode operations, while reducing the electric power consumption of an RF analog local oscillator.

Preferably, the local oscillator includes: a PLL (Phase Locked Loop) circuit for locking a signal outputted from a voltage controlled oscillator having a band switching function as the local oscillation signal; a frequency controlling section for sweeping the signal outputted from the voltage controlled oscillator when the band of the local oscillation signal is changed; a detection section for detecting the frequency variation range based on a result of sweeping performed by the frequency controlling section; and a determination section for determining the frequency, equivalent to an integral multiple of the symbol rate, which is included in the frequency variation range detected by the detection section. The frequency controlling section controls the local oscillatory frequency of the local oscillation signal outputted from the PLL circuit based on the frequency, equivalent to an integral multiple of the symbol rate, which is determined by the determination section.

Thus, even if a characteristic of the voltage controlled oscillator has a variation, the frequency variation range can be obtained, and an appropriate local oscillatory frequency can be obtained from the frequency variation range.

In one embodiment, the frequency controlling section controls a dividing number of a variable divider included in the PLL circuit, thereby controlling the local oscillatory frequency. The detection section detects the frequency variation range based on a voltage of the charge pump included in the PLL circuit.

Thus, with a fundamental circuit configuration, an appropriate local oscillatory frequency can be obtained.

In one embodiment, the voltage controlled oscillator includes: a switch circuit for changing the band of the local oscillation signal by changing a connection number of capacitors; and a variable capacitor circuit having a varactor diode for changing a frequency of the local oscillation signal within the frequency variation range.

As described above, a general voltage controlled oscillator can be used in the present invention, and no special precision is required for the voltage controlled oscillator. Thus, it becomes possible to provide a mass-productive and low-cost wireless receiver.

In one embodiment, the voltage controlled oscillator has: a first switch circuit for changing the band of the local oscillation signal by changing a connection number of capacitors; and a second switch circuit for changing a frequency of the local oscillation signal within the frequency variation range by changing the connection number of the capacitors.

Thus, by the second switch circuit performing high-speed switching, it becomes possible to equivalently realize an intermediate value between two capacities. As described above, a general voltage controlled oscillator can be used in the present invention, and no special precision is required for the voltage controlled oscillator. Thus, it becomes possible to provide a mass-productive and low-cost wireless receiver.

Preferably, the local oscillator may select, when existing a plurality of the local oscillatory frequencies each causing the center frequency to be equivalent to an integral multiple of the symbol rate, one local oscillatory frequency which is placed at a center of the variable frequency range from among the plurality of the local oscillatory frequencies.

Thus, a wireless receiver, in which an IF frequency is less likely to be changed due to temperature change or voltage change, can be realized.

Preferably, the demodulator includes: a bandpass filter for passing the intermediate frequency signal corresponding to a band to be received; an ADC for converting the intermediate frequency signal, which has been passed through the bandpass filter, into a digital signal based on a sampling clock signal having a sampling frequency equivalent to an integral multiple of the symbol rate; and a channel selecting section for selecting a desired channel included in the digital signal obtained by the ADC.

The center frequency of the intermediate frequency signal is equivalent to an integral multiple of the symbol rate. Therefore, by using the demodulator having such a configuration, the digital signal can be easily obtained and the desired channel can be easily selected.

In one embodiment, the channel selecting section includes: a clock generating section for generating a channel selecting clock signal for down-converting the desired channel, included in the digital signal outputted from the ADC, to a baseband bandwidth; a mixing section for mixing the channel selecting clock signal generated by the clock generating section with the digital signal obtained by the ADC so as to down-convert the desired channel to the baseband bandwidth; and a channel selecting filter section for passing only the desired channel included in the digital signal mixed by the mixing section.

The center frequency of the intermediate frequency signal is equivalent to an integral multiple of the symbol rate. Therefore, by using the demodulator having such a configuration, the digital signal can be easily obtained and the desired channel can be easily selected.

In one embodiment, the channel selecting section includes: a channel selecting filter section for selecting the desired channel included in the digital signal obtained by the ADC based on the sampling clock signal; a clock generating section for generating a channel selecting clock signal for down-converting the digital signal including the desired channel selected by the channel selecting filter section so as to have the baseband bandwidth; and a mixing section for mixing the channel selecting clock signal generated by the clock generating section with the digital signal obtained by the ADC so as to down-convert the desired channel to the baseband bandwidth.

The center frequency of the intermediate frequency signal is equivalent to an integral multiple of the symbol rate. Therefore, by using the demodulator having such a configuration, the digital signal can be easily obtained and the desired channel can be easily selected.

In one embodiment, the channel selecting section includes: a digital Fourier transform section for performing a digital Fourier transform on the digital signal obtained by the ADC; a frequency component selecting section for selecting at least one frequency component obtained by the digital Fourier transform section; a frequency shifting section for shifting the at least one frequency component selected by the frequency component selecting section to the baseband bandwidth; and an inverse digital Fourier transform section for selecting the desired channel by performing an inverse digital Fourier transform on the at least one frequency component whose frequency has been shifted by the frequency shifting section.

The center frequency of the intermediate frequency signal is equivalent to an integral multiple of the symbol rate. Therefore, by using the demodulator having such a configuration, the digital signal can be easily obtained and the desired channel can be easily selected.

In one embodiment, the sampling frequency is less than twice the center frequency of the channel to be received, which channel is included in the intermediate frequency signal, and the ADC converts the intermediate frequency signal, which has been passed through the bandpass filter, into the digital signal having half the sampling frequency.

Thus, the digital signal outputted from the ADC is down-converted so as to have a frequency half the sampling frequency, thereby making it possible to lower a clock frequency for down-converting the digital signal so as to have the baseband bandwidth. As a result, the electric power consumption can be reduced.

In one embodiment, the sampling frequency is less than twice the center frequency of the channel to be received, which channel is included in the intermediate frequency signal, and the intermediate frequency signal has a frequency more than or equal to N times (N is an integer of 1 or greater) half the sampling frequency and less than or equal to (N+1) times half the sampling frequency.

Thus, the digital signal outputted from the ADC is down-converted so as to have a frequency half the sampling frequency, thereby making it possible to lower a clock frequency for down-converting the digital signal to a signal having the baseband bandwidth. As a result, the electric power consumption can be reduced.

Preferably, the demodulator includes: a center frequency variable bandpass filter in which a passing bandwidth is greater than a bandwidth of one channel and smaller than a bandwidth of one band of the radio frequency signal, and a center frequency of the passing bandwidth is variable; an ADC for converting the intermediate frequency signal, which has been passed through the center frequency variable bandpass filter, into a digital signal based on a sampling clock signal having a sampling frequency equivalent to an integral multiple of the symbol rate; and a channel selecting section for selecting a desired channel included in the digital signal obtained by the ADC.

As described above, by using the center frequency variable bandpass filter, a level of an interference wave inputted to the ADC can be reduced by using the center frequency variable bandpass filter. Therefore, a dynamic range of the ADC is reduced, and thus the electric power consumption can be reduced. Furthermore, unlike the IF filter of the conventional reception circuit device for passing only the desired channel, an allowable range of variation of the center frequency is large, and thus an adjustment circuit for adjusting the center frequency of the filter can be simplified.

Preferably, the demodulator further includes: a level detecting section for detecting an electric power level of an output signal of the center frequency variable bandpass filter; and an offset controlling section for controlling an offset of the center frequency variable bandpass filter based on a detection result outputted from the level detecting section. The offset controlling section controls the offset such that a level of the output signal of the center frequency variable bandpass filter is to be maximum.

Thus, even if the center frequency is shifted due to an effect of fixed parasitic elements or the like, it becomes possible to correct (calibrate) a deviation of the center frequency by controlling the offset.

In one embodiment, the center frequency variable bandpass filter changes the center frequency of the passing bandwidth by changing a capacity value of a varactor diode and a current value of an operation amplifier.

Thus, it becomes possible to easily provide the center frequency variable bandpass filter.

In one embodiment, the center frequency variable bandpass filter is a switched capacitor circuit having at least two switching elements and at least one capacitor, and changes the center frequency by changing a switching cycle of either of the switching elements.

With such a configuration, as a discrete-time analog tunable filter, a center frequency controlling section can be realized. The center frequency controlling section is mainly composed of switches and capacitors, thereby making it possible to realize a filter which is less likely to be affected by a nonlinear element.

Preferably, the frequency converter includes: a first phase shifter for generating a first signal by rotating a phase of the local oscillation signal outputted from the local oscillator by 0 degrees and generating a second signal by rotating the phase of the local oscillation signal outputted from the local oscillator by 90 degrees; a first down-converter for down-converting the radio frequency signal based on the first signal; a second down-converter for down-converting the radio frequency signal based on the second signal; and a second phase shifter for combining two signals obtained by rotating a phase of the signal outputted from the first down-converter by 0 degrees and by rotating a phase of the signal outputted from the second down-converter by 90 degrees, and inputting the combined signal to the demodulator.

Thus, a configuration adopting Hartley's method can be obtained, thereby making it possible to suppress an image interference.

Preferably, the frequency converter includes: a phase shifter for generating a first signal by rotating a phase of the local oscillation signal outputted from the local oscillator by 0 degrees and generating a second signal by rotating the phase of the local oscillation signal outputted from the local oscillator by 90 degrees; a first down-converter for down-converting the radio frequency signal based on the first signal, and inputting the down-converted signal to the demodulator; and a second down-converter for down-converting the radio frequency signal based on the second signal, and inputting the down-converted signal to the demodulator. The demodulator has a configuration for removing an image frequency.

Thus, since the image frequency is suppressed in a digital section, a precision for suppressing the image frequency is improved.

In one embodiment, the demodulator includes: a first bandpass filter for passing the intermediate frequency signal, corresponding to a band to be received, which is included in an output signal of the first down-converter; a first ADC for converting the intermediate frequency signal, which has been passed through the first bandpass filter, into a digital signal based on a sampling clock signal having a sampling frequency equivalent to an integral multiple of the symbol rate; a first channel selecting filter for selecting a desired channel included in the digital signal obtained by the first ADC; a second bandpass filter for passing only the intermediate frequency signal, corresponding to the band to be received, which is included in an output signal of the second down-converter; a second ADC for converting the intermediate frequency signal, which has been passed through the second bandpass filter, into a digital signal based on the sampling clock signal having the sampling frequency equivalent to an integral multiple of the symbol rate; a second channel selecting filter for selecting the desired channel included in the digital signal obtained by the second ADC; a channel selecting clock generating section for generating first and second channel selecting clock signals used for down-converting the desired channel to a baseband bandwidth; a third phase shifter for outputting the first channel selecting clock signal whose phase is shifted by 0 degrees and outputting the first channel selecting clock signal whose phase is shifted by 90 degrees; a fourth phase shifter for outputting the second channel selecting clock signal whose phase is rotated by −90 degrees and outputting the second channel selecting signal whose phase is rotated by 0 degrees; a first synthesis section for mixing an output of the first channel selecting filter with the first channel selecting clock signal, whose phase has been rotated by 0 degrees, outputted from the third phase shifter and mixing an output of the second channel selecting filter with the first channel selecting clock signal, whose phase has been rotated by 90 degrees, outputted from the third phase shifter, and combining two signals obtained from the mixings; and a second synthesis section for mixing the output of the second channel selecting filter with the second channel selecting clock signal, whose phase has been rotated by 0 degrees, outputted from the fourth phase shifter and mixing the output of the first channel selecting filter with the second channel selecting clock signal, whose phase has been rotated by −90 degrees, outputted from the fourth phase shifter, and combining two signals obtained from the mixings.

Thus, since the image frequency is suppressed in a digital section, a precision for suppressing the image frequency is improved.

In one embodiment, the demodulator includes: a first bandpass filter for passing the intermediate frequency signal, corresponding to a band to be received, which is included in an output signal of the first down-converter; a first ADC for converting the intermediate frequency signal, which has been passed through the first bandpass filter, into a digital signal based on a sampling clock signal having a sampling frequency equivalent to an integral multiple of the symbol rate; a first channel selecting filter for selecting a desired channel included in the digital signal obtained by the first ADC; a second bandpass filter for passing only the intermediate frequency signal, corresponding to the band to be received, which is included in an output signal of the second down-converter; a second ADC for converting the intermediate frequency signal, which has been passed through the second bandpass filter, into a digital signal based on the sampling clock signal having the sampling frequency equivalent to an integral multiple of the symbol rate; a second channel selecting filter for selecting the desired channel included in the digital signal obtained by the second ADC; a channel selecting clock generating section for generating a channel selecting clock signal used for down-converting the desired channel to the baseband bandwidth; a third phase shifter for rotating a phase of an output of the first channel selecting filter by −90 degrees; a fourth phase shifter for rotating a phase of an output of the second channel selecting filter by 90 degrees; a first synthesis section for combining an output of the third phase shifter and the output of the second channel selecting filter; a second synthesis section for combining an output of the fourth phase shifter and the output of the first channel selecting filter; a third down-converter for down-converting an output of the second synthesis section based on the channel selecting clock signal; and a fourth down-converter for down-converting an output of the first synthesis section based on the channel selecting clock signal.

Thus, since the image frequency is suppressed in a digital section, a precision for suppressing the image frequency is improved.

In one embodiment, the demodulator includes: a first bandpass filter for passing the intermediate frequency signal, corresponding to a band to be received, which is included in an output signal of the first down-converter; a first ADC for converting the intermediate frequency signal, which has been passed through the first bandpass filter, into a digital signal based on a sampling clock signal having a sampling frequency equivalent to an integral multiple of the symbol rate; a first digital Fourier transform section for performing a digital Fourier transform on the digital signal obtained by the first ADC; a second bandpass filter for passing the intermediate frequency signal, corresponding to the band to be received, which is included in an output signal of the second down-converter; a second ADC for converting the intermediate frequency signal, which has been passed through the second bandpass filter, into a digital signal based on the sampling clock signal having the sampling frequency equivalent to an integral multiple of the symbol rate; a second digital Fourier transform section for performing the digital Fourier transform on the digital signal obtained by the second ADC; a first frequency component selecting section for selecting at least one frequency component from among a plurality of frequency components obtained by the first digital Fourier transform section; a first multiplication section for multiplying the at least one frequency component selected by the first frequency component selecting section by −j (j is an imaginary number); a second frequency component selecting section for selecting at least one frequency component from among a plurality of frequency components obtained by the second digital Fourier transform section; a second multiplication section for multiplying the at least one frequency component selected by the second frequency component selecting section by −j (j is an imaginary number); a first synthesis section for combining a multiplication result outputted from the first multiplication section and the at least one frequency component selected by the second frequency component selecting section; a second synthesis section for combining a multiplication result outputted from the second multiplication section and the at least one frequency component selected by the first frequency component selecting section; a first frequency shifting section for shifting a combined result outputted from the first synthesis section to a baseband bandwidth; a second frequency shifting section for shifting a combined result outputted from the second synthesis section to the baseband bandwidth; a first inverse digital Fourier transform section for selecting a desired channel by performing an inverse digital Fourier transform on the at least one frequency component whose frequency has been shifted by the first frequency shifting section; and a second inverse digital Fourier transform section for selecting the desired channel by performing the inverse digital Fourier transform on the at least one frequency component whose frequency has been shifted by the second frequency shifting section.

Thus, since the image frequency is suppressed in a digital section, a precision for suppressing the image frequency is improved.

Preferably, the frequency converter includes a first switch, a second switch, a third switch, a first capacitor, and a second capacitor, the radio frequency signal is inputted to the first switch, an output signal of the first switch is inputted to the second switch, an output signal of the second switch is inputted to the demodulator, the first capacitor is inserted between a GND and a connection point of the first switch and the second switch, the second capacitor and the third switch are inserted in series between the GND and the connection point of the first switch and the second switch, the first switch is turned on and off in accordance with a frequency of an output signal of the local oscillator, the second switch is turned on when the first switch is on, and is turned off when the first switch is off, and the third switch is turned on and off in accordance with a frequency band of the radio frequency signal.

Preferably, the third switch is turned on when the frequency band of the radio frequency signal is low, and is turned off when the frequency band of the radio frequency signal is high.

Thus, a large capacity value can be held at a low frequency, and a small capacity value can be held at a high frequency.

Preferably, the wireless receiver comprises a plurality of circuits having same configurations as those of the first to third switches and the first and second capacitors. The plurality of circuits are connected in parallel to each other, and the plurality of the third switches are turned on and off simultaneously in accordance with the frequency band of the radio frequency signal.

With such a configuration, a capacity value to be held can be changed in accordance with a band, thereby realizing a frequency converting circuit having a wide bandwidth.

Effect of the Invention

As described above, according to the present invention, it becomes possible to provide a wireless receiver capable of realizing multi-band and multi-mode operations, while reducing the electric power consumption of an RF analog local oscillator.

BRIEF DESCRIPTION OF THE DRAWINGS

FIG. 7E is a diagram illustrating a state where only the desired channel is passed through.

FIG. 25 is a diagram illustrating a frequency response of the bandpass filter 150.

Figure 1A:
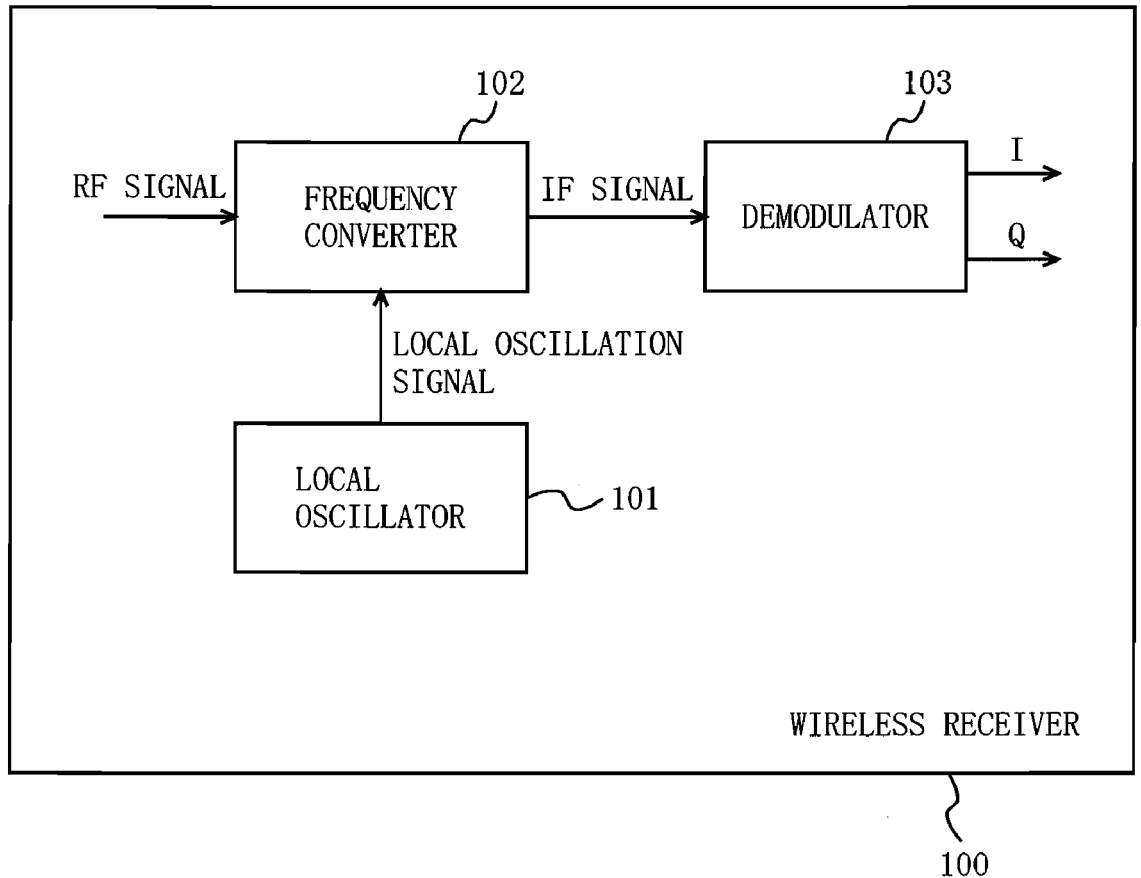
FIG. 1A is a block diagram illustrating a configuration of a wireless receiver 100 according to a first embodiment of the present invention.

DESCRIPTION OF THE REFERENCE CHARACTERS 100 wireless receiver
101 local oscillator
102 frequency converter
102A, 102B feedback circuit
102C resistance circuit
102a first switch
102b second switch
102c third switch
102d first capacitor
102e second capacitor
103 demodulator
104 inverse digital Fourier transform section
105 bandpass filter
110 PLL circuit
112 divider
114 charge pump
115 lowpass filter
116 voltage controlled oscillator
117 prescaler
118 variable divider
120 detection section
130 determination section
140 frequency controlling section
150 bandpass filter
170 channel selecting section
171 mixing section
172 channel selecting filter section
173 clock generating section
174 first digital mixer
175 second digital mixer
176 phase shifter
177 first lowpass filter
178 second lowpass filter
180 channel selecting section
181 channel selecting filter
190 channel selecting section
191 digital Fourier transform section
192 frequency component selecting section
193 frequency shifting section
194 inverse digital Fourier transform section
195 real part/imaginary part branching section
196 first inverse digital Fourier transform section
197 second inverse digital Fourier transform section
202 frequency converter
212 first phase shifter
222 second phase shifter
232 first down-converter
242 second down-converter
302 frequency converter
403 demodulator
410 first bandpass filter
411 first ADC
412 first channel selecting filter
413 first synthesis section
414 first digital mixer
415 third phase shifter
416 first channel selecting clock generating section
417 second digital mixer
418 third digital mixer
419 second channel selecting clock generating section
420 fourth phase shifter
421 fourth digital mixer
422 second synthesis section
423 second channel selecting filter
424 second ADC
425 second bandpass filter
430 channel selecting clock generating section
431 first digital down-converter
432 second digital down-converter
433 third phase shifter 434 fourth phase shifter
435 first synthesis section
436 second synthesis section
441 first digital Fourier transform section
442 first frequency component selecting section
443 first synthesis section
445 first multiplication section
446 first frequency shifting section
447 first inverse digital Fourier transform section
448 second digital Fourier transform section
449 second frequency component selecting section
450 second multiplication section
451 second synthesis section
452 second frequency shifting section
453 second inverse digital Fourier transform section
503 demodulator
513 center frequency variable bandpass filter
523 ADC
533 channel selecting section
543 channel selecting clock generating section
553 phase shifter
563 first digital mixer
573 second digital mixer
583 first lowpass filter
593 second lowpass filter
601 center frequency controlling section
602 switch circuit
603 level detecting section
604 offset controlling section
605 transmission circuit
606 switch circuit
703 demodulator
710 bandpass filter
720 ADC
730 channel selecting section
1161 inductor circuit
1162 variable capacitor circuit
1162a, 1162b varactor diode
1162c switch circuit for fine adjustment
1163 negative resistance circuit
1164 band change switch circuit

DETAILED DESCRIPTION OF THE INVENTION

First Embodiment

Figure 1B:
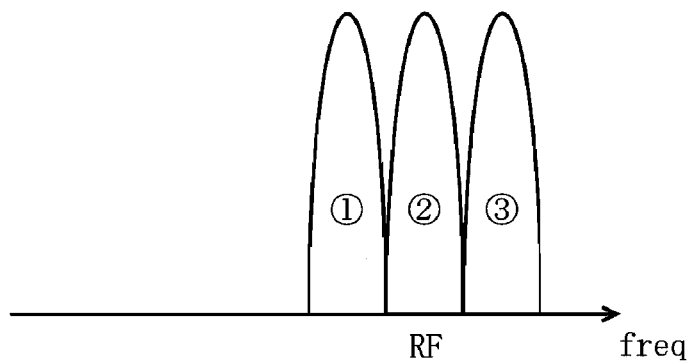
FIG. 1B is a diagram illustrating a frequency spectrum of an RF signal.

FIG. 1A is a block diagram illustrating a configuration of a wireless receiver 100 according to a first embodiment of the present invention. In FIG. 1A, the wireless receiver 100 comprises a local oscillator 101, a frequency converter 102 and a demodulator 103. The wireless receiver 100 receives a radio reception signal (hereinafter referred to as an RF signal). FIG. 1B is a diagram illustrating a frequency spectrum of the RF signal. As such, the RF signal includes a plurality of channels. The present embodiment illustrates an example where the RF signal includes three channels of 1 to 3. However, the present invention is not limited to the three channels.

The wireless receiver 100 converts the RF signal into an intermediate frequency signal (hereinafter referred to as an IF signal) and demodulates the IF signal, thereby obtaining I (in-phase) of an in-phase component and Q (quadrature) of a quadrature component from the demodulated IF signal. The wireless receiver 100 is applied to a multi-mode system and/or a multi-band system. Therefore, a received RF signal has different frequency bands of respective modes and/or bands in a mixed manner. However, at a certain moment, the wireless receiver 100 must demodulate only an RF signal having a frequency band of a certain mode and/or band. Such an RF signal is hereinafter referred to as an RF signal to be received.

The local oscillator 101 has a band switching function operable to output a local oscillation signal having a frequency corresponding to a frequency band of the RF signal to be received. The local oscillator 101 can discontinuously change a band of the local oscillation signal in accordance with the frequency band of the RF signal to be received. The local oscillator 101 detects a frequency variation range of the local oscillation signal within a band to be received. The local oscillator 101 obtains a frequency equivalent to an integral multiple of a symbol rate from the detected frequency variation range. The local oscillator 101 then calculates a local oscillatory frequency causing a center frequency of the IF signal within a channel to be received to be equivalent to an integral multiple of the symbol rate, thereby outputting a local oscillation signal having the local oscillatory frequency.

Figure 1C:
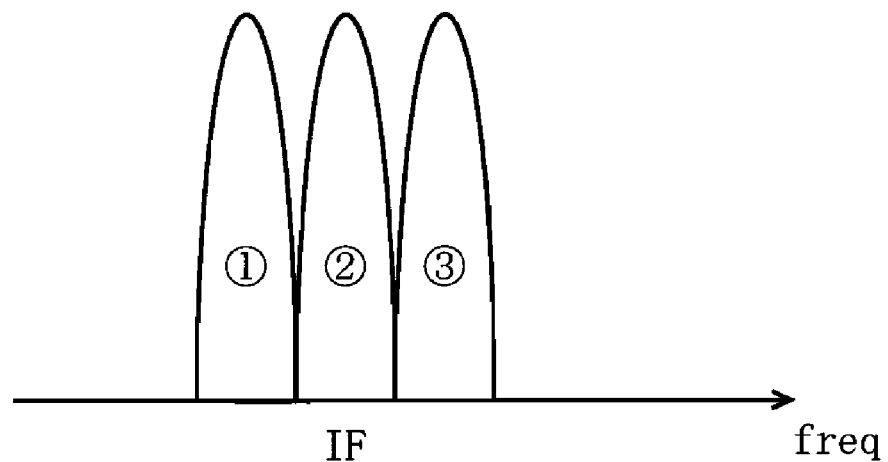
FIG. 1C is a diagram illustrating a frequency spectrum of an IF signal outputted from a frequency converter 102.

The frequency converter 102 down-converts the RF signal by using the local oscillation signal outputted from the local oscillator 101, thereby outputting an IF signal. FIG. 1C is a diagram illustrating a frequency spectrum of the IF signal outputted from the frequency converter 102.

Figure 1D:
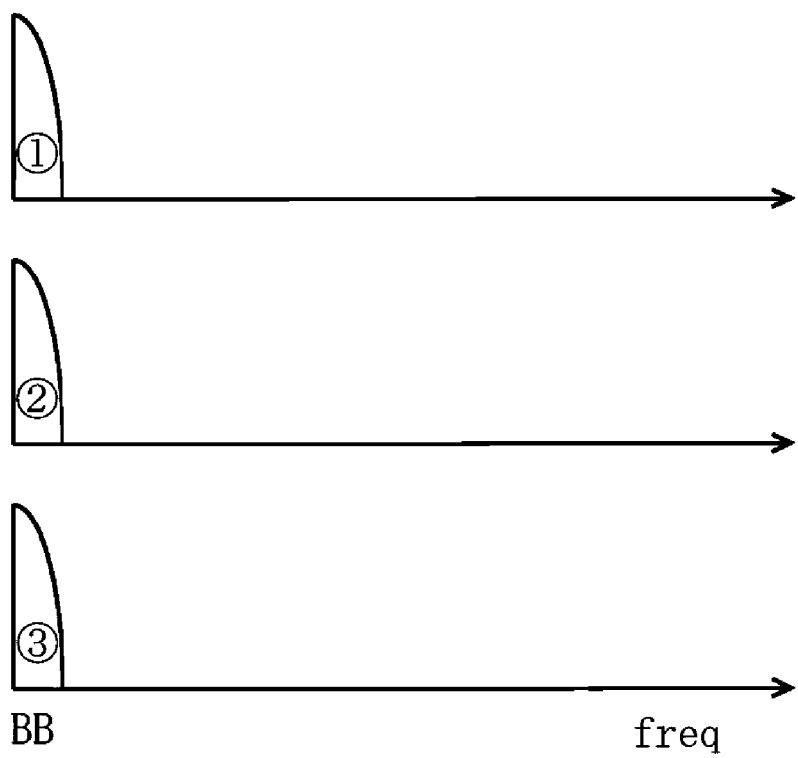
FIG. 1D is a diagram illustrating a state where a demodulator 103 selects a channel.

The demodulator 103 converts the IF signal outputted from the frequency converter 102 into a digital signal and selects a channel to be received from the digital signal, thereby outputting I and Q. FIG. 1D is a diagram illustrating a state where the demodulator 103 selects the channel. As shown in FIG. 1D, the demodulator 103 selects any one channel to be received. The demodulator 103 performs a demodulation process in sync with a symbol rate. Therefore, if the center frequency of the IF signal is equivalent to an integral multiple of the symbol rate, the demodulator 103 can perform a process of synchronizing the symbol rate and the IF signal by using a small amount of calculation, thereby allowing the demodulator 103 to easily convert the IF signal into the digital signal and to select a desired channel.

For example, it is assumed that an RF signal of 2 GHz band is received and then demodulated. The local oscillatory frequency must be selected such that a bandwidth of 2 GHz band (60 MHz from 2110 to 2170 MHz in the case of W-CDMA) does not overlap a frequency band of an IF signal even if the bandwidth of 2 GHz band is caused to be returned at a DC when the RF signal is converted into the IF signal. However, if a frequency of the IF signal (hereinafter referred to as an intermediate frequency) is extremely high, a sampling rate needs to be increased, for example, thereby resulting in an increased electric power consumption of the demodulator. Thus, the intermediate frequency must be selected so as not to overlap the bandwidth to be returned at the DC and not to be higher than necessary. As described above, in the present invention, the intermediate frequency is selected so as to be equivalent to an integral multiple of the symbol rate (3.84 MHz in the case of W-CDMA). There are a plurality of intermediate frequencies which satisfy conditions that each intermediate frequency must not overlap the bandwidth to be returned at the DC and not be higher than necessary, and that each intermediate frequency is equivalent to an integral multiple of the symbol rate. Therefore, even if manufacturing variations exist between local oscillators, it is possible to select a local oscillation signal for obtaining an IF signal having such an intermediate frequency.

Note that in the first embodiment, for preventing image interference, a band selecting RF filter (not shown) is provided between an antenna (not shown) and the frequency converter 102, thereby suppressing an image frequency band. For example, in the case of W-CDMA, a bandwidth is 60 MHz. Thus, if all signals of 60 MHz are down-converted so as to satisfy the aforementioned conditions, the intermediate frequency is to be from approximately 70 to 500 MHz. Therefore, a reception frequency band is separated from the image frequency band by a frequency more than twice the reception frequency band. Thus, when the band selecting RF filter is used, an image interference wave can be relatively easily suppressed as compared to when a Low-IF receiver, in which an intermediate frequency is equivalent to the order of a channel interval, is used.

Figure 2:
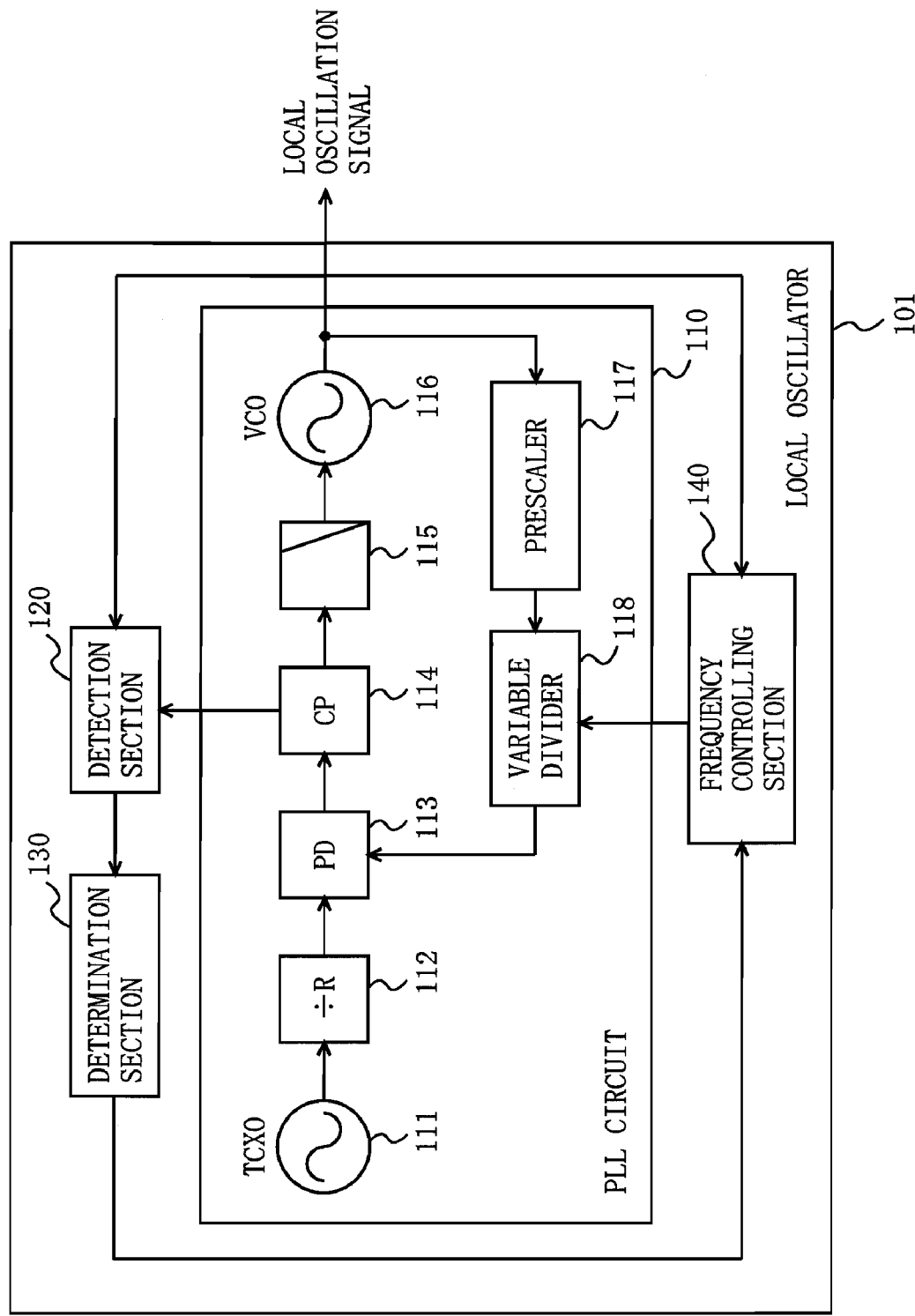
FIG. 2 is a block diagram illustrating a configuration of a local oscillator 101.

FIG. 2 is a block diagram illustrating a configuration of the local oscillator 101. In FIG. 2, the local oscillator 101 includes a PLL circuit 110, a detection section 120, a determination section 130 and a frequency controlling section 140. The PLL circuit 110 has a TCXO (Temperature Compensated Crystal Oscillator) 111, a divider 112, a PD (Phase Detector) 113, a charge pump (CP) 114, a lowpass filter 115, a VCO (voltage controlled oscillator) 116, a prescaler 117, and a variable divider 118. The PLL circuit 110 operates so as to lock the local oscillation signal outputted from the voltage controlled oscillator 116.

Figure 3:
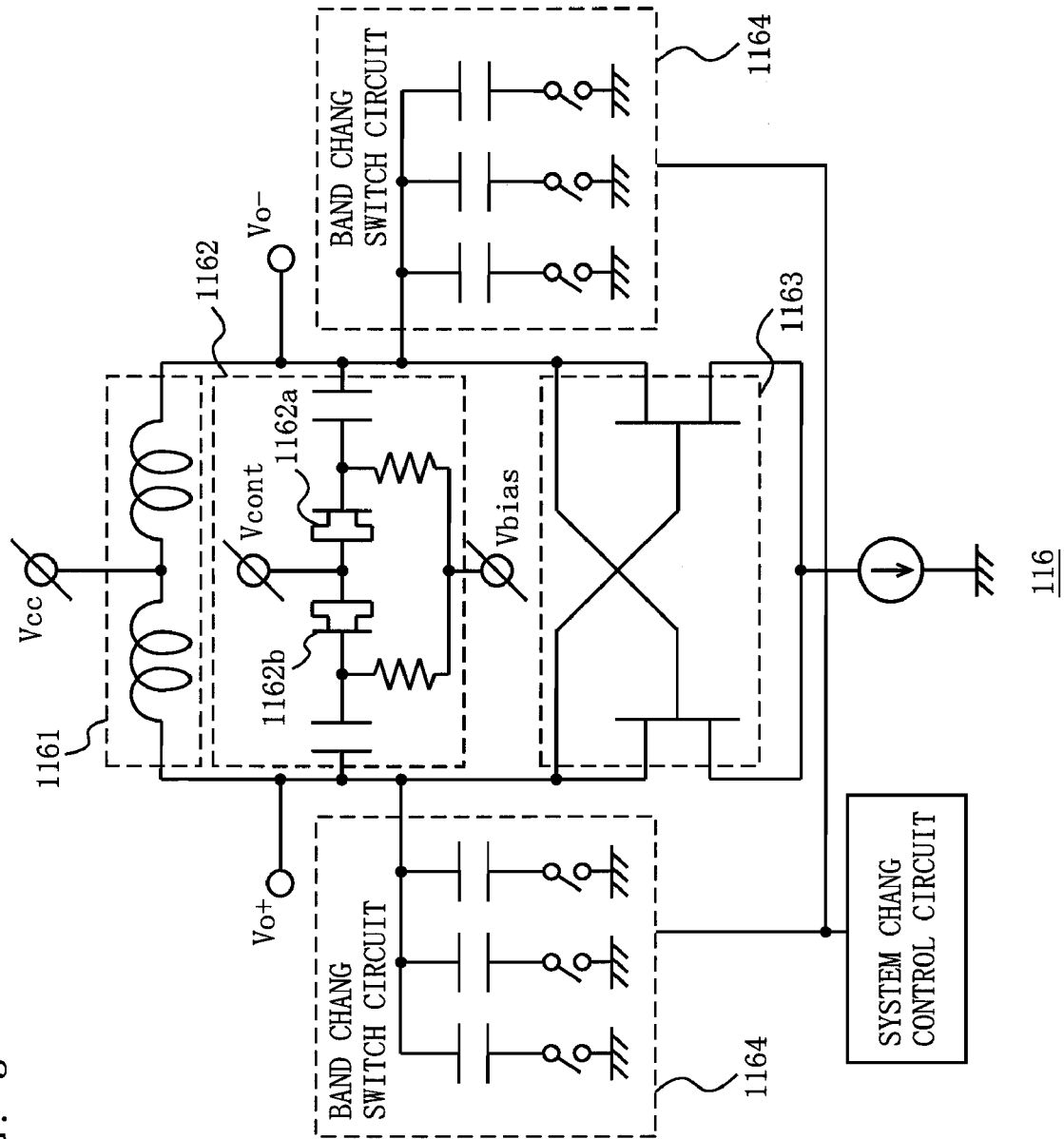
FIG. 3 is a circuit diagram illustrating an example of a voltage controlled oscillator 116.
Figure 9:
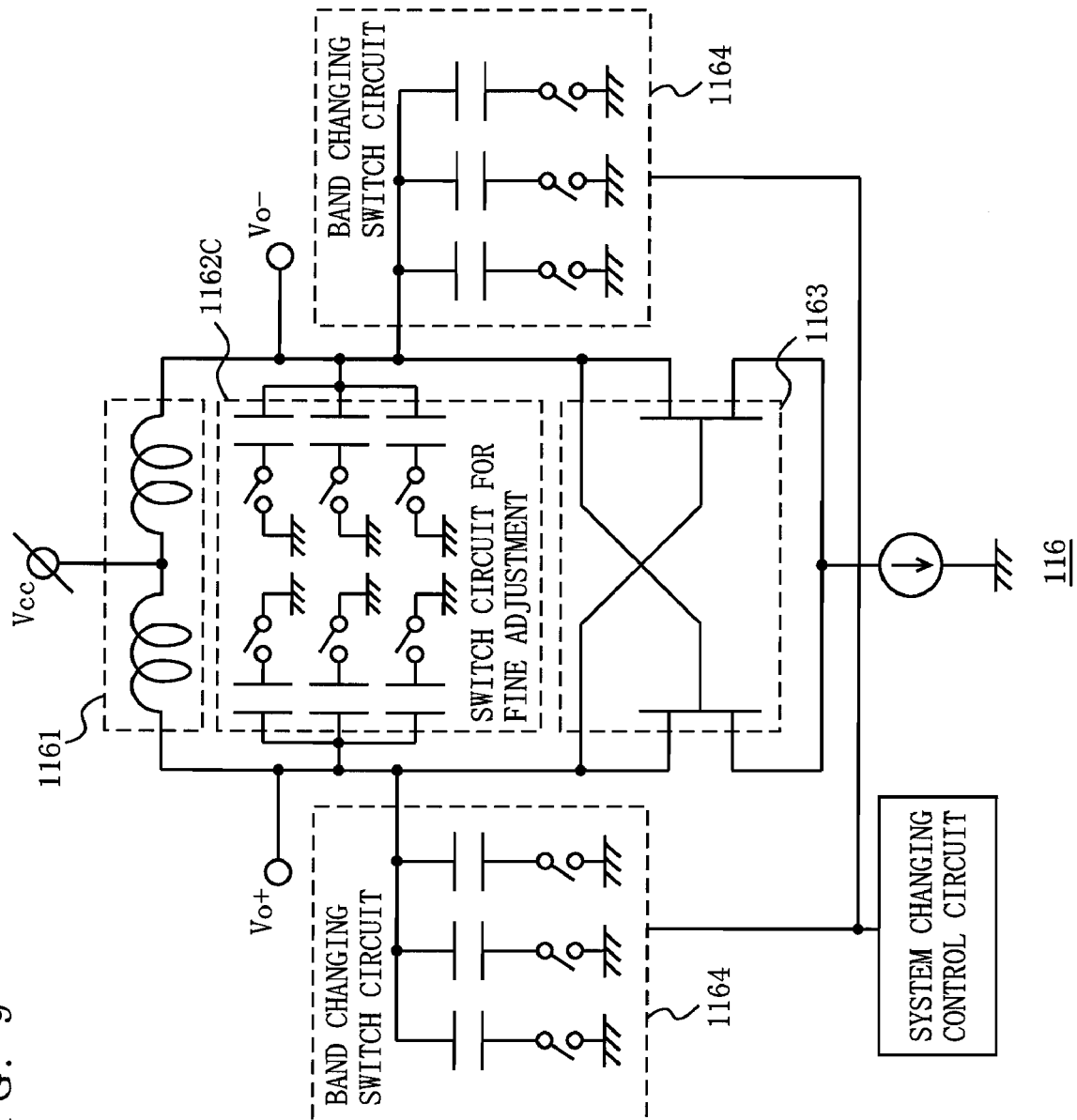
FIG. 9 is a circuit diagram illustrating another example of the voltage controlled oscillator 116.

The voltage controlled oscillator has the band switching function as shown in FIGS. 3 and 9 to be described later.

The variable divider 118 causes the frequency controlling section 140 to control a dividing number.

When a band is changed, the frequency controlling section 140 controls the dividing number of the variable divider 118 in accordance with an instruction issued from the detection section 120 such that a frequency of the local oscillation signal outputted from the voltage controlled oscillator is swept.

The detection section 120 detects a voltage of the charge pump 114 and determines whether or not the PLL circuit 110 is locked. When the PLL circuit 110 is locked, the detection section 120 instructs the frequency controlling section 140 to change the dividing number to a subsequent dividing number, and calculates a locked frequency of the local oscillation signal based on the dividing number of the variable divider 118. As such, each time the PLL circuit is locked, the dividing number is changed. While the dividing number is being swept, the detection section 120 detects a maximum value and a minimum value of the local oscillatory frequency within a current band. The detection section 120 detects a difference between the maximum value and the minimum value as a frequency variation range of the local oscillation signal.

The determination section 130 determines a frequency which can be equivalent to an integral multiple of the symbol rate within the frequency variation range detected by the detection section 120, thereby inputting a determination result to the frequency controlling section 140.

The frequency controlling section 140 can previously recognize, within the current band, a center frequency of a channel to be received. The frequency controlling section 140 can calculate a frequency, of the local oscillation signal, which can cause an intermediate frequency to be equivalent to an integral multiple of the symbol rate by adding the frequency determined by the determination section 130 to the center frequency of the channel. When the local oscillatory frequency is calculated, the dividing number is accordingly calculated. Thus, the frequency controlling section 140 causes the variable divider 118 to be operated using a dividing number which allows an IF signal to have the frequency, which can be equivalent to an integral multiple of the symbol rate, determined by the determination section 130. Thereafter, the local oscillation signal outputted from the PLL circuit 110 converges to a fixed frequency. Thus, the center frequency of the IF signal becomes equivalent to an integral multiple of the symbol rate. Note that since the variable divider 118 uses a fractional frequency division system, the PLL circuit 110 can also oscillate at a frequency other than an integral multiple of a phase comparison frequency.

FIG. 3 is a circuit diagram illustrating an example of the voltage controlled oscillator 116. As shown in FIG. 3, the voltage controlled oscillator 116 has a differential circuit configuration, and includes an inductor circuit 1161, a variable capacitor circuit 1162, a negative resistance circuit 1163, band change switch circuits 1164, all of which are connected in parallel to each other, and a system change control circuit.

The band change switch circuit 1164 has a plurality of switches and capacitors connected in series to the respective switches. The band change switch circuit 1164 is a variable capacitor for rough adjustment of the local oscillation signal. The system change control circuit turns the switches of the band change switch circuit 1164 on and off so as to change the number of the capacitors connected to the variable capacitor circuit 1162, thereby making it possible to discontinuously change the local oscillation signal and a band of the local oscillation signal.

The variable capacitor circuit 1162 has varactor diodes 1162*a* and 1162*b* which are connected in parallel to each other. The variable capacitor circuit 1162 is a variable capacitor for fine adjustment of the local oscillation signal. By controlling a control voltage Vcont applied to the varactor diodes 1162*a* and 1162*b*, the local oscillatory frequency can be continuously changed within the frequency variation range. The control voltage Vcont is inputted from the lowpass filter 115 shown in FIG. 2.

In a conventional voltage controlled oscillator, in order to obtain the local oscillation signal within a desired band and channel, the number of the varactor diodes is increased so as to have a larger frequency variation rate with respect to the control voltage inputted to the variable capacitor for the fine adjustment, and the number of the switches included in the variable capacitor for the rough adjustment is increased so as to have a larger number of selectable bands, thereby allowing the conventional voltage controlled oscillator to assuredly output the local oscillation signal within the desired band and channel. However, a change in an oscillatory frequency is made due to noise added to the control voltage inputted to the variable capacitor for the fine adjustment, and a Q value of the variable capacitor for the rough adjustment deteriorates due to an increased number of the switches. Accordingly, a C/N deteriorates, and thus a large amount of electric power consumption is required for the conventional voltage controlled oscillator in order to improve the C/N.

On the other hand, the present invention adopts a configuration which causes the intermediate frequency to be equivalent to an integral multiple of the symbol rate, thereby allowing the demodulator 103 to perform demodulation more easily. Therefore, unlike the conventional voltage controlled oscillator, the variation rate of the variable capacitor for the fine adjustment does not have to be larger, and the number of the switches included in the variable capacitor for the fine adjustment does not have to be increased either. Thus, the C/N does not deteriorate, and thus a large amount of electric power consumption is not required in order to improve the C/N.

Figures 4, 5A:
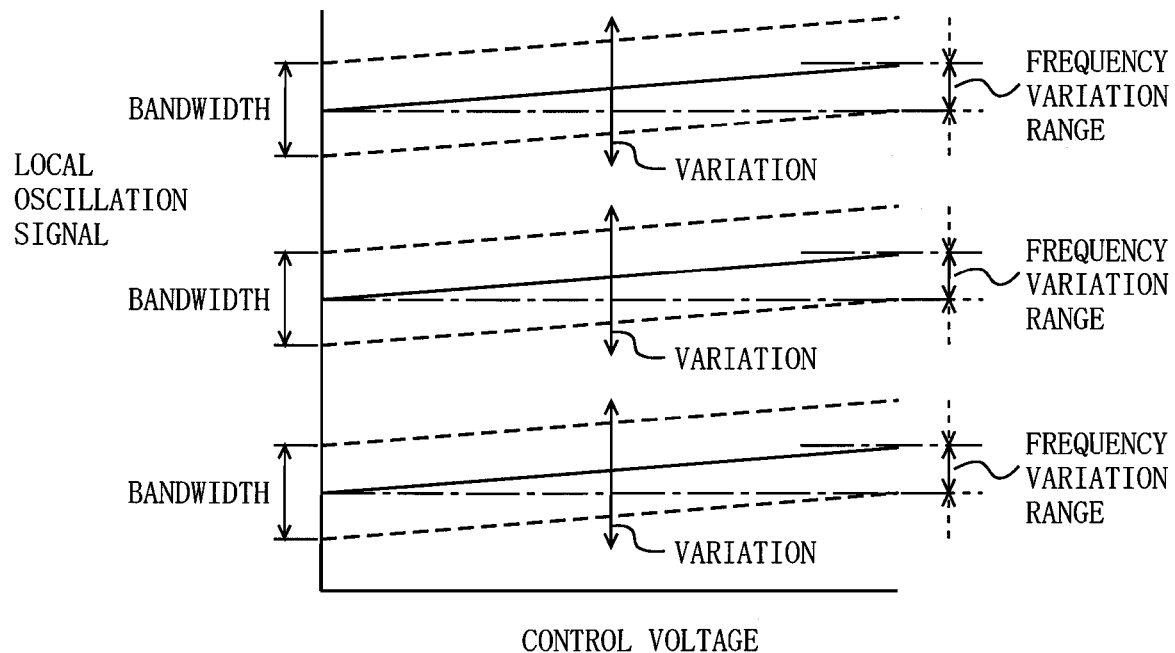
FIG. 4 is a graph representing a relationship between a control voltage inputted to the voltage controlled oscillator 116 and a local oscillatory frequency.
FIG. 5A is a table showing relationships between frequencies obtained by a first sample.

The above effect will be described with reference to FIG. 4. FIG. 4 is a graph representing a relationship between the control voltage inputted to the voltage controlled oscillator 116 and the local oscillatory frequency. As shown in FIG. 3, the number of the switches included in the band change switch circuits 1164 is smaller than that included in the conventional art. Therefore, bands which can be oscillated by the voltage controlled oscillator 116 are, as shown in FIG. 4, discontinuously disposed at large intervals therebetween. FIG. 4 exemplary shows three bands. As a matter of course, since a band to be used is previously determined, a local oscillatory frequency must be within a certain fixed bandwidth. However, due to manufacturing variations or variations generated by temperature change, the local oscillatory frequency changes within the certain fixed bandwidth. By reducing the number of the varactor diodes included in the variable capacitor circuit 1162 more than the conventional art, as shown in FIG. 3, a variation rate of the local oscillatory frequency with respect to the control voltage is, as shown in FIG. 4, to be moderate. A difference between the maximum value and the minimum value of the local oscillatory frequency changed with respect to the control voltage is the frequency variation range. Note that the variation rate of the local oscillatory frequency with respect to the control voltage must be set to an extent such that a local oscillation signal, which causes the intermediate frequency to be equivalent to an integral multiple of the symbol rate, at least exists within the frequency variation range.

As described above, the present invention adopts a configuration in which the intermediate frequency is caused to be equivalent to an integral multiple of the symbol rate so as to allow the demodulator to select a channel. Therefore, the bands oscillated by the voltage controlled oscillator 116 may be discontinuously disposed. Furthermore, the variation rate of the local oscillatory frequency with respect to the control voltage may be moderate. Thus, the electric power consumption of the local oscillator 101 is reduced more than the conventional art.

The reasons therefore will be described below. In order to continuously change the band, the number of switches included in the band change switch circuits 1164 must be increased. As the number of the switches increases, the Q value of a resonance circuit deteriorates and a level of an output signal is decreased accordingly. As a result, noise relatively becomes larger and a C/N ratio deteriorates. Thus, in the case where the band is continuously changed, the level of the signal needs to be increased in order to improve the C/N ratio, thereby resulting in an increased eclectic power consumption. Alternatively, it is assumed that a sensitivity of the oscillatory frequency with respect to the control voltage is large. In this case, the frequency variation rate with respect to the control voltage is large. Therefore, a frequency variation rate with respect to thermal noise superimposed on the control voltage is to be large accordingly. A frequency variation caused by the thermal noise after all generates noise. Therefore, the noise becomes larger and the C/N ratio deteriorates. As such, in the case where the sensitivity of the oscillatory frequency with respect to the control voltage is large, the level of the signal needs to be increased in order to improve the C/N ratio, thereby resulting in the increased electric power consumption.

Note that in the case where a plurality of local oscillatory frequencies, each of which causes the center frequency to be equivalent to an integral multiple of the symbol rate, exist within a variable frequency range of a certain band, one local oscillatory frequency at the center of the variable frequency range may be selected from among the plurality of local oscillatory frequencies. In this case, a wireless receiver, in which an IF frequency is less likely to be changed due to temperature change or voltage change, can be realized.

Figures 5B, 5C:
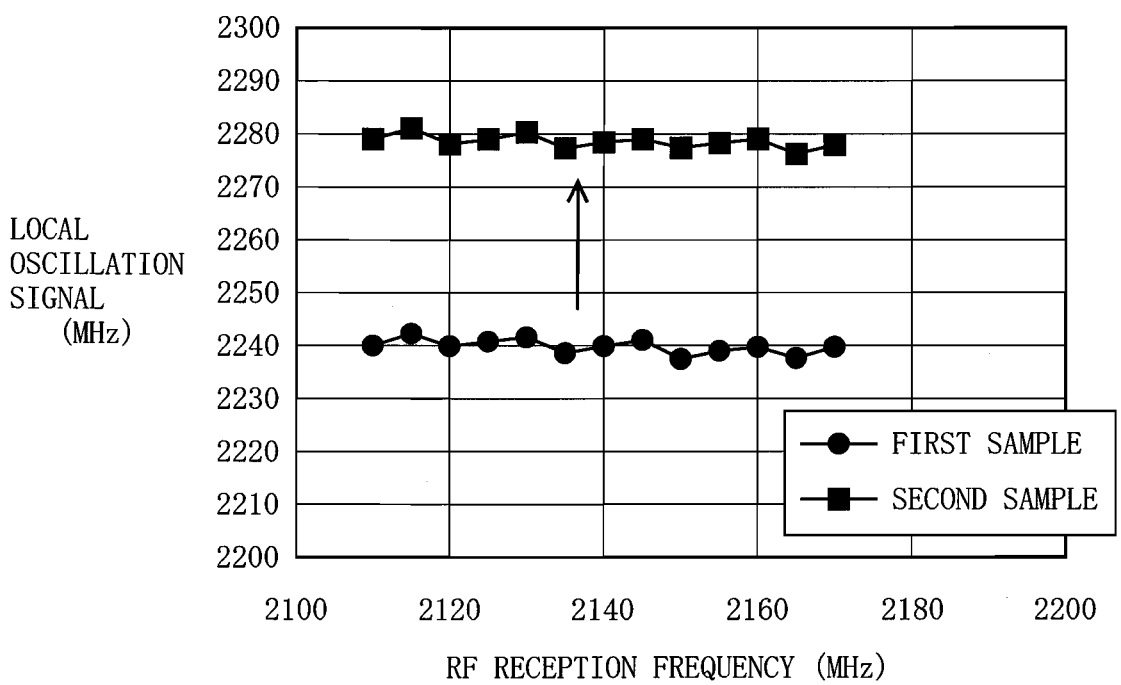
FIG. 5B is a table showing relationships between frequencies obtained by a second sample.
FIG. 5C is a graph representing a relationship between a reception frequency of the RF signal (an RF reception frequency) and the local oscillatory frequency, both of which are obtained by each of the first and second samples.

An inventor of the present invention experimentally selects two voltage controlled oscillators as samples, and obtains the frequency variation ranges and calculates, in WCDMA using 2 GHz band, the local oscillatory frequencies, each of which causes the intermediate frequency to be equivalent to an integral multiple of the symbol rate. FIG. 5A is a table showing relationships between frequencies obtained by a first sample. FIG. 5B is a table showing relationships between frequencies obtained by a second sample. FIG. 5C is a graph representing a relationship between a reception frequency of an RF signal (an RF reception frequency) and the local oscillatory frequency, both of which are obtained by each of the first and second samples.

In WCDMA using 2 GHz band, an RF reception frequency $f_{RF}$ is from 2110 to 2170 MHz. A symbol rate SymRate is 3.84 MHz. It is assumed that an oscillatory frequency $f_{LO}$ of the voltage controlled oscillator used as the first sample is in the vicinity of 2240 MHz due to variations. In this case, a minimum value ($f_{LO\_min}$) of the local oscillatory frequency is 2237.96 MHz, and a maximum value ($f_{LO\_max}$) thereof is 2241.72 MHz. Therefore, a frequency variation range $\Delta f_{LO}$ is 3.76 MHz. Within the frequency variation range $\Delta f_{LO}$, local oscillatory frequencies, each of which can cause an intermediate frequency $f_{IF}$ to be equivalent to an integral multiple of the symbol rate, exist as shown in an upper portion of FIG. 5A. As shown in the upper portion of FIG. 5A, the intermediate frequency $f_{IF}$ is within a range from 69.12 to 130.56 MHz. As described above, a frequency range required for the voltage controlled oscillator is enough to be approximately 0.17% of the center frequency (2140 MHz) of the RF reception frequency $f_{RF}$.

It is assumed that the oscillatory frequency $f_{LO}$ of the voltage controlled oscillator used as the second sample is in the vicinity of 2280 MHz due to variations. In this case, the minimum value of the local oscillatory frequency ($f_{LO\_min}$) is 2276.36 MHz, and the maximum value ($f_{LO\_max}$) thereof is 2280.12 MHz. Therefore, the frequency variation range $\Delta f_{LO}$ is 3.76 MHz. Within the frequency variation range $\Delta f_{LO}$, local oscillatory frequencies, each of which can cause the intermediate frequency $f_{IF}$ to be equivalent to an integral multiple of the symbol rate, exist as shown in an upper portion of FIG. 5B. As shown in the upper portion of FIG. 5B, the intermediate frequency $f_{IF}$ is within a range from 107.52 to 168.96 MHz. As described above, a frequency range required for the voltage controlled oscillator is enough to be approximately 0.17% of a center frequency (2140 MHz) of the RF reception frequency $f_{RF}$.

Here, an effect produced by a fractional bandwidth of approximately 0.17% will be described. Usually, when an oscillatory frequency is, for example, 2140 MHz, a bandwidth of 60 MHz+ a margin is required. Therefore, a fractional bandwidth of 2.8%+α is required. Thus, the voltage controlled oscillator must have an increased number of bands so as to cause an inclination of the frequency variation rate with respect to the control voltage to be steep. Thus, the C/N deteriorates, thereby resulting in the increased electric power consumption. However, as described in the present embodiment, if the fractional bandwidth is approximately 0.17%, the inclination of the frequency variation rate with respect to the control voltage may be moderate. Thus, it becomes possible to prevent the C/N from deteriorating, thereby making it possible to reduce the electric power consumption.

Even in the case where the RF signal having the RF reception frequency $f_{RF}$ of 2110 to 2170 MHz is received, as shown in FIG. 5C, the local oscillatory frequency from approximately 2240 MHz to 2280 MHz can be used.

As is clear from the first and second samples described above, in the configuration of the present invention, the voltage controlled oscillator may have a narrower frequency variable range than the conventional art. Furthermore, the local oscillatory frequency may have variations. Therefore, the local oscillatory frequency within each band can be discontinuously outputted, thereby realizing a low electric power consumption of the local oscillator.

Figure 6:
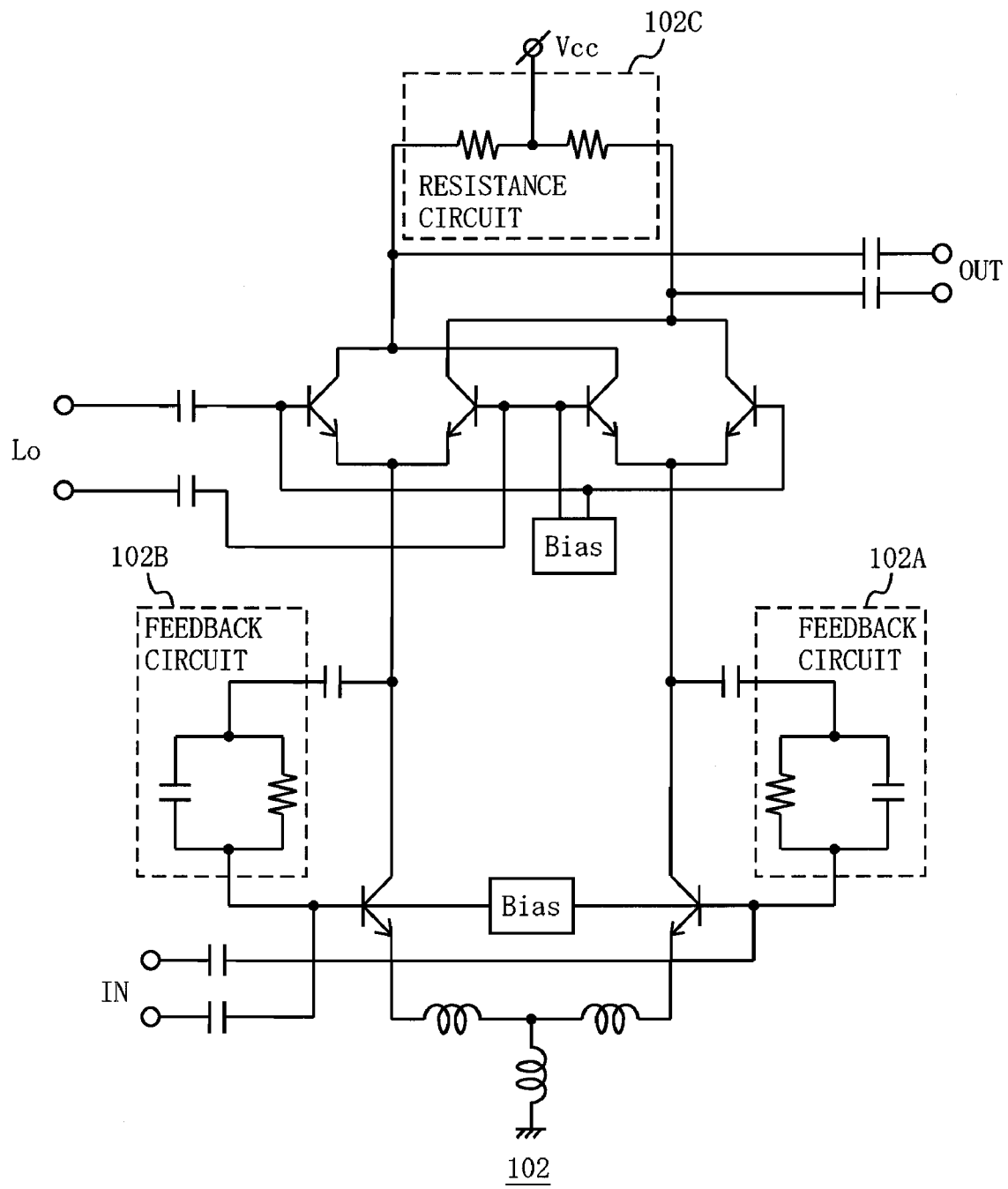
FIG. 6 is a diagram illustrating an exemplary circuit of the frequency converter 102.

FIG. 6 is a diagram illustrating an exemplary circuit of the frequency converter 102. As shown in FIG. 6, the frequency converter 102 is mainly composed of a double-balanced mixer using a Gilbert cell. Feedback circuits 102A and 102B, each of which connects a capacitor and a resistance in parallel to each other, are provided at an RF side. Thus, the frequency converter 102 can be acted as a negative feedback amplifier which compensates for a phase, thereby making it possible to cause a variable frequency band to be wider. Furthermore, a resistance circuit 102C is used at an IF side. Thus, unlike an inductor, a load impedance which does not depend on a frequency is generated, thereby making it possible to cause the variable frequency band to be wider.

Figure 7A:
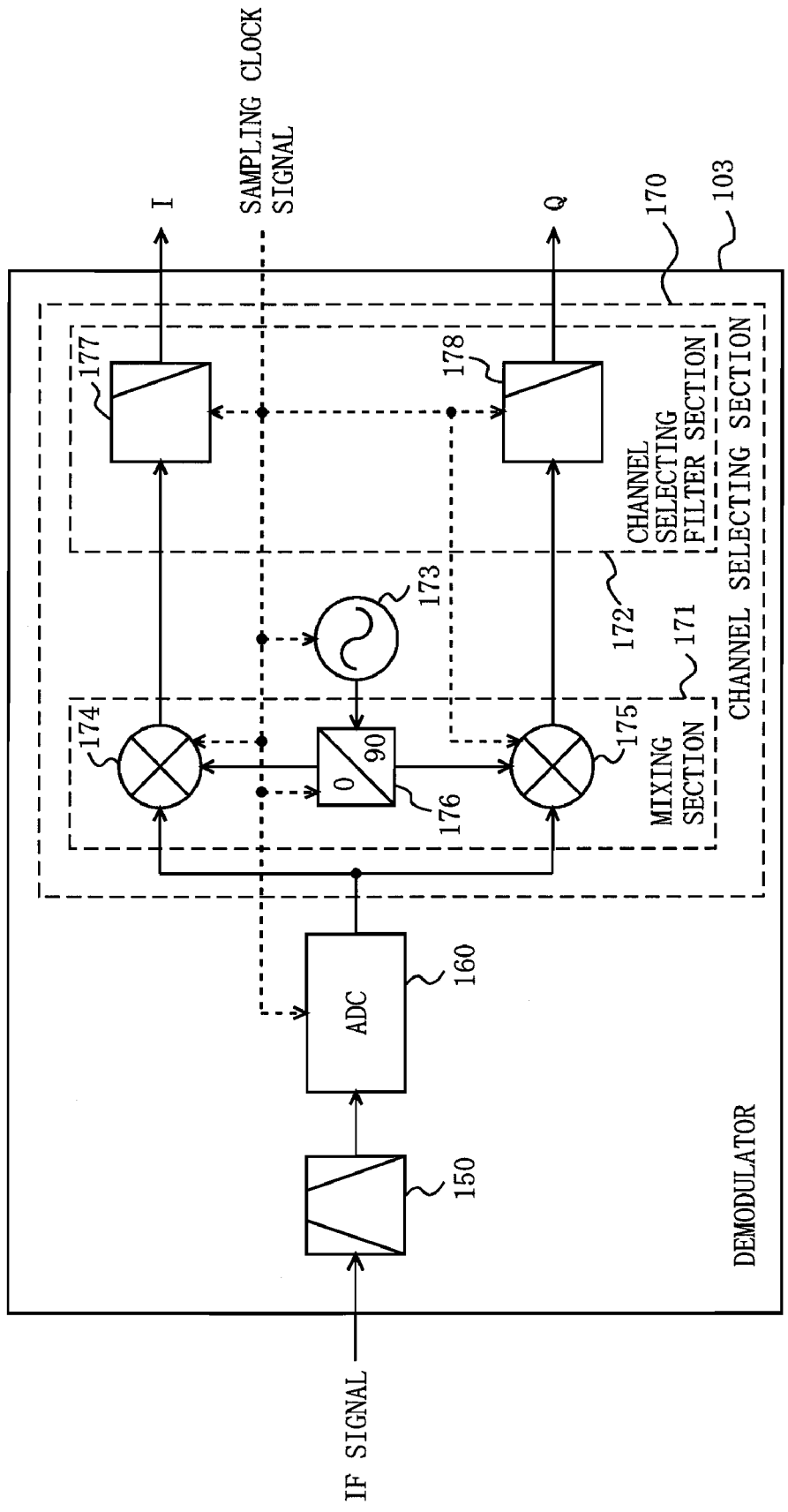
FIG. 7A is a block diagram illustrating a configuration of the demodulator 103.

FIG. 7A is a block diagram illustrating a configuration of the demodulator 103. In FIG. 7A, the demodulator 103 includes a bandpass filter 150, an ADC (analog digital converter) 160 and a channel selecting section 170. The channel selecting section 170 has a mixing section 171, a channel selecting filter section 172 and a clock generating section 173. The mixing section 171 has a first digital mixer 174, a second digital mixer 175 and a phase shifter 176. The channel selecting filter section 172 has a first lowpass filter 177 and a second lowpass filter 178.

Figure 7B:
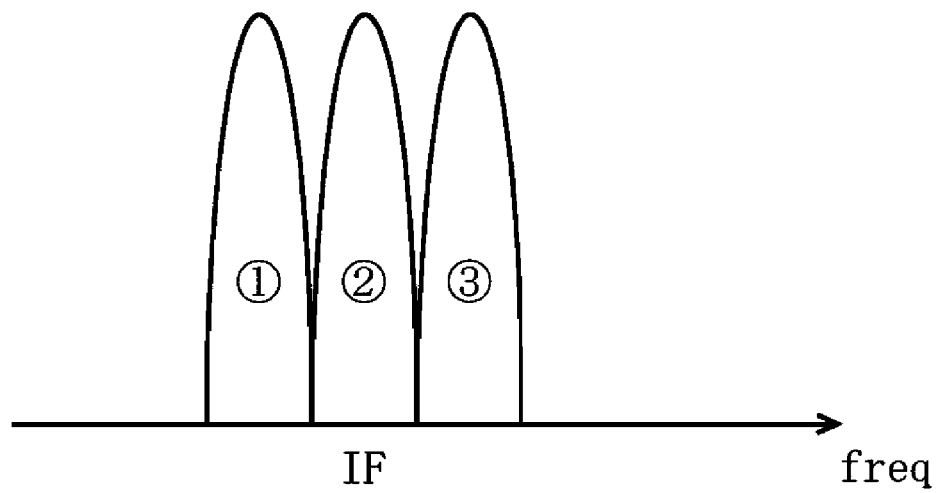
FIG. 7B is a diagram illustrating a frequency spectrum of the IF signal inputted to a bandpass filter 150.
Figure 7C:
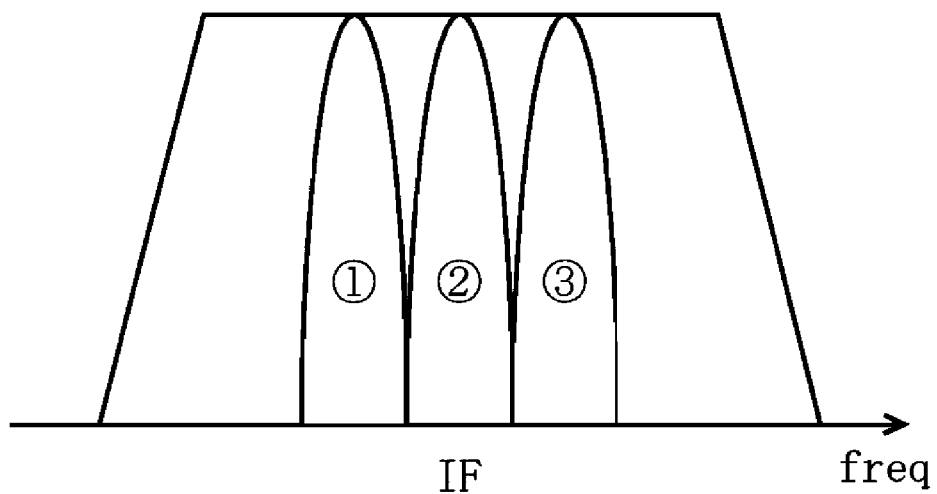
FIG. 7C is a diagram illustrating a band through which the bandpass filter 150 passes.

FIG. 7B is a diagram illustrating a frequency spectrum of the IF signal inputted to the bandpass filter 150. FIG. 7B exemplary shows that the IF signal includes the three channels of 1 to 3. The bandpass filter 150 passes all channels, included in the IF signal, which correspond to the desired band to be received therethrough. Thus, in the subsequent ADC 160, noise to be returned, due to aliasing, at the same frequency as a desired IF signal can be reduced. FIG. 7C is a diagram illustrating a band through which the bandpass filter 150 passes.

Based on an external or internal sampling clock signal, the ADC 160 converts the IF signal which has been passed through the bandpass filter 150 into a digital signal. Note that a frequency of the sampling clock signal (a sampling frequency) is denoted by fs. According to a sampling theorem of Nyquist, the sampling frequency fs must be more than twice the frequency of the IF signal (the intermediate frequency). Furthermore, the sampling frequency fs is equivalent to an integral multiple of the symbol rate. As described above, by causing the intermediate frequency and the sampling frequency to be equivalent to an integral multiple of the symbol rate, the ADC 160 can easily convert the IF signal into the digital signal.

Figure 7D:
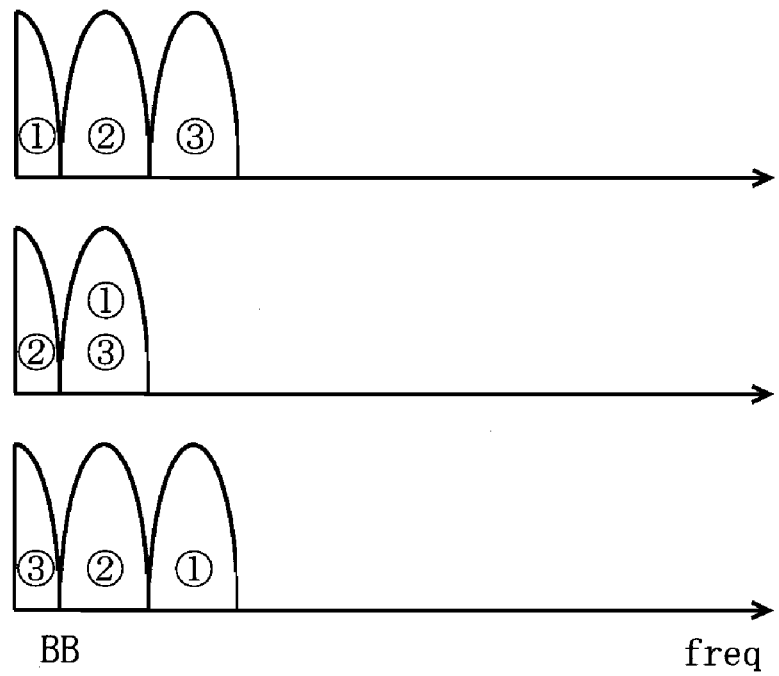
FIG. 7D is a diagram illustrating a state where a mixing section 171 down-converts a desired channel to a baseband bandwidth.
Figure 7E:
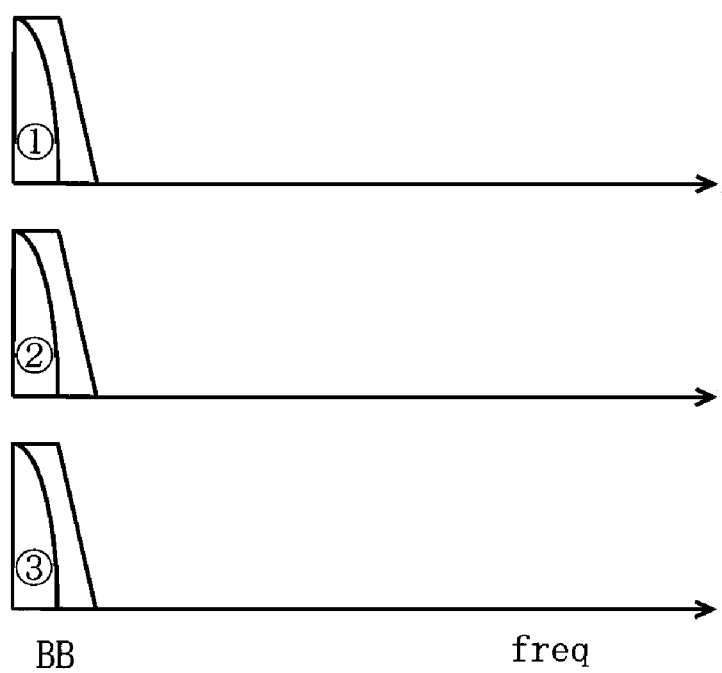

The channel selecting section 170 selects a desired channel included in the digital signal obtained by the ADC 160. Specifically, in the channel selecting section 170, the digital signal is divided into two paths so as to be inputted to the first and second digital mixers 174 and 175. The clock generating section 173 outputs a channel selecting clock signal. A phase of the channel selecting clock signal outputted from the clock generating section 173 is rotated by the phase shifter 176 by 0 degrees so as to be inputted to the first digital mixer 174. Similarly, the phase of the channel selecting clock outputted from the clock generating section 173 is rotated by the phase shifter 176 by 90 degrees so as to be inputted to the second digital mixer 175. The first digital mixer 174 mixes the digital signal with the channel selecting clock signal whose phase has been rotated by 0 degrees, thereby down-converting I of the desired channel so as to have a baseband bandwidth. The second digital mixer 175 mixes the digital signal with the channel selecting clock signal whose phase has been rotated by 90 degrees, thereby down-converting Q of the desired channel so as to have a baseband bandwidth. FIG. 7D is a diagram illustrating a state where the mixing section 171 down-converts the desired channel to a baseband bandwidth. Thereafter, the first lowpass filter 177 only passes I of the desired channel. The second lowpass filter 178 only passes Q of the desired channel. FIG. 7E is a diagram illustrating a state where only the desired channel is passed through. Note that the first and second digital mixers 174 and 175, the clock generating section 173, the phase shifter 176, and the first and second lowpass filters 177 and 178 operate synchronizing to the sampling clock signal.

Figure 8:
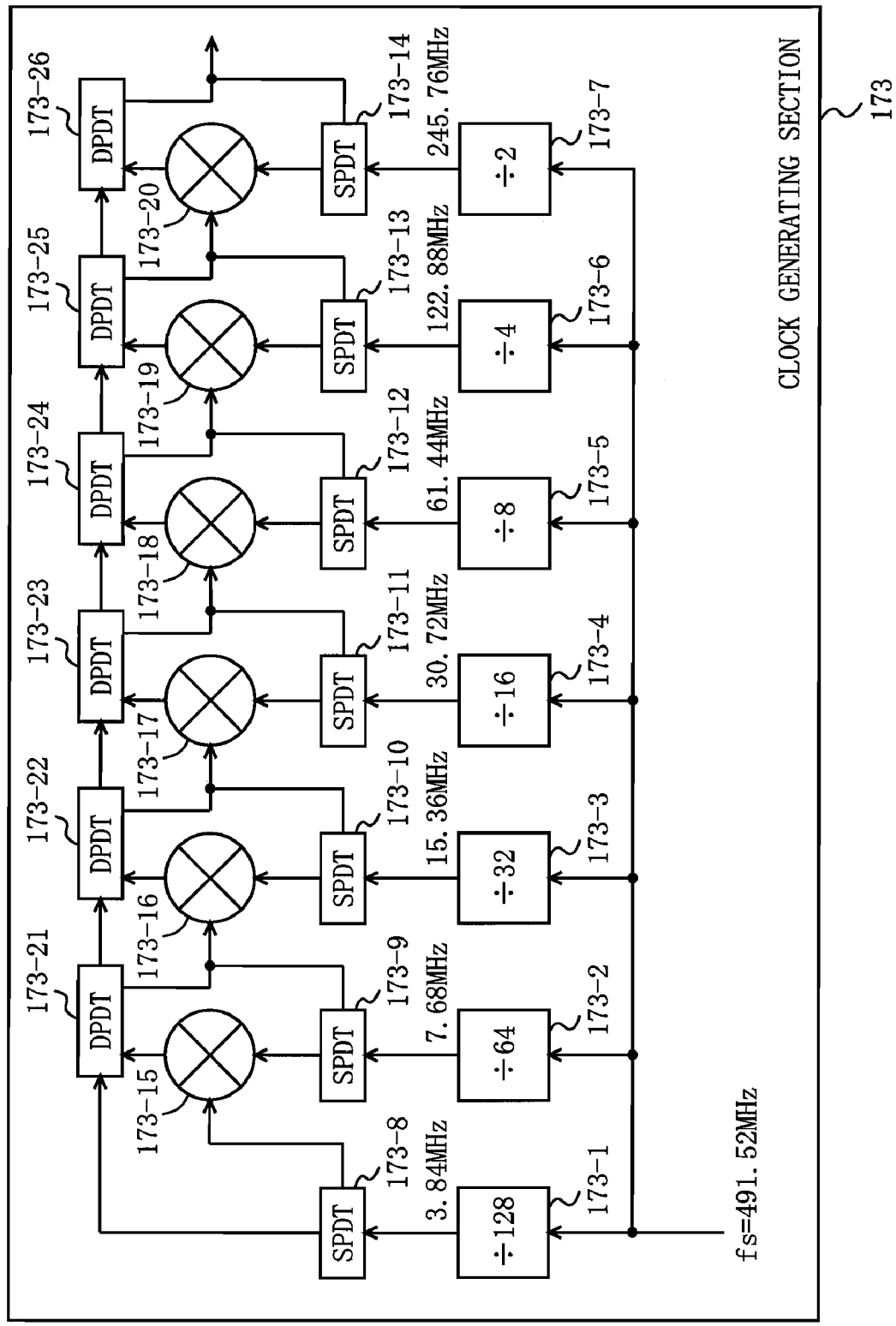
FIG. 8 is a block diagram illustrating an exemplary configuration of a channel selecting clock generating section 173.

FIG. 8 is a block diagram illustrating an exemplary configuration of the channel selecting clock generating section 173. In FIG. 8, the channel selecting clock generating section 173 includes division sections 173-1 to 173-7, SPDTs (single pole double throw) 173-8 to 173-14, mixing sections 173-15 to 173-20 and DPDTs (double pole double throw) 173-21 to 173-26. In the case where f1 and f2 are inputted to the mixing sections 173-15 to 173-20, each of the mixing sections 173-15 to 173-20 outputs f1+f2. In the case where only f1 is inputted to the mixing sections 173-15 to 173-20, each of the mixing sections 173-15 to 173-20 outputs only f1. Each of the SPDTs 173-8 to 173-14 has one input side terminal and two output side terminals, and by changing a switch, the one input terminal can be connected to either of the two output side terminals. Each of the DPDTs 173-21 to 173-26 has two input side terminals and two output side terminals, and by changing a switch, either of the two input terminals can be connected to either of the two output terminals.

The sampling frequency fs is equivalent to an integral multiple of the symbol rate. Therefore, the switch included in each of the SPDTs 173-8 to 173-14 and each of the DPDTs 173-21 to 173-26 is switched in an appropriate manner, thereby allowing the clock generating section 173 to output the channel selecting clock signal having a frequency equivalent to an integral multiple of the symbol rate. For example, as shown in FIGS. 5A and 5B, since a range of an intermediate frequency to be actually used is narrow (approximately 60 MHz to 170 MHz, for example), a circuit configuration shown in FIG. 8 can be further simplified. Note that if an intermediate frequency is equivalent to an integral multiple of twice the symbol rate, the circuit can be further simplified. Similarly, if the intermediate frequency is equivalent to an integral multiple of three times, . . . N times the symbol rate, the circuit can be simplified.

As described above, according to the first embodiment, the local oscillator 101 outputs the local oscillation signal having a frequency which causes the intermediate frequency to be equivalent to an integral multiple of the symbol rate. By causing the intermediate frequency to be equivalent to an integral multiple of the symbol rate, the demodulator 103 can easily perform an analog/digital conversion, and can also easily select a desired channel. The desired channel is selected in the demodulator. Therefore, in a preceding portion of the demodulator, only a band is selected. There are a plurality of local oscillatory frequencies, each of which can cause the intermediate frequency to be equivalent to an integral multiple of the symbol rate. Thus, even if a frequency outputted from the voltage controlled oscillator 116 included in the local oscillator 101 has variations, such a local oscillatory frequency can be selected. Therefore, the voltage controlled oscillator 116 can discontinuously change a band, and needs to have only a characteristic in which the local oscillatory frequency is moderately changed with respect to the control voltage. As described above, such a voltage controlled oscillator 116 may have reduced electric power consumption as compared to the conventional art. Therefore, it becomes possible to provide a wireless receiver capable of realizing the multi-band and multi-mode operations while reducing the electric power consumption of an RF analog local oscillator.

(Variant of the Voltage Controlled Oscillator According to the First Embodiment)

FIG. 9 is a circuit diagram illustrating another example of the voltage controlled oscillator 116. In FIG. 9, portions having the same functions as those of the circuit shown in FIG. 3 are denoted by the same reference numerals, and any descriptions thereof will be omitted. The voltage controlled oscillator 116 shown in FIG. 9 includes a switch circuit for fine adjustment 1162c instead of the variable capacitor circuit 1162. In the switch circuit for the fine adjustment 1162c, a switching element is connected to each of a plurality of capacitors, and an on/off of the switching element is controlled, thereby finely adjusting the local oscillatory frequency. With a configuration shown in FIG. 9, the Q value of the variable capacitor for the fine adjustment can be increased, thereby making it possible to realize the reduced electric power consumption of the voltage controlled oscillator 116.

The reasons why the switch circuit for the fine adjustment 1162c allows the intermediate frequency to be equivalent to an integral multiple of the symbol rate will be described. For example, it is assumed that frequencies f0 and f0+Δf are switched between each other at an interval of Δf/2. In this case, an output signal S(t) is represented as below.

$$S(t)=A(\Delta f/2)\cdot\cos 2\pi(f0)t+B(\Delta f/2)\cdot\cos 2\pi(f0+\Delta f)t$$

Here, A(Δf/2) is a fraction which becomes 0 from a time 1/Δf to 2/Δf and becomes 1 at a time other than the aforementioned time. B(Δf/2) is a fraction which becomes 1 from the time 1/Δf to 2/Δf and becomes 0 at a time other than the aforementioned time. When S(t) is calculated, an element of cos 2π(f0+Δf/2)t is always obtained. Therefore, each switch is changed in an appropriate manner, thereby making it possible to equivalently realize an intermediate value between two capacities. As a result, a continuous frequency variation can be achieved. Thus, even when using the present variant, the intermediate frequency can be equivalent to an integral multiple of the symbol rate.

(Variant of the Frequency Converter According to the First Embodiment)

Figure 10A:
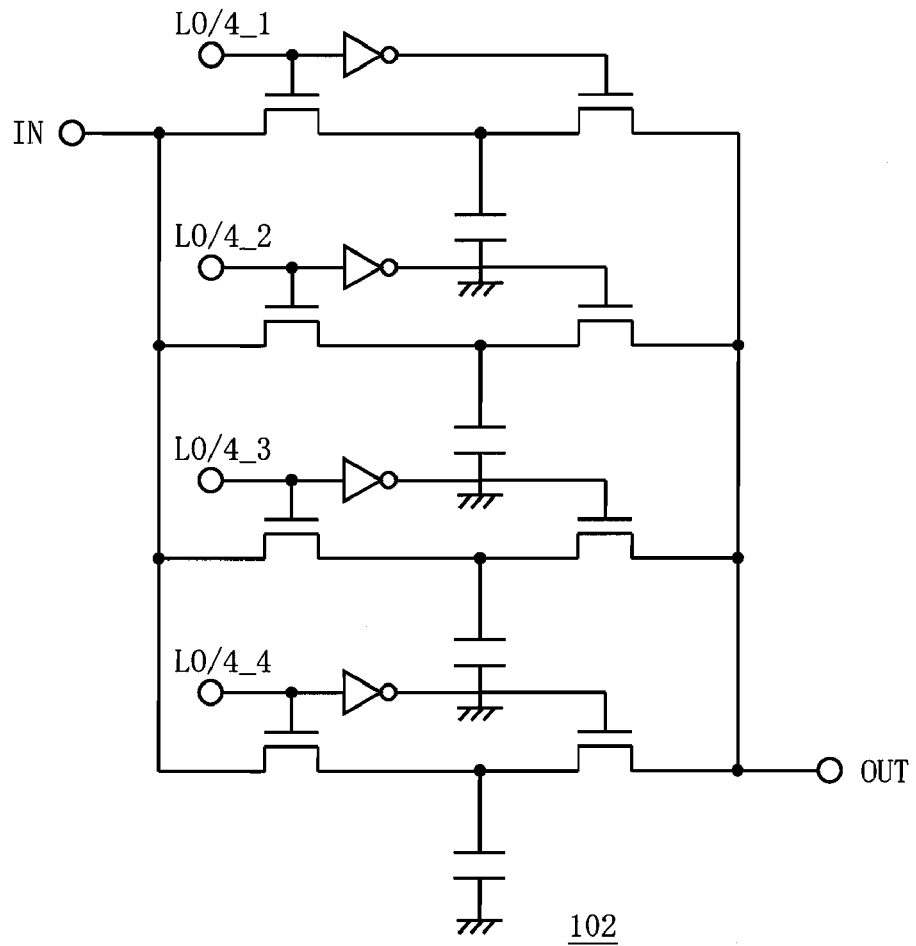
FIG. 10A is a circuit diagram illustrating another example of the frequency converter 102.
Figure 10B:
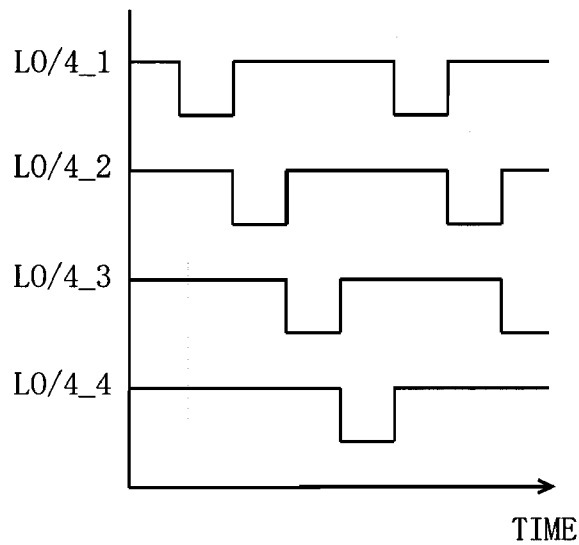
FIG. 10B is a diagram illustrating sampling clocks LO/4_1, LO/4_2, LO/4_3 and LO/4_4 respectively inputted to four paths.

FIG. 10A is a circuit diagram illustrating another example of the frequency converter 102. The frequency converter 102 shown in FIG. 10A is a down-converter using a sample hold circuit. The present variant illustrates an example where four paths are provided. However, the present variant is not limited thereto. The down-converter shown in FIG. 10A performs sampling in one-quarter of a cycle of the local oscillatory frequency of the local oscillation signal outputted from the local oscillator 101. Cycles of performing the samplings are shifted from each other between the four paths. FIG. 10B is a diagram illustrating sampling clocks LO/4_1, LO/4_2, LO/4_3 and LO/4_4 respectively inputted to the four paths. Therefore, a specification for a switching time required for one switch is eased. With this configuration, a digital down-conversion is chronologically performed, thereby realizing a down-converter in which a variation of an output frequency is relatively small and a wide band can be used.

(First Variant of the Demodulator According to the First Embodiment)

Figure 11A:
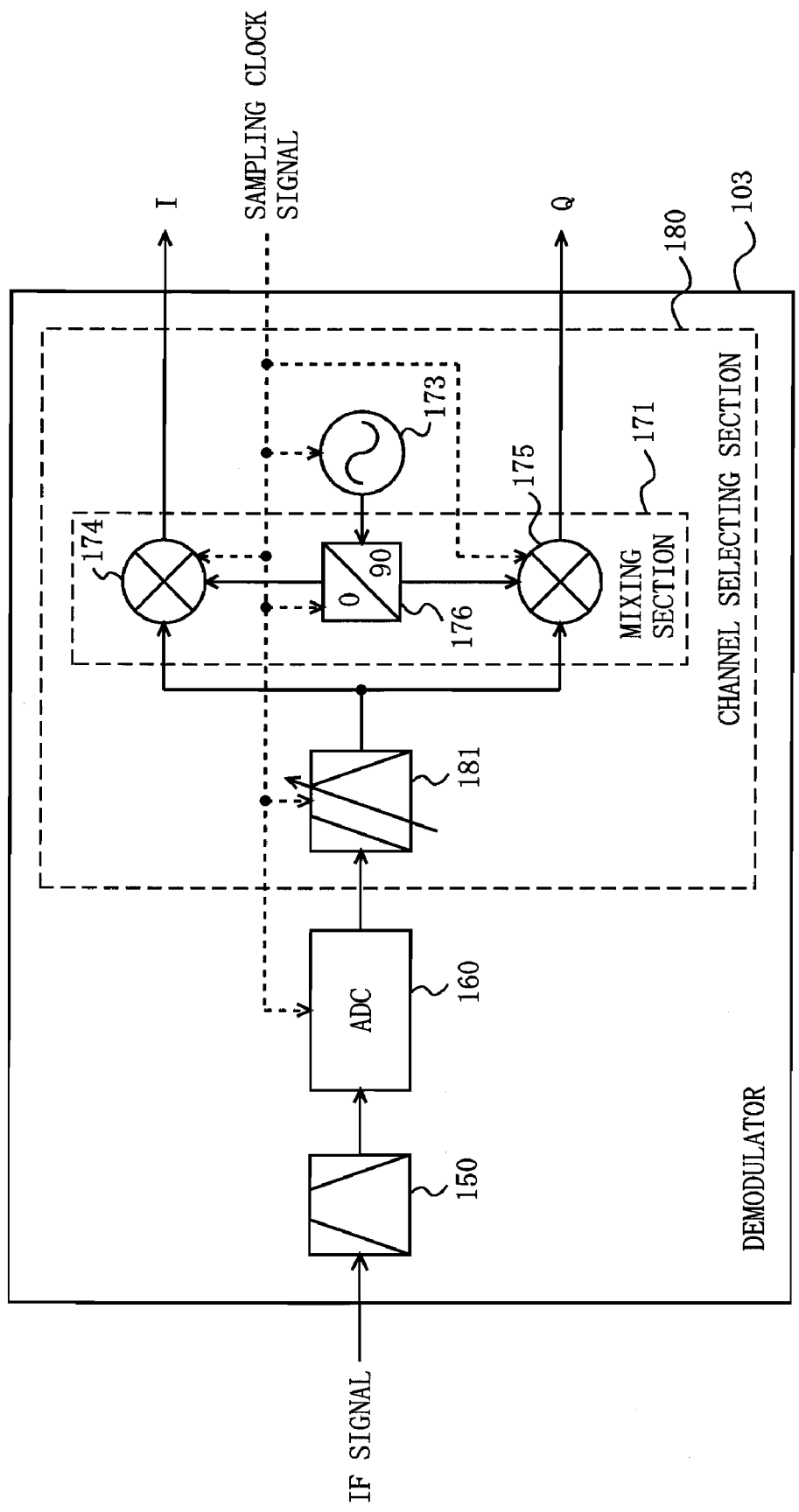
FIG. 11A is a block diagram illustrating another configuration of the demodulator 103.
Figure 11B:
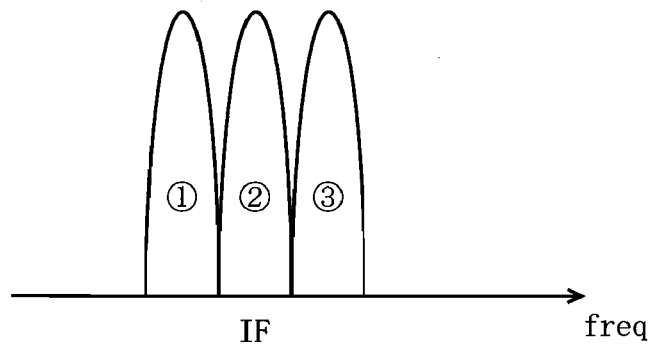
FIG. 11B is a diagram illustrating a spectrum of the IF signal.
Figure 11C:
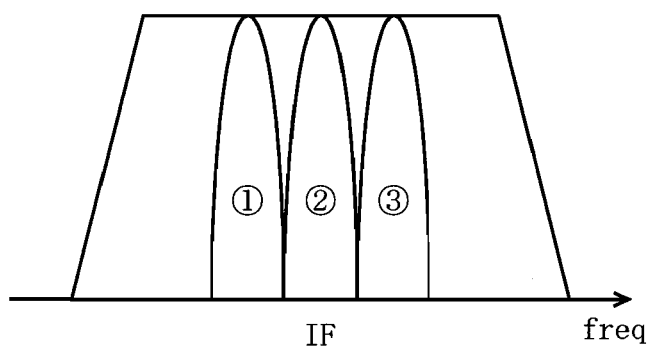
FIG. 11C is a diagram illustrating a state where the bandpass filter 150 passes a band therethrough.

FIG. 11A is a block diagram illustrating another configuration of the demodulator 103. In FIG. 11A, portions having the same functions as those of the configuration shown in FIG. 7A are denoted by the same reference numerals, and any detailed descriptions thereof will be omitted. In FIG. 11A, the demodulator 103 includes the bandpass filter 150, the ADC 160 and a channel selecting section 180. The channel selecting section 180 has the mixing section 171, a channel selecting filter 181 and the clock generating section 173. FIG. 11B is a diagram illustrating a spectrum of the IF signal. FIG. 11C is a diagram illustrating a state where the bandpass filter 150 passes a band therethrough.

Figure 11D:
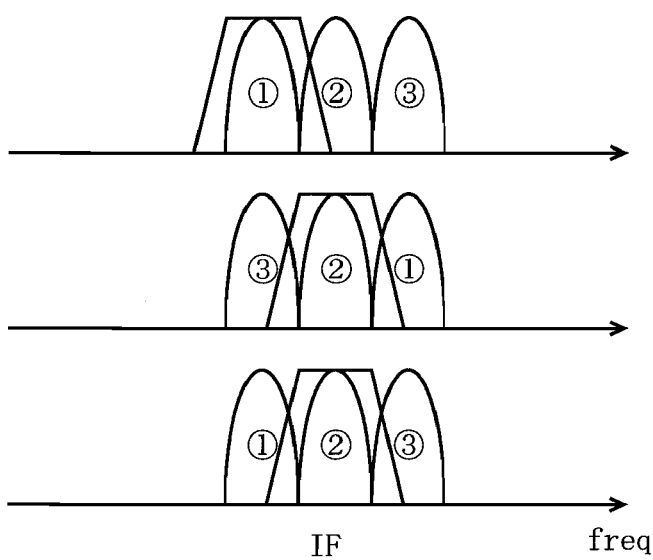
FIG. 11D is a diagram illustrating a state where a channel selecting filter 181 selects a channel.

FIG. 11D is a diagram illustrating a state where the channel selecting filter 181 selects a channel. The channel selecting filter 181 is a channel selecting tunable bandpass filter, and can pass a desired channel therethrough. The channel selecting filter 181 uses a FIR filter, an IIR filter or the like as the tunable bandpass filter. Therefore, a tap value is changed, thereby allowing the channel selecting filter 181 to pass the desired channel therethrough. Particularly, in the present invention, since the intermediate frequency is equivalent to an integral multiple of the symbol rate, synchronization between the sampling frequency fs and the inputted digital signal can be easily achieved. Therefore, with a relatively simple circuit configuration, a bandpass filter having high precision can be provided. Also in this case, the configuration shown in FIG. 8 can be applied to the channel selecting clock generating section 173.

Figure 11E:
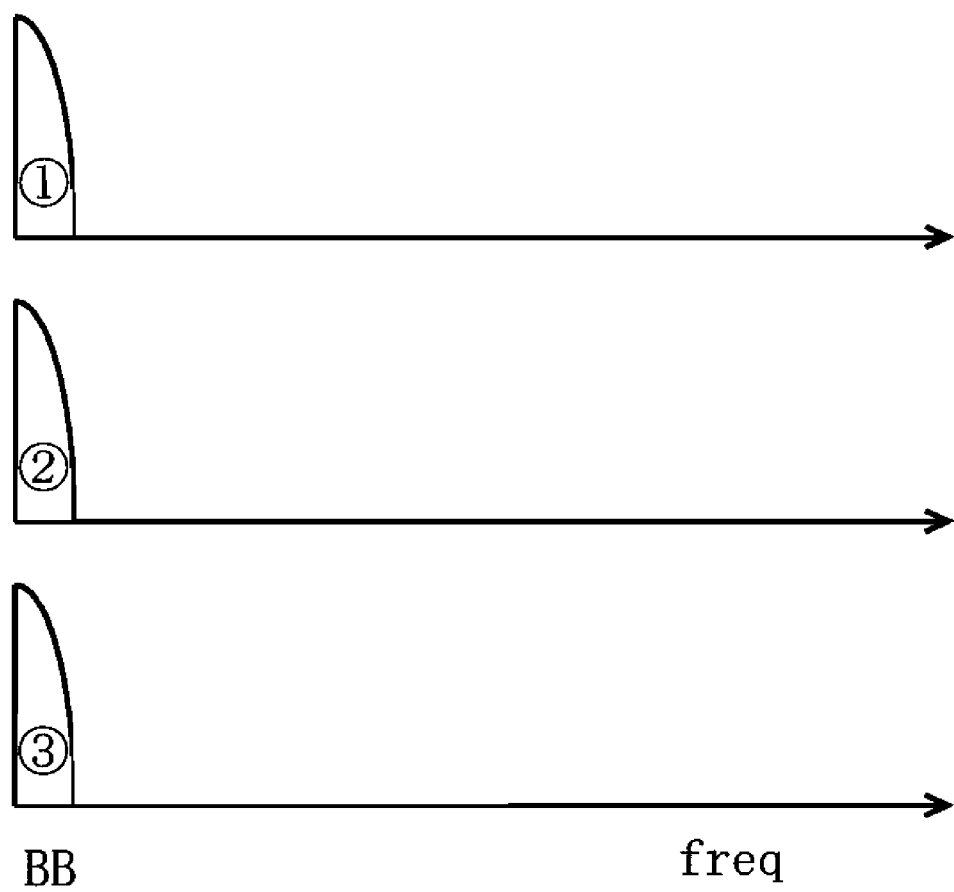
FIG. 11E is a diagram illustrating a state where a mixing section down-converts the desired channel to the baseband bandwidth.

FIG. 11E is a diagram illustrating a state where the mixing section down-converts the desired channel to the baseband bandwidth. As such, even when using the configuration shown in FIG. 11A, the desired channel can be selected.

(Second Variant of the Demodulator According to the First Embodiment)

Figure 12:
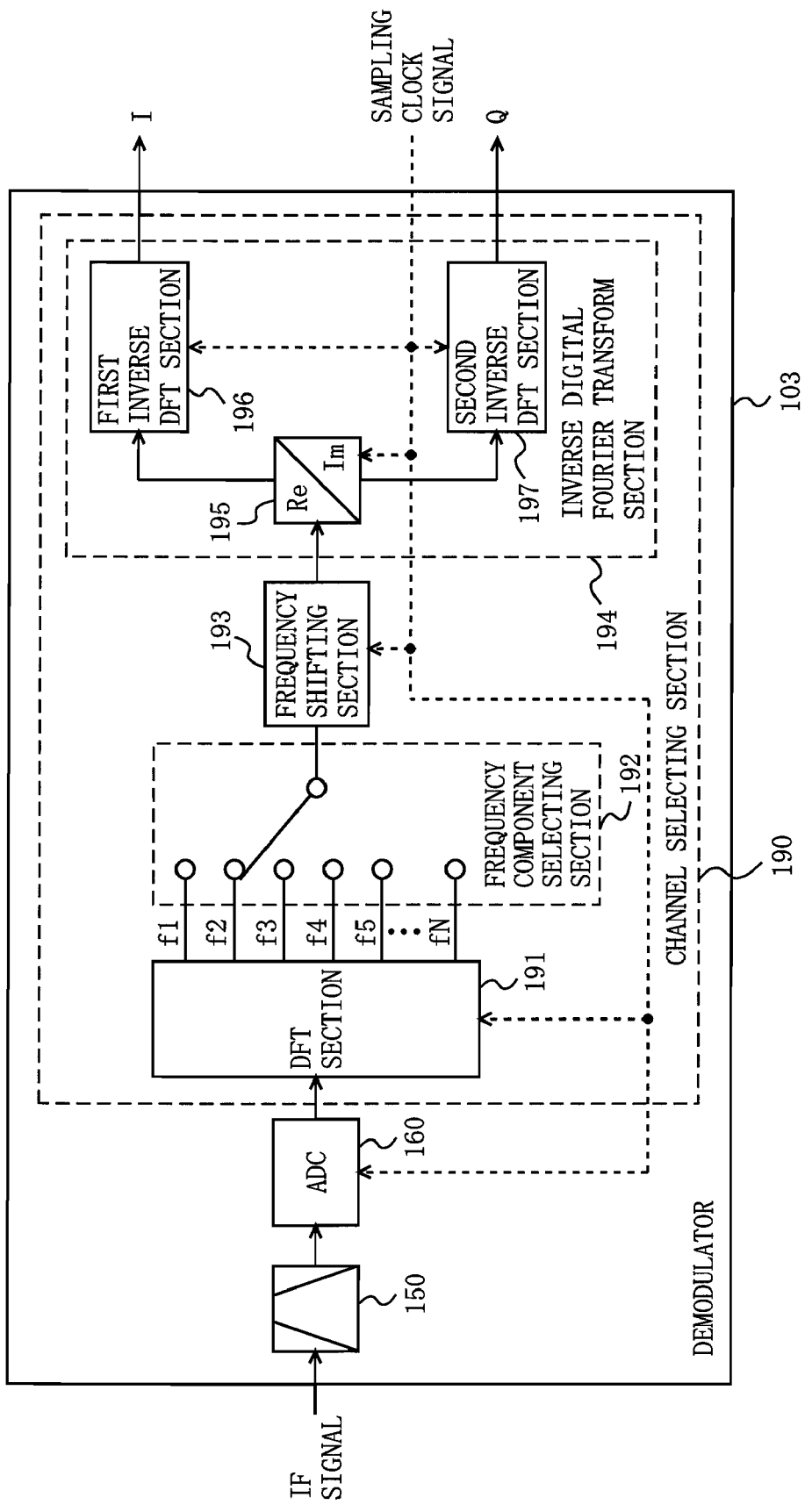
FIG. 12 is a block diagram illustrating another configuration of the demodulator 103.

FIG. 12 is a block diagram illustrating another configuration of the demodulator 103. In FIG. 12, portions having the same functions as those of the configuration shown in FIG. 7A are denoted by the same reference numerals, and any detailed descriptions thereof will be omitted. In FIG. 12, the demodulator 103 includes the bandpass filter 150, the ADC 160 and a channel selecting section 190. The channel selecting section 190 includes a digital Fourier transform (DFT) section 191, a frequency component selecting section 192, a frequency shifting section 193, and an inverse digital Fourier transform section 194. The inverse digital Fourier transform section 194 has a real part/imaginary part branching section 195, a first inverse digital Fourier transform section 196 and a second inverse digital Fourier transform section 197.

The digital Fourier transform section 191 performs a digital Fourier transform on the digital signal obtained by the ADC, and divides the obtained signal into frequency components f1 to fN. The frequency component selecting section 192 selects at least one of the frequency components which is necessary for reproducing the desired channel. The above selection may be performed in a parallel or serial manner. The frequency shifting section 193 shifts the frequency component selected by the frequency component selecting section 192 so as to have a baseband bandwidth. The real part/imaginary part branching section 195 branches an output of the frequency shifting section 193 into a real part and an imaginary part. In the real part, the first inverse digital Fourier transform section 196 performs an inverse digital Fourier transform, thereby outputting I of the desired channel. In the imaginary part, the second inverse digital Fourier transform section 197 performs the inverse digital Fourier transform, thereby outputting Q of the desired channel. As described above, the inverse digital Fourier transform section 194 performs the inverse Fourier transform on the one frequency component selected by the frequency component selecting section 192 and whose frequency is shifted by the frequency shifting section 193, thereby selecting the desired channel.

Since the intermediate frequency is equivalent to an integral multiple of the symbol rate, the digital Fourier transform can be easily performed on the digital signal. This is because the synchronization between the digital signal and the symbol rate can be easily achieved.

Second Embodiment

In the first embodiment above, the image interference is reduced by using the RF bandpass filter. However, depending on applications, the image interference needs to be further realized. Therefore, a second embodiment is proposed. In the second embodiment, a configuration of the frequency converter is different from that of the first embodiment.

Figure 13:
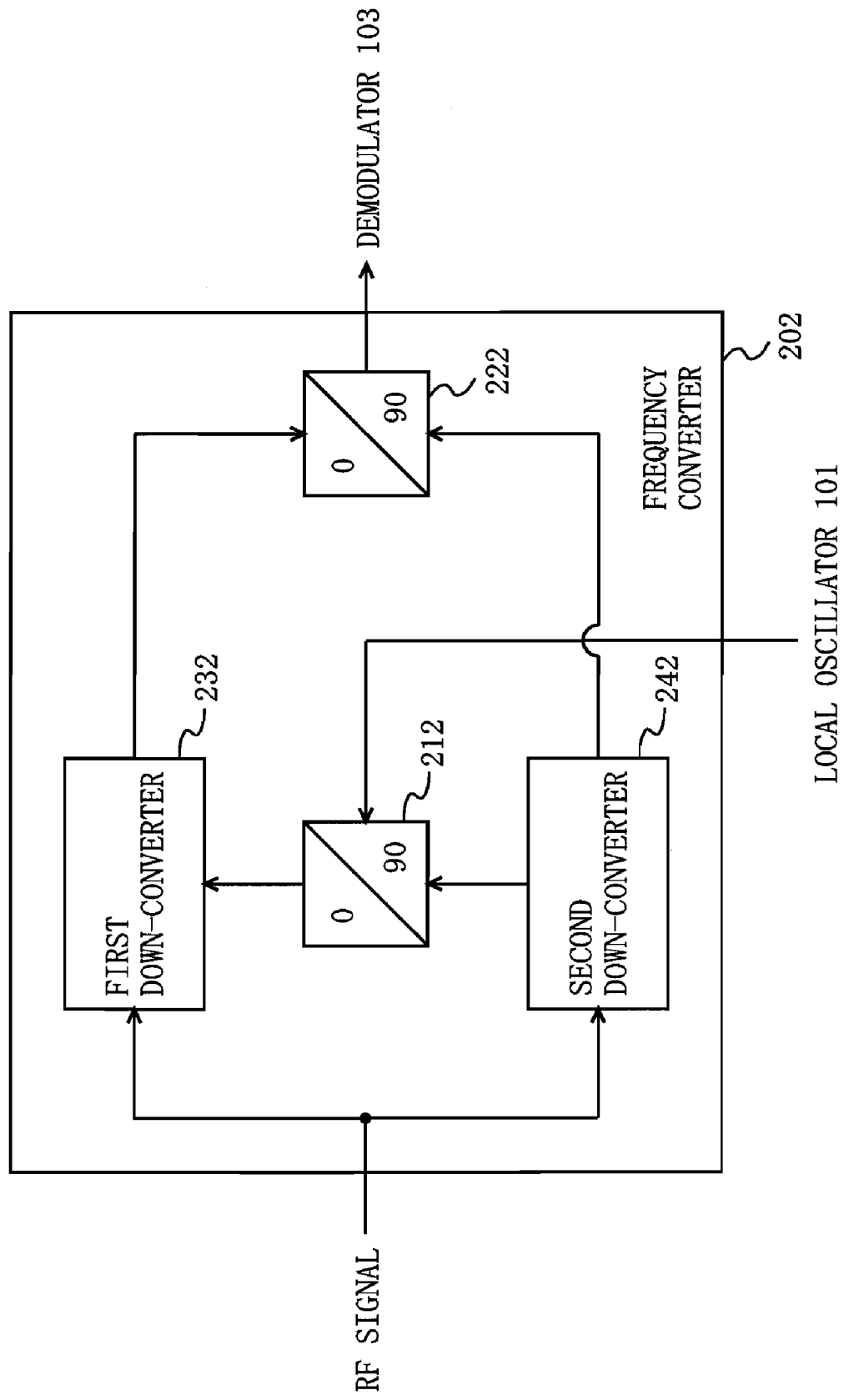
FIG. 13 is a block diagram illustrating a configuration of a frequency converter 202 according to a second embodiment of the present invention.

FIG. 13 is a block diagram illustrating a configuration of a frequency converter 202 according to the second embodiment of the present invention. The second embodiment is similar to the first embodiment other than the frequency converter 202. In FIG. 13, the frequency converter 202 includes a first phase shifter 212, a second phase shifter 222, a first down-converter 232, and a second down-converter 242.

The first phase shifter 212 rotates a phase of the local oscillation signal outputted from the local oscillator 101 by 0 and 90 degrees so as to be inputted to the first down-converter 232 and the second down-converter 242, respectively. The first down-converter 232 down-converts the RF signal based on the local oscillation signal whose phase has been rotated by 0 degrees. The second down-converter 242 down-converts the RF signal based on the local oscillation signal whose phase has been rotated by 90 degrees. The second phase shifter 222 rotates a phase of an output of the first down-converter 232 and a phase of an output of the second down-converter 242 by 0 and 90 degrees, respectively, and combines two obtained signals so as to be inputted to the demodulator 103.

As described above, according to the second embodiment, the frequency converter 202 uses Hartley's method, thereby making it possible to suppress the image interference.

Note that the local oscillator 101 may output the local oscillation signal having a frequency 2N times a desired local oscillatory frequency so as to produce a phase difference between 0 and 90 degrees by using a divider.

Third Embodiment

Figure 14:
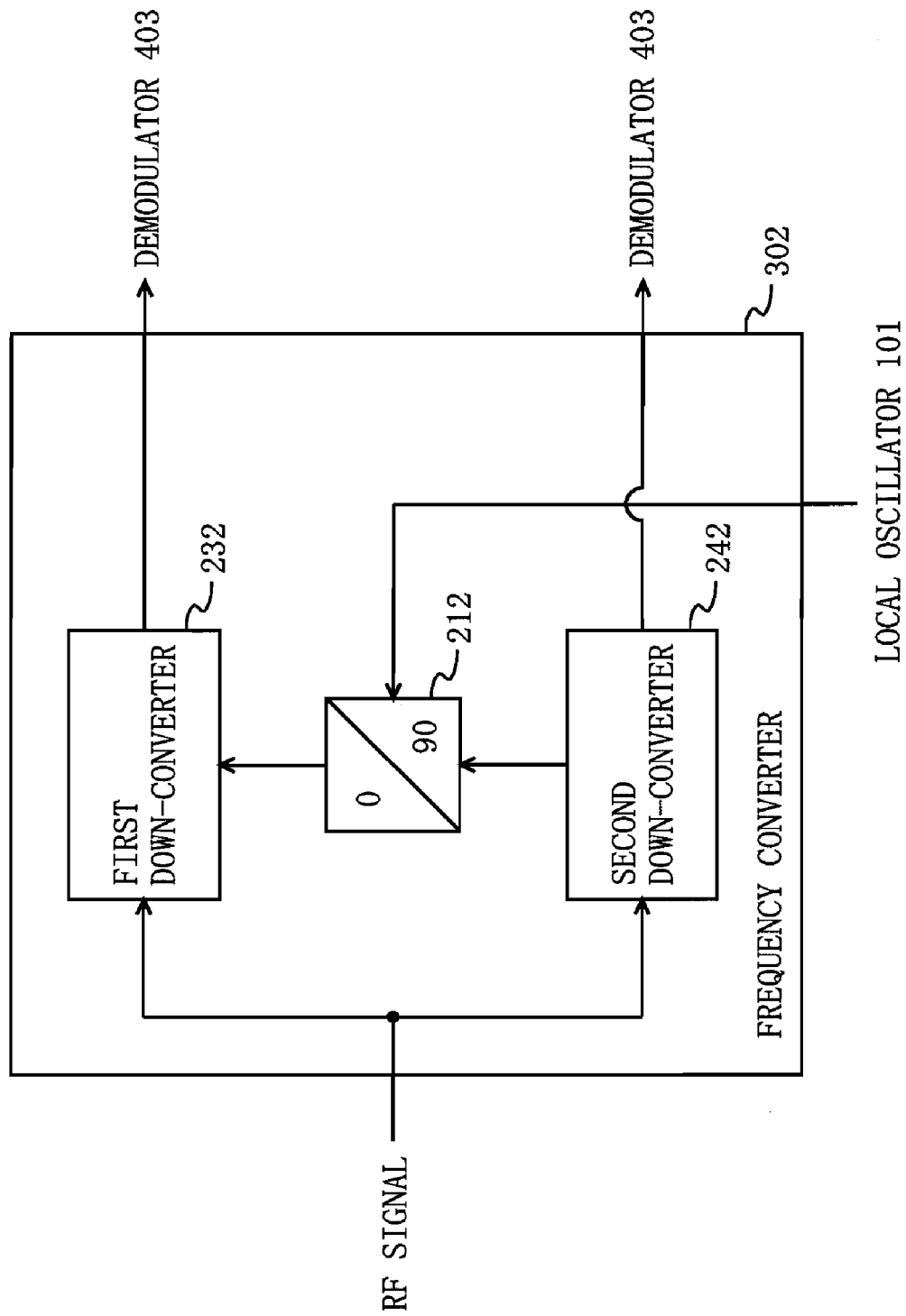
FIG. 14 is a block diagram illustrating a configuration of a frequency converter 302 according to a third embodiment of the present invention.

FIG. 14 is a block diagram illustrating a configuration of a frequency converter 302 according to a third embodiment of the present invention. In FIG. 14, portions having the same functions as those of the second embodiment are denoted by the same reference numerals, and any detailed descriptions thereof will be omitted. The frequency converter 302 includes the first phase shifter 212, the first down-converter 232 and the second down-converter 242. As shown in FIG. 14, by the local oscillation signal having the phase difference between 0 and 90 degrees, the RF signal is down-converted so as to be inputted to a demodulator 403 shown in FIG. 15A to be described later.

Figure 15A:
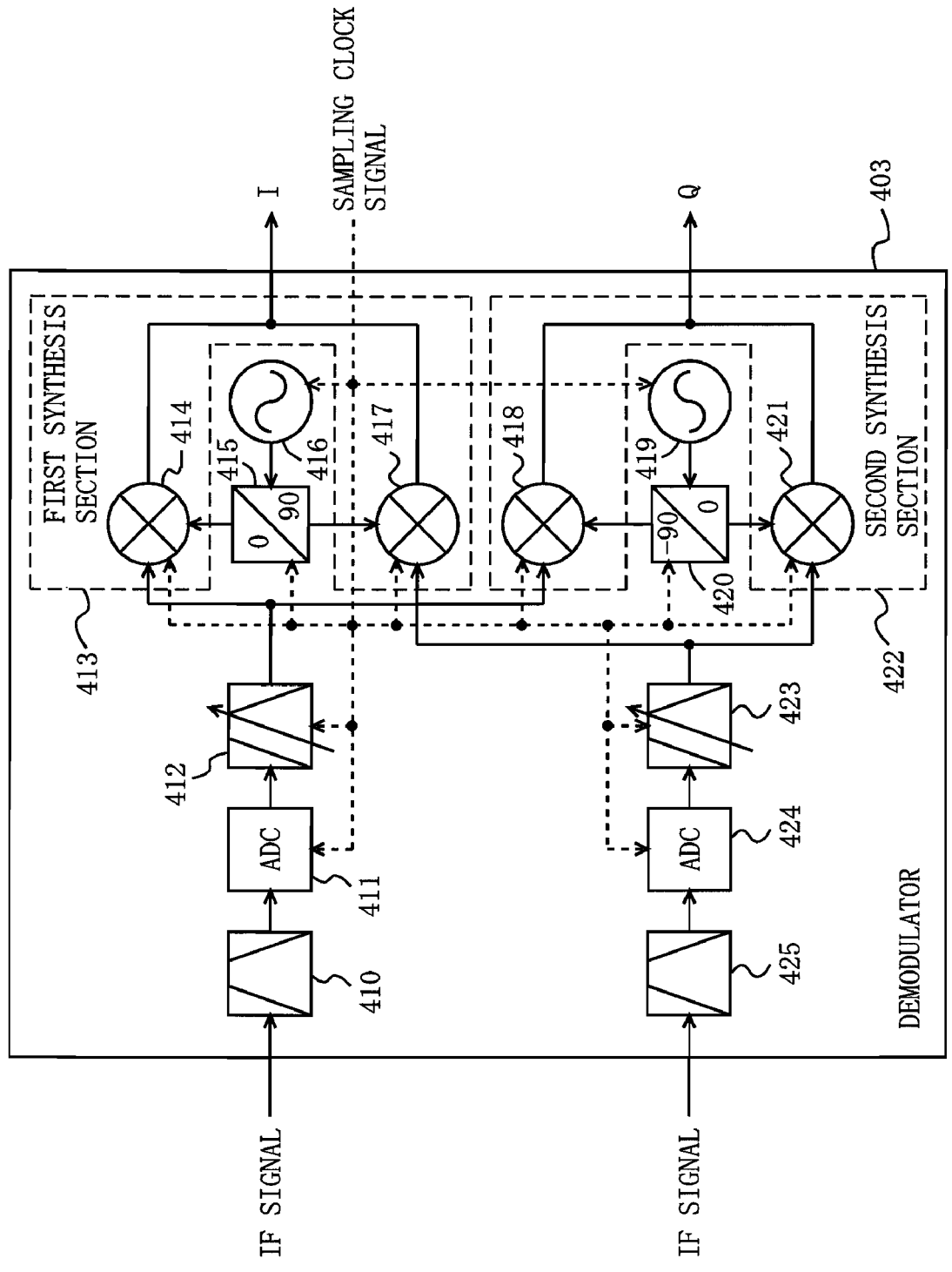
FIG. 15A is a block diagram illustrating a configuration of a demodulator 403.

FIG. 15A is a block diagram illustrating a configuration of the demodulator 403. The demodulator 403 includes a first bandpass filter 410, a first ADC 411, a first channel selecting filter 412, a first synthesis section 413, a first channel selecting clock generating section 416, a third phase shifter 415, a second bandpass filter 425, a second ADC 424, a second channel selecting filter 423, a second synthesis section 422, a second channel selecting clock generating section 419, and a fourth phase shifter 420. The first synthesis section 413 has a first digital mixer 414 and a second digital mixer 417. The second synthesis section 422 has a third digital mixer 418 and a fourth digital mixer 421.

Figure 15B:
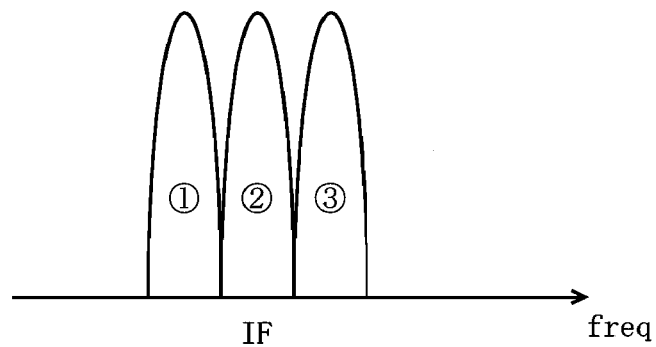
FIG. 15B is a diagram illustrating a frequency spectrum of the IF signal.
Figure 15C:
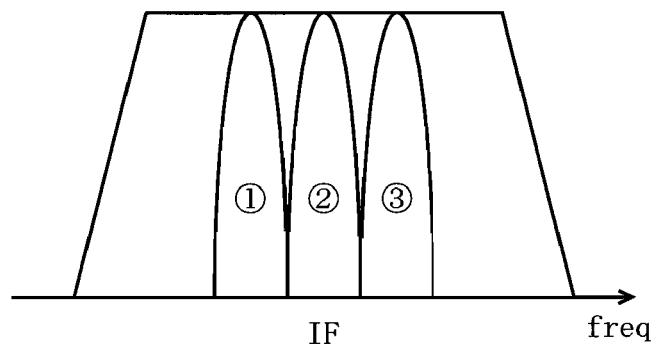
FIG. 15C is a diagram illustrating a state where each of the first and second bandpass filters 410 and 425 passes a band therethrough.

The first bandpass filter 410 passes all channels, included in an IF signal, which correspond to the band to be received, which is included in an output signal of the first down-converter 232 therethrough. Based on the sampling clock signal having the sampling frequency equivalent to an integral multiple of the symbol rate, the first ADC 411 converts the IF signal which has passed through the first bandpass filter 410 into a digital signal. The second bandpass filter 425 passes all channels, included in an IF signal, which correspond to the band to be received, which is included in an output signal of the second down-converter 242 therethrough. Based on the sampling clock signal having the sampling frequency equivalent to an integral multiple of the symbol rate, the second ADC 424 converts the IF signal which has passed through the second bandpass filter 425 into a digital signal. FIG. 15B is a diagram illustrating a frequency spectrum of the IF signal. FIG. 15C is a diagram illustrating a state where each of the first and second bandpass filters 410 and 425 passes a band therethrough.

Figure 15D:
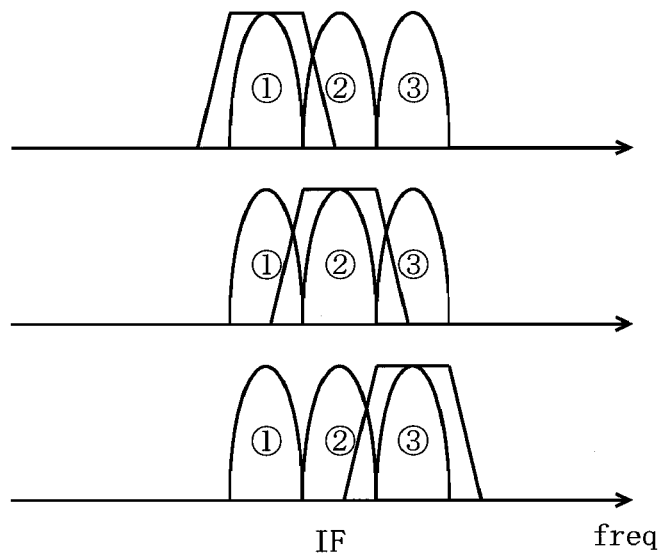
FIG. 15D is a diagram illustrating a state where each of the first and second channel selecting filters 412 and 423 passes the desired channel therethrough.

The first channel selecting filter 412 passes a frequency of a desired channel included in the digital signal obtained by the first ADC 411 therethrough. The second channel selecting filter 423 passes a frequency of the desired channel included in the digital signal obtained by the second ADC 424 therethrough. FIG. 15D is a diagram illustrating a state where each of the first and second channel selecting filters 412 and 423 passes the desired channel therethrough.

The first and second channel selecting clock generating sections 416 and 419 generate first and second channel selecting clock signals, respectively, for down-converting the desired channel to the baseband bandwidth.

The third phase shifter 415 rotates a phase of the channel selecting clock signal outputted from the first channel selecting clock generating section 416 by 0 degrees so as to be outputted, and also rotates the phase of the channel selecting clock signal outputted from the first channel selecting clock generating section 416 by 90 degrees so as to be outputted.

The fourth phase shifter 420 rotates a phase of the channel selecting clock signal outputted from the second channel clock generating section 419 by −90 degrees so as to be outputted, and also rotates the phase of the channel selecting clock signal outputted from the second channel clock generating section 419 by 0 degrees so as to be outputted.

The first synthesis section 413 causes the first digital mixer 414 to mix an output of the first channel selecting filter 412 with the channel selecting clock signal, whose phase has been rotated by 0 degrees, outputted from the third phase shifter 415, and also causes the second digital mixer 417 to mix an output of the second channel selecting filter 423 with the channel selecting clock signal, whose phase has been rotated by 90 degrees, outputted from the third phase shifter 415, thereby combining the two mixed signals thus obtained and outputting the combined signal as I.

Figure 15E:
FIG. 15E is a diagram illustrating a state where each of the first and second synthesis sections 413 and 422 down-converts the desired channel to the baseband bandwidth.

The second synthesis section 422 causes the fourth digital mixer 421 to mix the output of the second channel selecting filter 423 with the channel selecting clock signal, whose phase has been rotated by 0 degrees, outputted from the fourth phase shifter 420, and also causes the third digital mixer to mix the output of the first channel selecting filter 412 with the channel selecting clock signal, whose phase has been rotated by −90 degrees, outputted from the fourth phase shifter 420, thereby combining the two mixed signals thus obtained and outputting the combined signal as Q. FIG. 15E is a diagram illustrating a state where each of the first and second synthesis sections 413 and 422 down-converts the desired channel to the baseband bandwidth.

As described above, according to the third embodiment, since an image frequency is suppressed in a digital section, a precision for suppressing the image frequency is improved. Furthermore, by correcting an amplitude and phase of each of the two signals before being combined, it becomes possible to further improve the image suppression.

(First Variant of the Demodulator According to the Third Embodiment)

Figure 16:
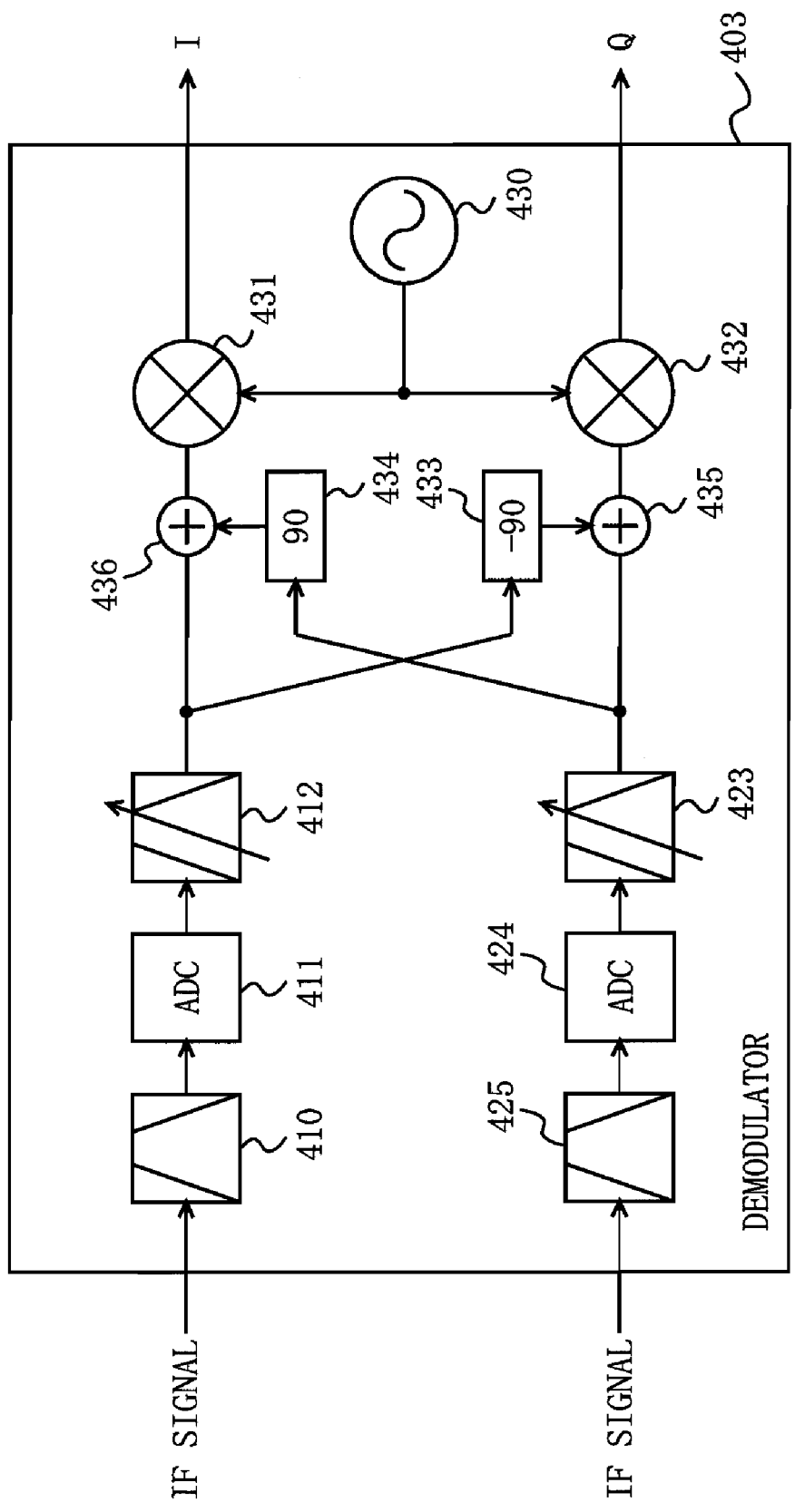
FIG. 16 is a block diagram illustrating a configuration of a first variant of a demodulator 403 according to the third embodiment.

FIG. 16 is a block diagram illustrating a configuration a first variant of the demodulator 403 according to the third embodiment. In FIG. 16, portions having the same functions as those shown in FIG. 15A are denoted by the same reference numerals, and any detailed descriptions thereof will be omitted. In FIG. 16, the demodulator 403 includes the first bandpass filter 410, the first ADC 411, the first channel selecting filter 412, the second bandpass filter 425, the second ADC 424, the second channel selecting filter 423, a channel selecting clock generating section 430, a first digital down-converter 431, a second digital down-converter 432, a third phase shifter 433, a fourth phase shifter 434, a first synthesis section 435, and a second synthesis section 436.

The channel selecting clock generating section 430 generates a channel selecting clock signal for down-converting the desired channel to the baseband bandwidth. The third phase shifter 433 rotates a phase of the output of the first channel selecting filter 412 by −90 degrees. The fourth phase shifter 434 rotates a phase of the output of the second channel selecting filter by 90 degrees. The first synthesis section 435 combines an output of the third phase shifter 433 and the output of the second channel selecting filter 423. The second synthesis section 436 combines an output of the fourth phase shifter 434 and the output of the first channel selecting filter 412. The first digital down-converter 431 down-converts an output of the second synthesis section 436 based on the channel selecting clock signal, thereby outputting the obtained signal as I. The second digital down-converter 432 down-converts an output of the first synthesis section 435 based on the channel selecting clock signal, thereby outputting the obtained signal as Q.

With the configuration shown in FIG. 16, the image frequency is removed in the first and second synthesis sections 435 and 436.

(Second Variant of the Demodulator According to the Third Embodiment)

Figure 17:
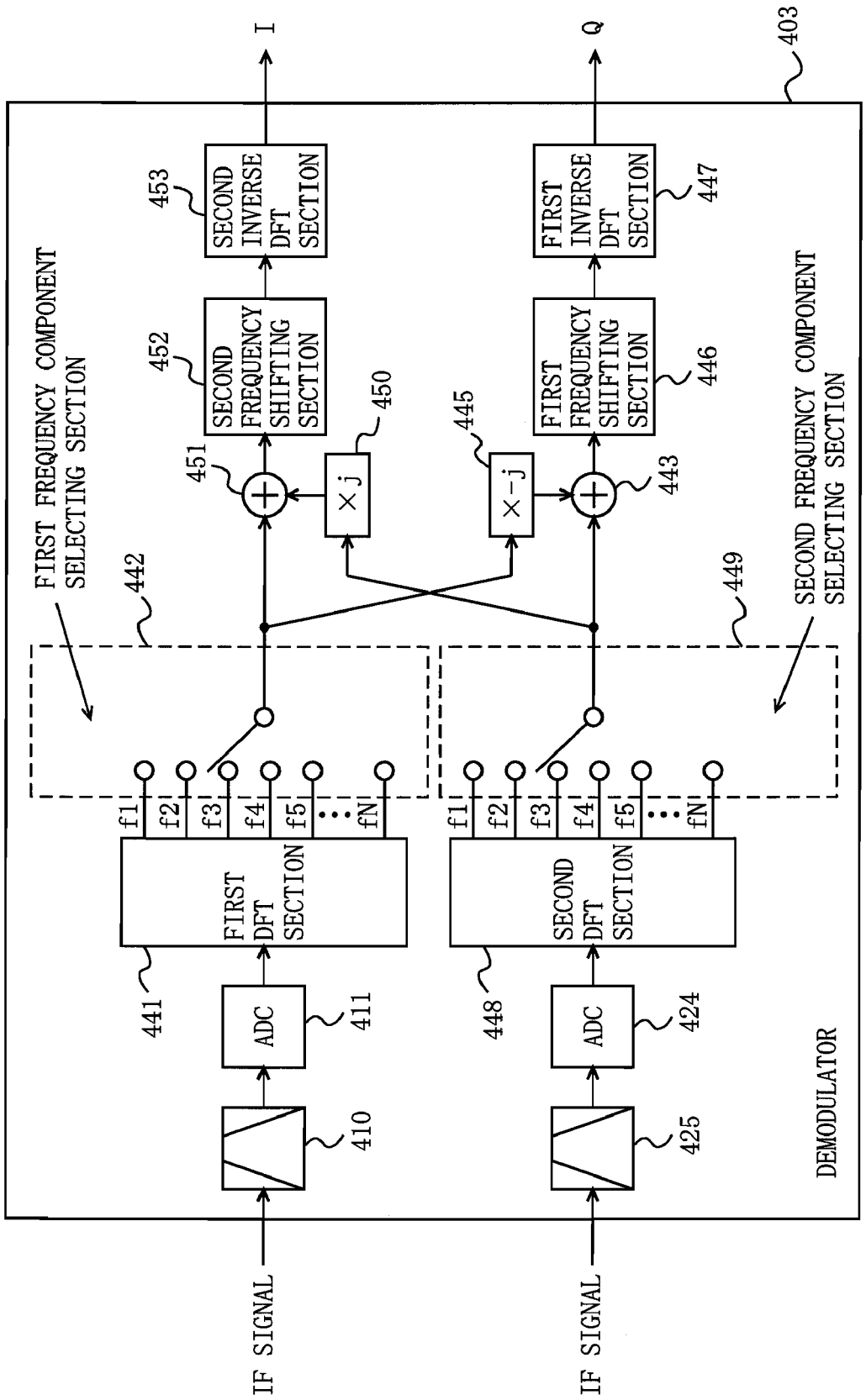
FIG. 17 is a block diagram illustrating a configuration of a second variant of the demodulator 403 according to the third embodiment.

FIG. 17 is a block diagram illustrating a configuration of a second variant of the demodulator 403 according to the third embodiment. In FIG. 17, portions having the same functions as those shown in FIG. 15A are denoted by the same reference numerals, and any detailed descriptions thereof will be omitted. In FIG. 17, the demodulator 403 includes the first bandpass filter 410, the first ADC 411, the second bandpass filter 425, the second ADC 424, a first digital Fourier transform section 441, a first frequency component selecting section 442, a first synthesis section 443, a first multiplication section 445, a first frequency shifting section 446, a first inverse digital Fourier transform section 447, a second digital Fourier transform section 448, a second frequency component selecting section 449, a second synthesis section 451, a second multiplication section 450, a second frequency shifting section 452, and a second inverse digital Fourier transform section 453.

The first digital Fourier transform section 441 performs the digital Fourier conversion on the digital signal obtained by the first ADC 411. The second digital Fourier transform section 448 performs the digital Fourier conversion on the digital signal obtained by the second ADC 424.

The first frequency component selecting section 442 selects at least one frequency component which is necessary for reproducing the desired channel from among a plurality of frequency components obtained by the first digital Fourier transform section.

The first multiplication section multiplies the at least one frequency component selected by the first frequency component selecting section 442 by −j (j is an imaginary number).

The second frequency component selecting section 449 selects at least one frequency component which is necessary for reproducing the desired channel from among a plurality of frequency components obtained by the second digital Fourier transform section 448.

The second multiplication section 450 multiplies the at least one frequency component selected by the second frequency component selecting section 449 by j (j is an imaginary number).

The first synthesis section 443 combines the multiplied result outputted from the first multiplication section 445 and the at least one frequency component selected by the second frequency component selecting section 449.

The second synthesis section 451 combines the multiplied result outputted from the second multiplication section 450 and the at least one frequency component selected by the first frequency component selecting section 442.

The first frequency shifting section 446 shifts the combined result outputted from the first synthesis section 443 to the baseband bandwidth.

The second frequency shifting section 452 shifts the combined result outputted from the second synthesis section 451 to the baseband bandwidth.

The first inverse digital Fourier transform section 447 performs the inverse digital Fourier conversion on the at least one frequency component whose frequency has been shifted by the first frequency shifting section 446, thereby selecting the desired channel.

The second inverse digital Fourier transform section 453 performs the inverse digital Fourier conversion on the at least one frequency component whose frequency has been shifted by the second frequency shifting section 452, thereby selecting the desired channel.

As described above, according to the second variant, the image frequency is removed in the first and second synthesis sections 443 and 451, and thus a demodulator capable of suppressing the image interference can be provided.

Note that the demodulator 403 only needs to have a configuration for removing the image frequency, and therefore is not limited to the aforementioned configuration.

Fourth Embodiment

Figure 18A:
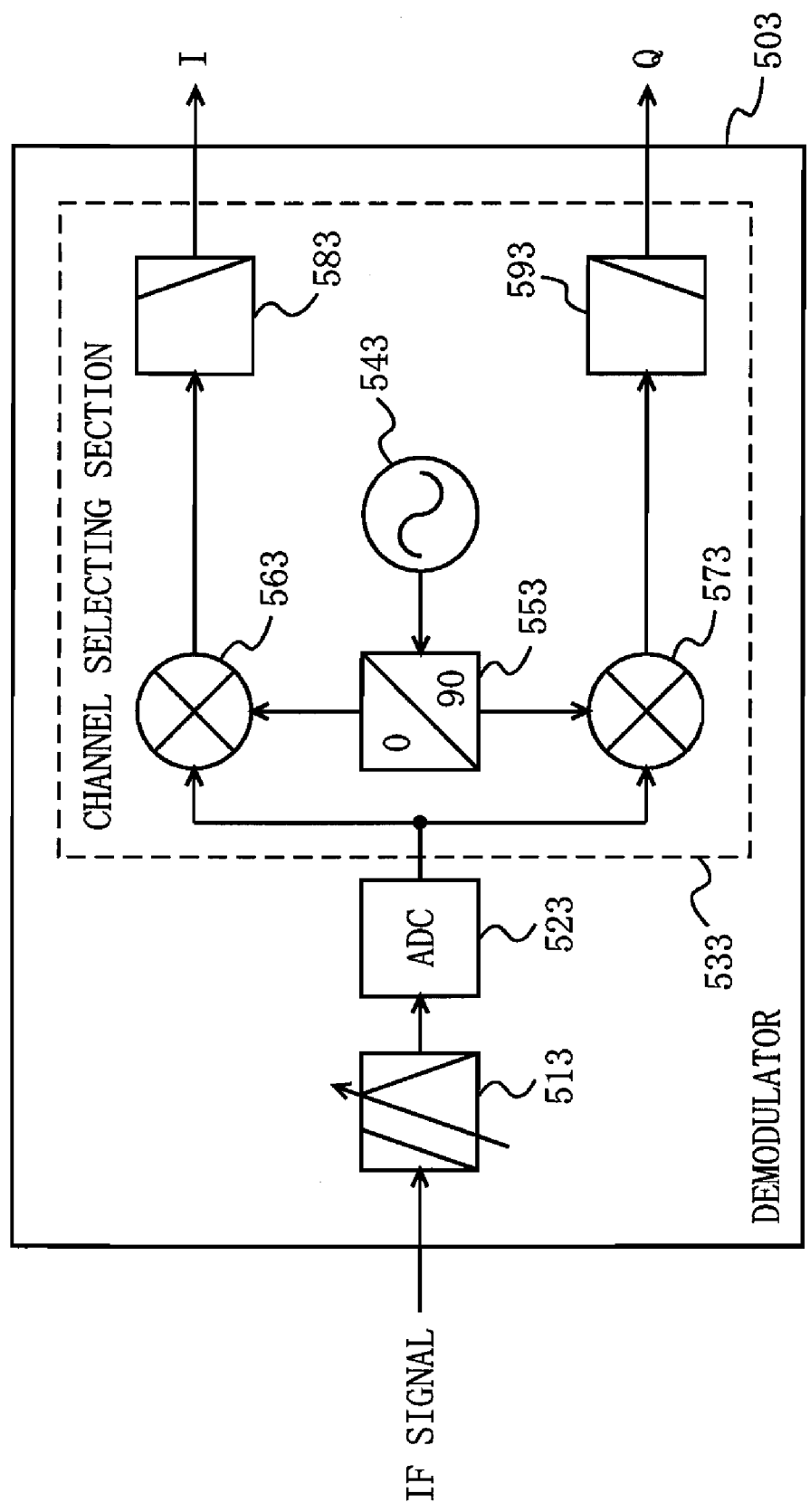
FIG. 18A is a block diagram illustrating a configuration of a demodulator 503 according to a fourth embodiment of the present invention.
Figure 18B:
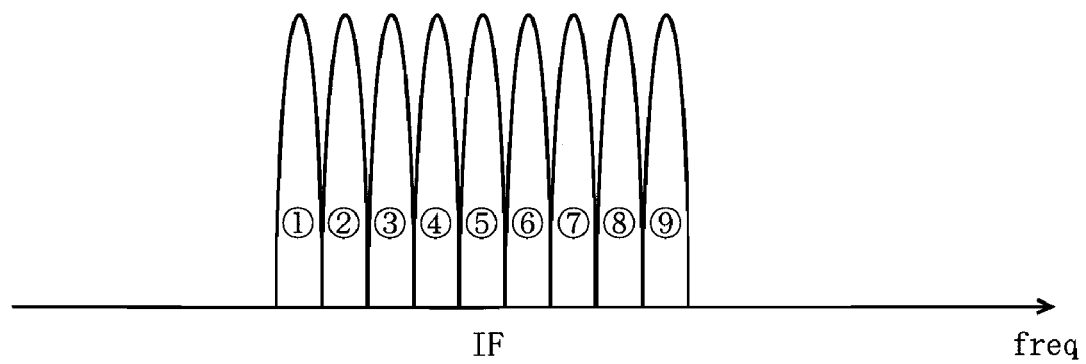
FIG. 18B is a diagram illustrating a frequency spectrum of the IF signal including channels of 1 to 9.

A fourth embodiment is similar to the first embodiment other than a configuration of the demodulator. FIG. 18A is a block diagram illustrating a configuration of a demodulator 503 according to the fourth embodiment of the present invention. In FIG. 18A, the demodulator 503 includes a center frequency variable bandpass filter 513, an ADC 523 and a channel selecting section 533. The channel selecting section 533 has a channel selecting clock generating section 543, a phase shifter 553, a first digital mixer 563, a second digital mixer 573, a first lowpass filter 583, and a second lowpass filter 593. FIG. 18B is a diagram illustrating a frequency spectrum of the IF signal including channels of 1 to 9.

Figure 18C:
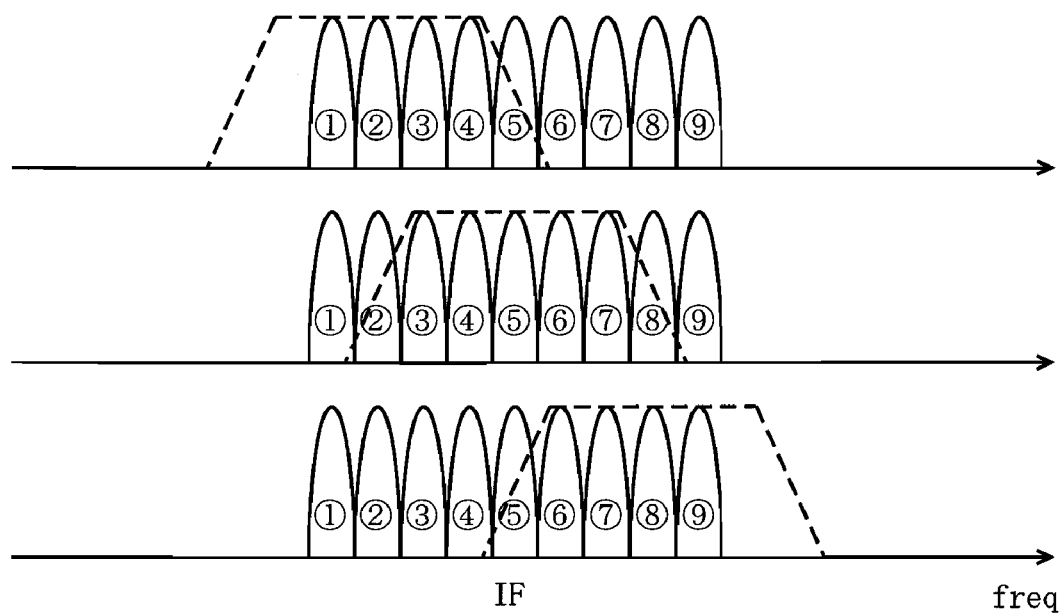
FIG. 18C is a diagram illustrating a state where a center frequency of a passing band is changed when the desired channel is changed.

The center frequency variable bandpass filter 513 is a filter in which a passing bandwidth is larger than a bandwidth of one channel and is smaller than a bandwidth of one band of the RF signal, and a center frequency of the passing bandwidth is variable. If the desired channel is changed, the center frequency variable bandpass filter 513 changes the center frequency of the passing bandwidth accordingly. FIG. 18C is a diagram illustrating a state where the center frequency of the passing bandwidth is changed when the desired channel is changed.

Based on the sampling clock signal having the sampling frequency equivalent to an integral multiple of the symbol rate, the ADC 523 converts an IF signal which has been passed through the center frequency variable bandpass filter into a digital signal.

Figure 18D:
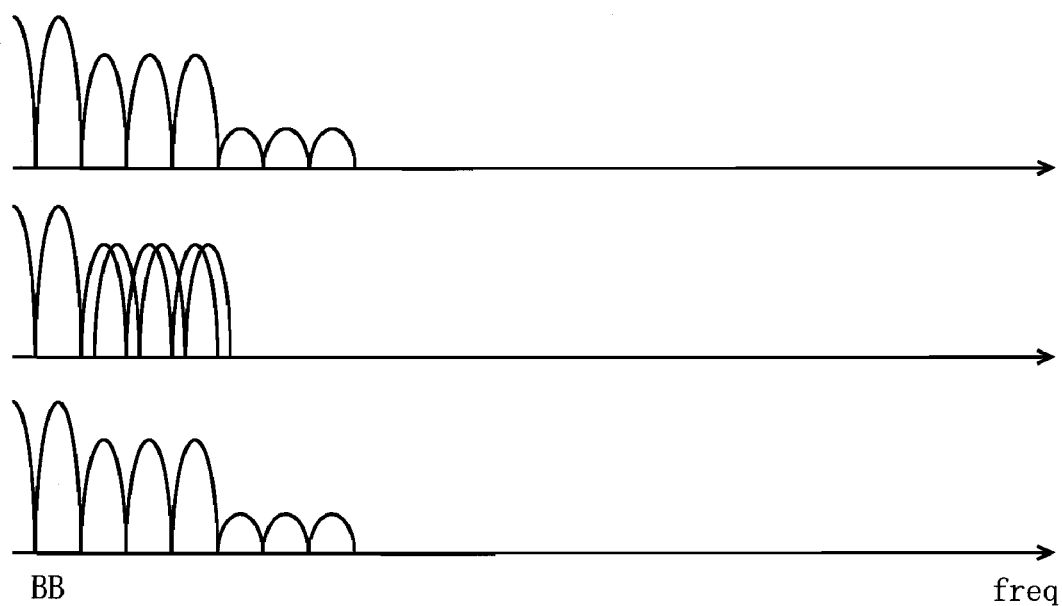
FIG. 18D is a diagram illustrating a state where a channel selecting section down-converts the desired channel to the baseband bandwidth.
Figure 18E:
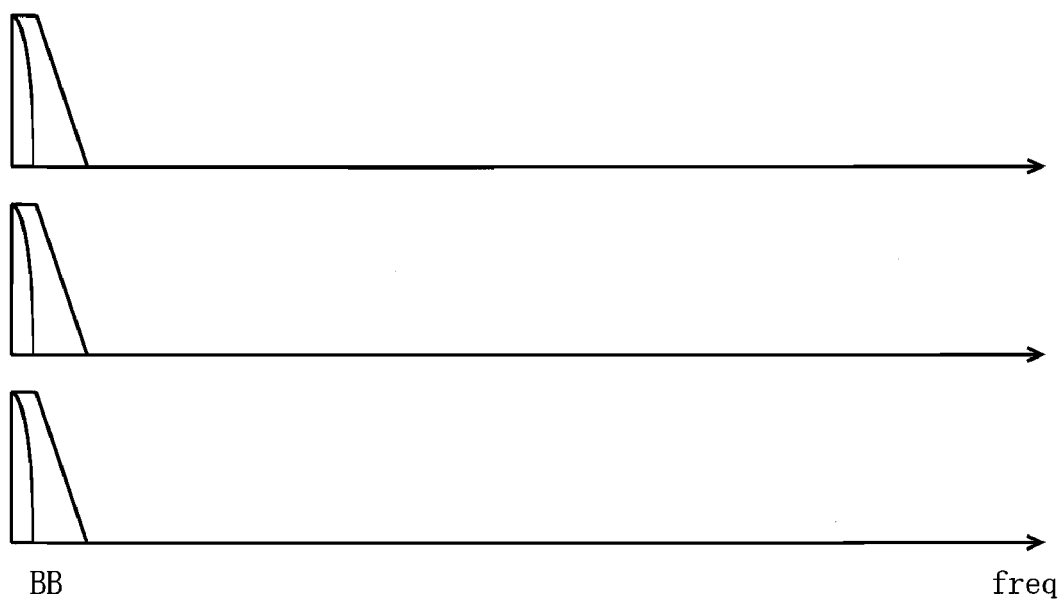
FIG. 18E is a diagram illustrating a state where the channel selecting section extracts the desired channel.

The channel selecting section 533 selects a desired channel included in the digital signal obtained by the ADC 523. FIG. 18D is a diagram illustrating a state where the channel selecting section down-converts the desired channel to the baseband bandwidth. FIG. 18E is a diagram illustrating a state where the channel selecting section extracts the desired channel. A configuration of the channel selecting section 533 is similar to that of the first embodiment as shown in FIG. 7A, and therefore a detailed operational description thereof will be omitted.

As described above, by using the center frequency variable bandpass filter 513, a level of an interference wave inputted to the ADC 523 can be reduced by the center frequency variable bandpass filter 513. Therefore, a dynamic range of the ADC 523 is reduced, and thus a low electric power consumption can be realized. Furthermore, unlike an IF filter, included in a conventional reception circuit device, which passes only the desired channel, an allowable range of a variation of the center frequency is larger, thereby making it possible to simplify an adjustment circuit for adjusting the center frequency of the filter.

Figure 19:
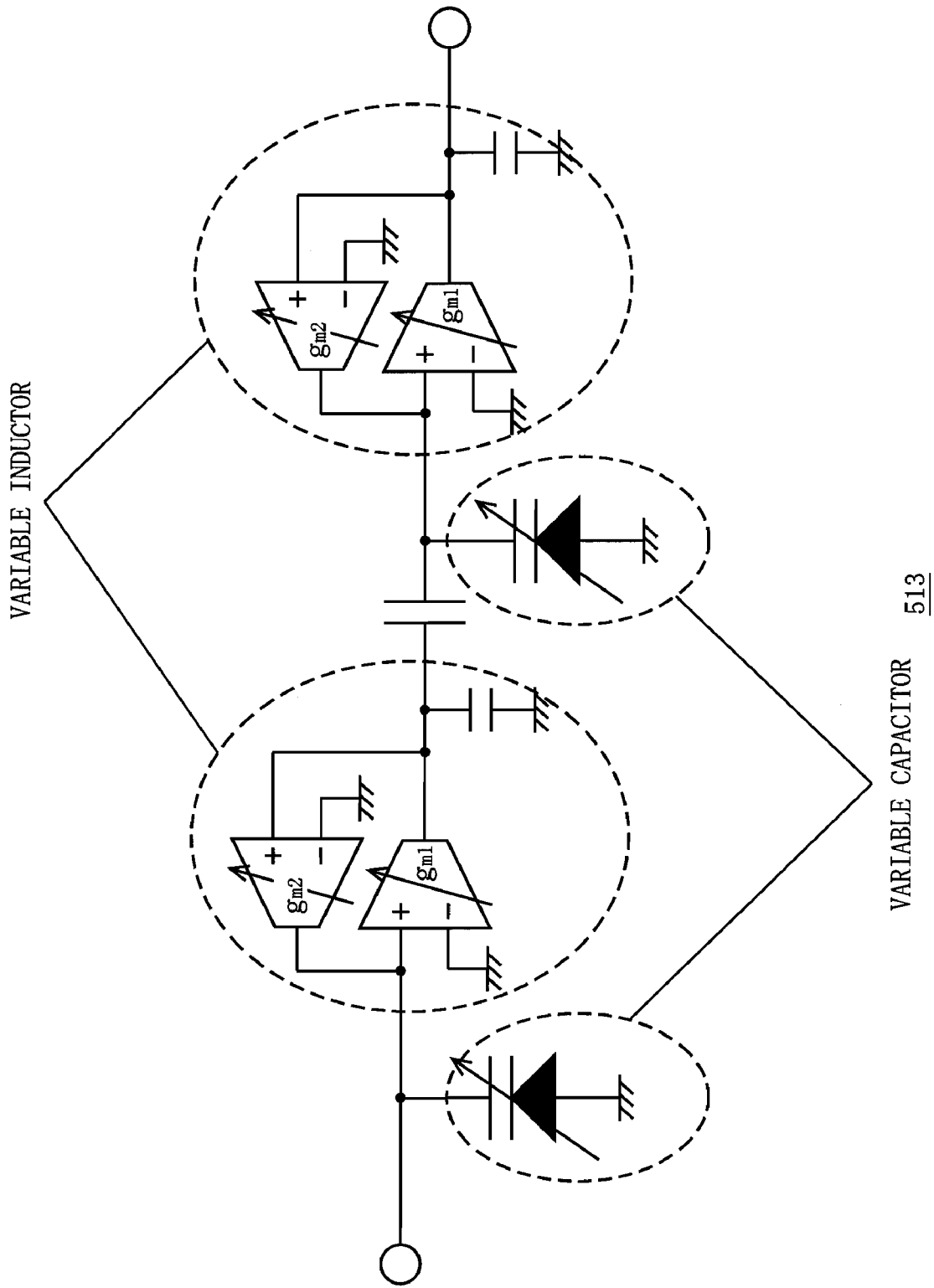
FIG. 19 is a diagram illustrating an exemplary configuration of a center frequency variable bandpass filter 513.

FIG. 19 is a diagram illustrating an exemplary configuration of the center frequency variable bandpass filter 513. As shown in FIG. 19, the center frequency variable bandpass filter 513 is a parallel resonator in which a variable capacitor and a variable inductor are connected in parallel to each other. The variable capacitor is composed of varactor diodes. The variable inductor is composed of operation amplifiers. A capacity value of each of the varactor diodes and a current value of each of the operation amplifiers are changed, thereby making it possible to control the center frequency of the center frequency variable bandpass filter 513.

Figure 20:
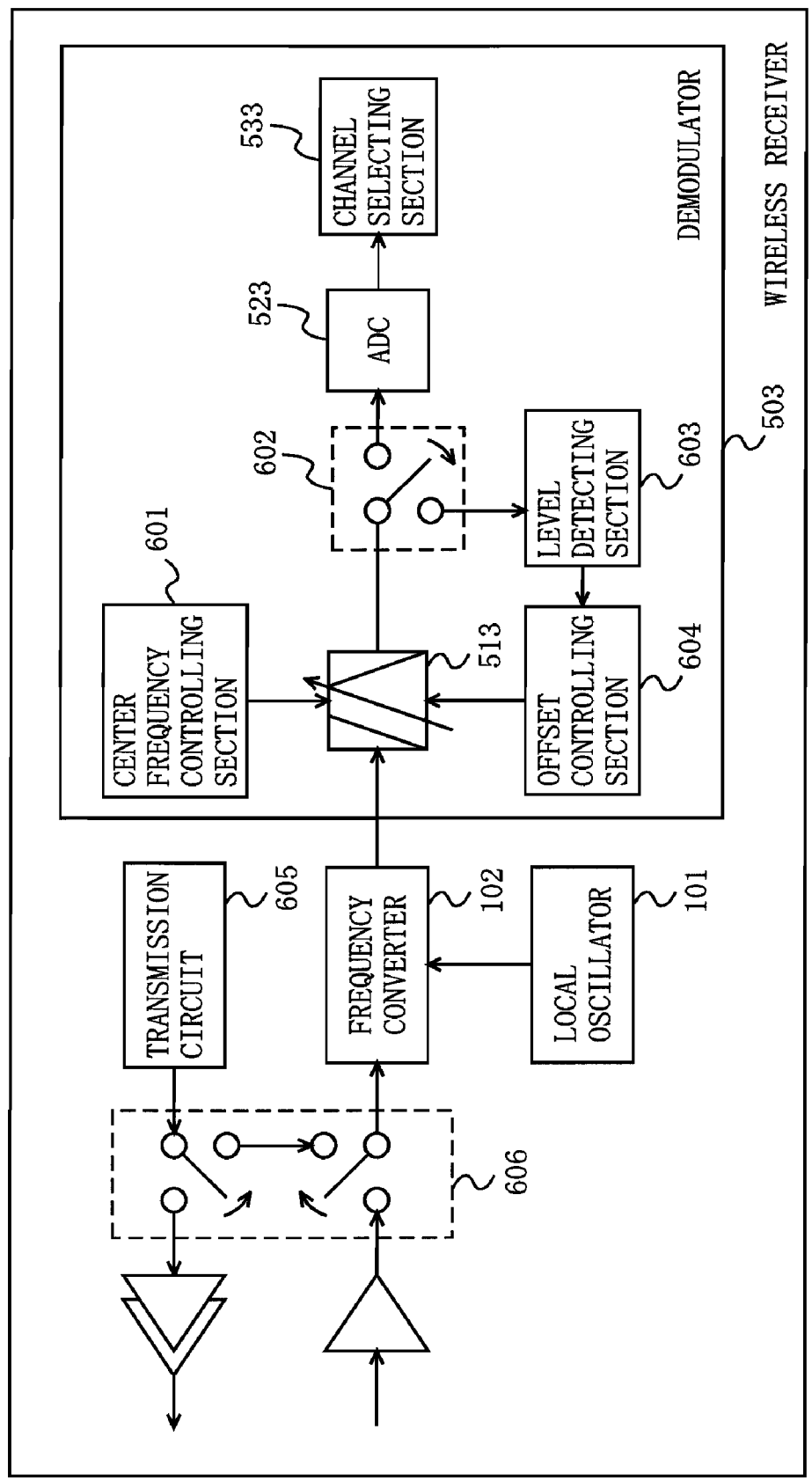
FIG. 20 is a diagram illustrating a configuration for adjusting the center frequency of the center frequency variable bandpass filter 513.

FIG. 20 is a diagram illustrating a configuration for adjusting the center frequency of the center frequency variable bandpass filter 513. The demodulator 503 further includes a center frequency controlling section 601, a switch circuit 602, a level detecting section 603, and an offset controlling section 604.

The center frequency controlling section 601 controls the center frequency of the center frequency variable bandpass filter 513 in accordance with the desired channel. The switch circuit 602 performs switching such that an output of the center frequency variable bandpass filter 513 is inputted to the level detecting section 603 at a predetermined timing. The level detecting section 603 detects an electric power level of an output signal of the center frequency variable bandpass filter 513.

The offset controlling section 604 performs a calibration of an offset of the center frequency of the center frequency variable bandpass filter 513 by using several IF signals. As a method of performing the calibration, for example, when no transmission is performed, a wireless receiver inputs an IF signal from the transmission circuit 605 to the frequency converter 102 via the switch circuit 606 so as to generate the IF signal, and controls the offset such that detected electric power of the level detecting section 603 is to be maximum. Other than when performing an initial calibration, the offset controlling section 604 controls the offset of the center frequency variable bandpass filter 513 based on a detection result outputted from the level detecting section 603. The offset controlling section 604 controls the offset such that the level of the output signal outputted from the center frequency variable bandpass filter 513 is to be maximum.

As described above, even if the center frequency is shifted due to an effect of fixed parasitic elements or the like, it becomes possible to correct (calibrate) a deviation of the center frequency by controlling the offset.

(Variant of the Center Frequency Controlling Section According to the Fourth Embodiment)

Figure 21A:
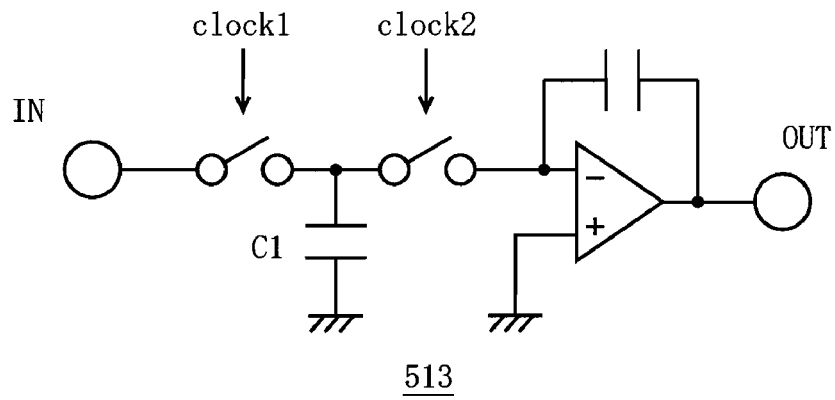
FIG. 21A is a circuit diagram illustrating a variant of the center frequency variable bandpass filter 513 according to the fourth embodiment.

FIG. 21A is a circuit diagram illustrating a variant of the center frequency variable bandpass filter 513 according to the fourth embodiment. As shown in FIG. 21A, the center frequency variable bandpass filter 513 is a switched capacitor circuit having at least two switching elements and at least one capacitor. The center frequency variable bandpass filter 513 can change the center frequency by changing a switching cycle of one of the at least two switching elements.

Figure 21B:
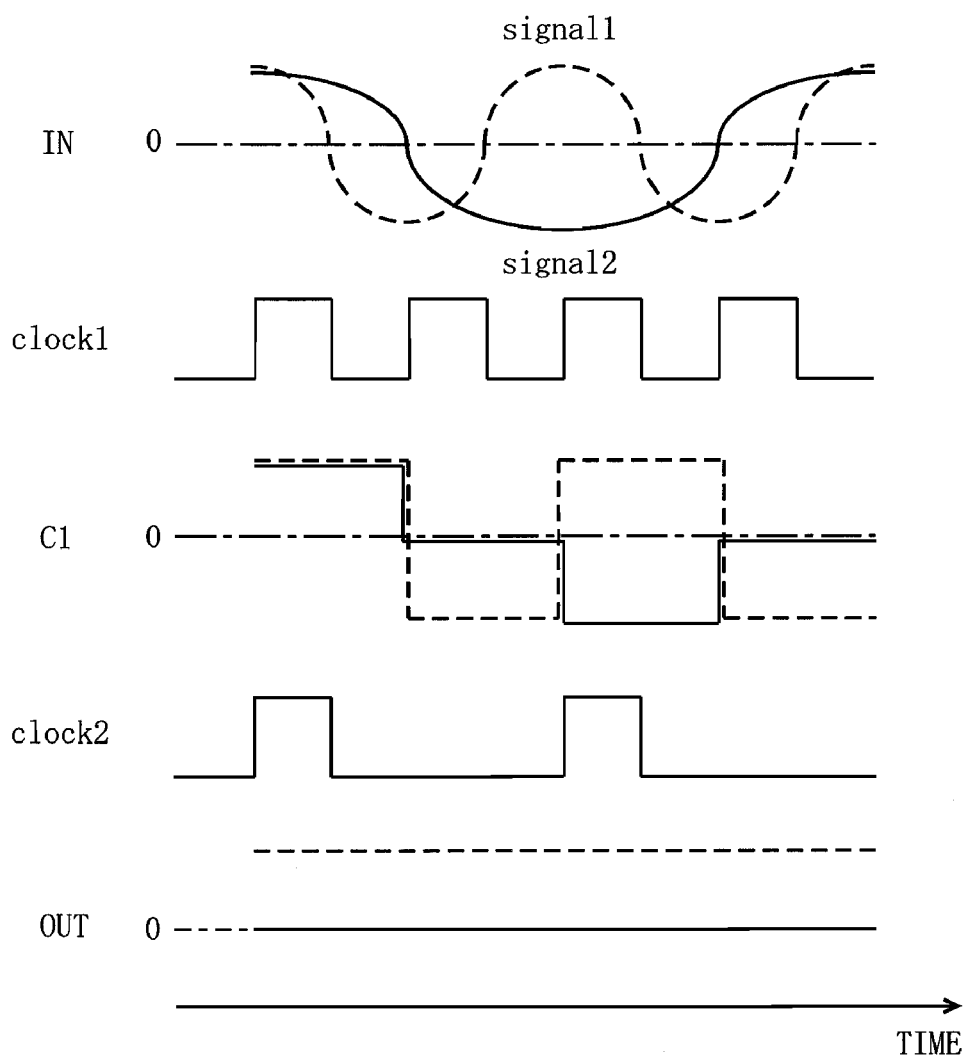
FIG. 21B is a diagram illustrating temporal variations in signals of a main portion shown in FIG. 21A.

FIG. 21B is a diagram illustrating temporal variations in signals of a main portion shown in FIG. 21A. As shown in FIG. 21B, it is assumed that two signals, a signal 1 (shown by a dotted line) and a signal 2 (shown by a solid line), having frequencies different from each other, are inputted to an input terminal IN. When a signal having the same frequency as the signal 1 is inputted, the signal representing the signal 1 appears at an output terminal OUT. On the other hand, when a signal having the same frequency as the signal 2 is inputted, no signal appears at the output terminal OUT. By changing a frequency of a clock 2, a passing frequency is accordingly changed.

With the aforementioned configuration, the center frequency variable bandpass filter 513 can be realized as a discrete-time analog tunable filter. The center frequency variable bandpass filter 513 is mainly composed of switches and capacitors, thereby making it possible to realize a filter which is less likely to be affected by a nonlinear element.

Fifth Embodiment

In the first embodiment, the sampling frequency fs is more than twice the frequency of the IF signal. In a fifth embodiment, a demodulator in which the sampling frequency fs is less than twice the frequency of the IF signal is proposed. Similarly to the first embodiment, the sampling frequency fs is equivalent to an integral multiple of the symbol rate.

Figure 22A:
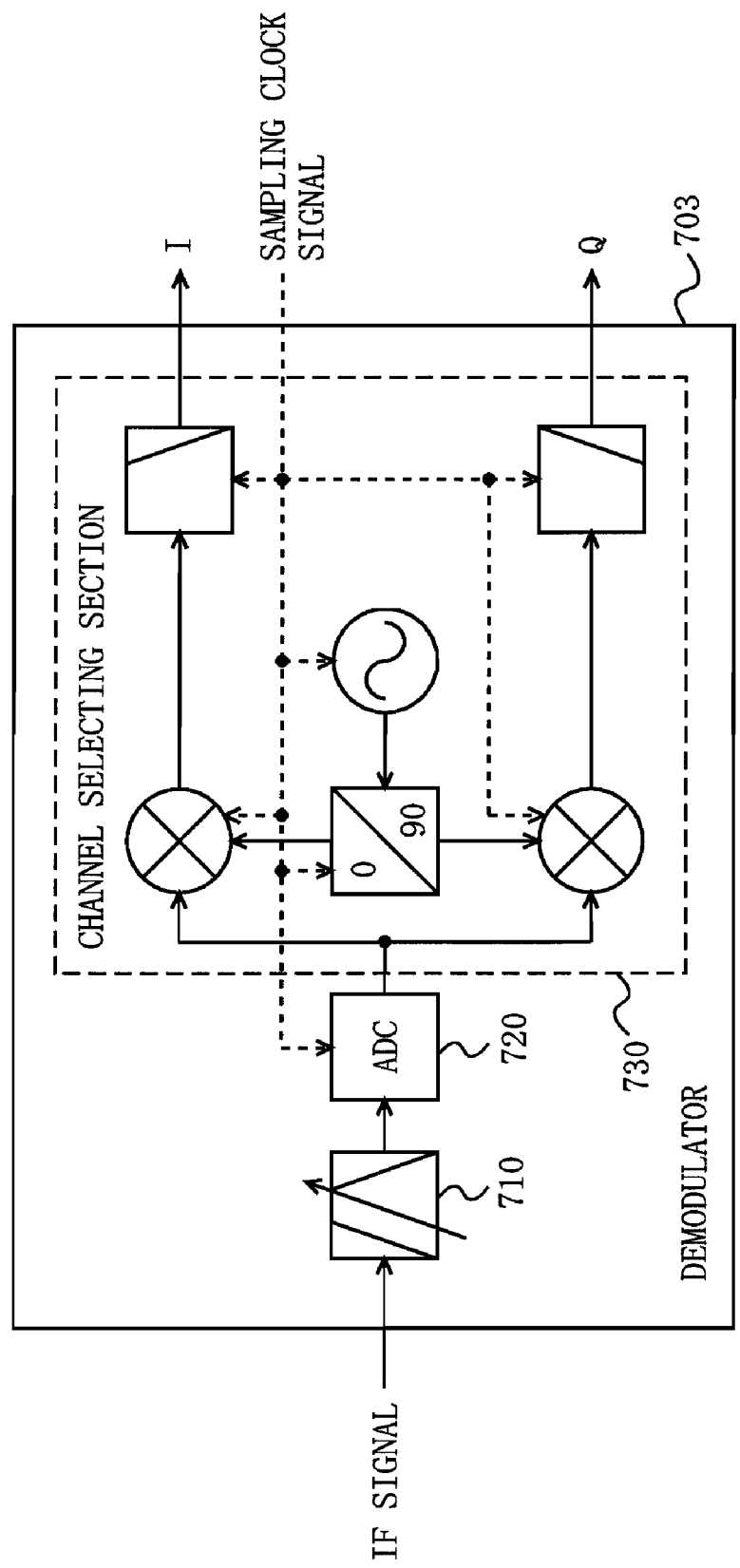
FIG. 22A is a block diagram illustrating a configuration of a demodulator 703 according to a fifth embodiment of the present invention.

FIG. 22A is a block diagram illustrating a configuration of a demodulator 703 according to the fifth embodiment of the present invention. Other than the demodulator 703, a wireless receiver according to the fifth embodiment has a configuration similar to that of the first embodiment. In FIG. 22A, the demodulator 703 includes a bandpass filter 710, an ADC 720 and a channel selecting section 730. A configuration of the channel selecting section 730 is similar to that of the channel selecting section 170 of the first embodiment.

The ADC 720 converts an inputted IF signal to a digital signal, returning all channels thereof to a range of 0 to fs/2 Hz. Therefore, the local oscillator 101 selects the local oscillatory frequency such that all the channels included in the IF signal down-converted by the frequency converter 102 are within a range between a frequency greater than or equal to N×fs/2 and a frequency smaller than or equal to (N+1)×fs/2. As described above, when selecting an appropriate local oscillatory frequency for undersampling, the ADC 720 can covert the inputted IF signal to the digital signal, returning all the channels thereof to the range of 0 to fs/2 Hz.

Figure 22B:
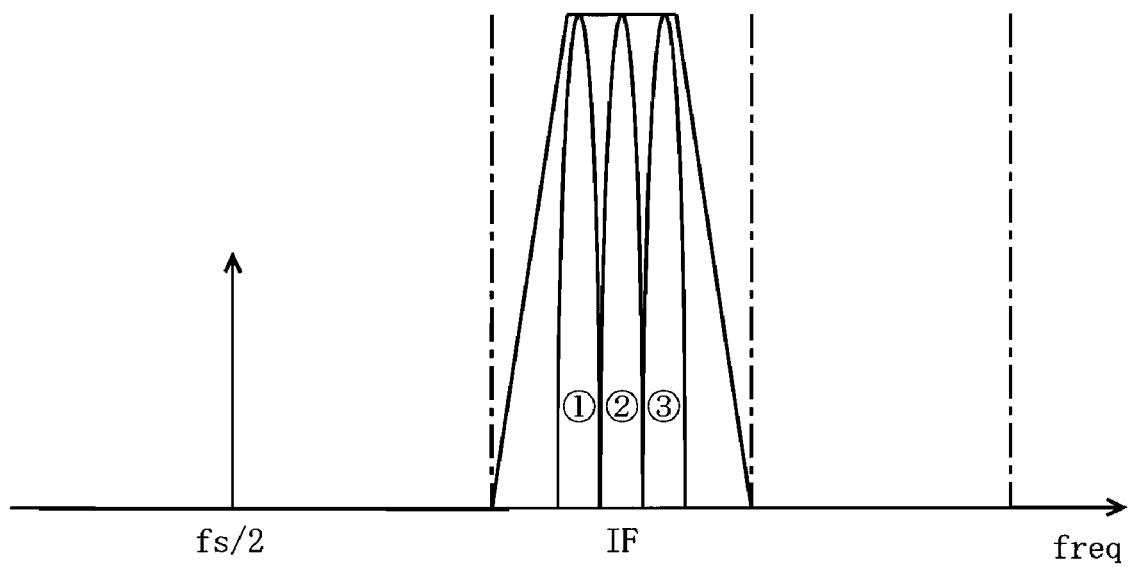
FIG. 22B is a diagram illustrating a passing characteristic of a bandpass filter 710.

FIG. 22B is a diagram illustrating a passing characteristic of the bandpass filter 710. The bandpass filter 710 has the passing characteristic which can significantly reduce a frequency bandwidth less than N fs/2 and more than (N+1)×fs/2.

Figure 22C:
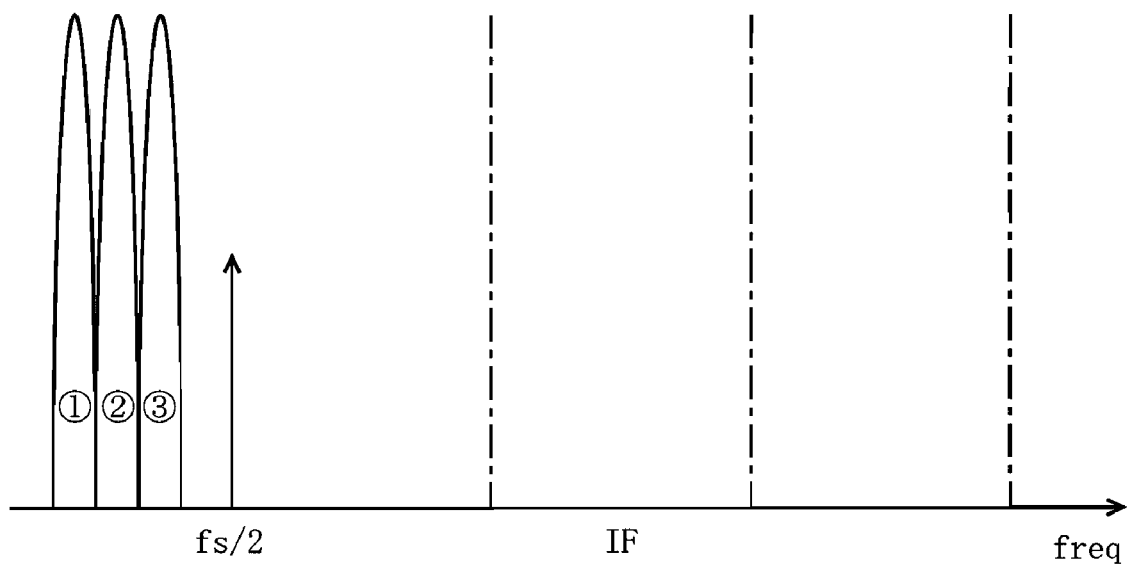
FIG. 22C is a diagram illustrating a spectrum of a digital signal outputted from an ADC 720.
Figure 22D:
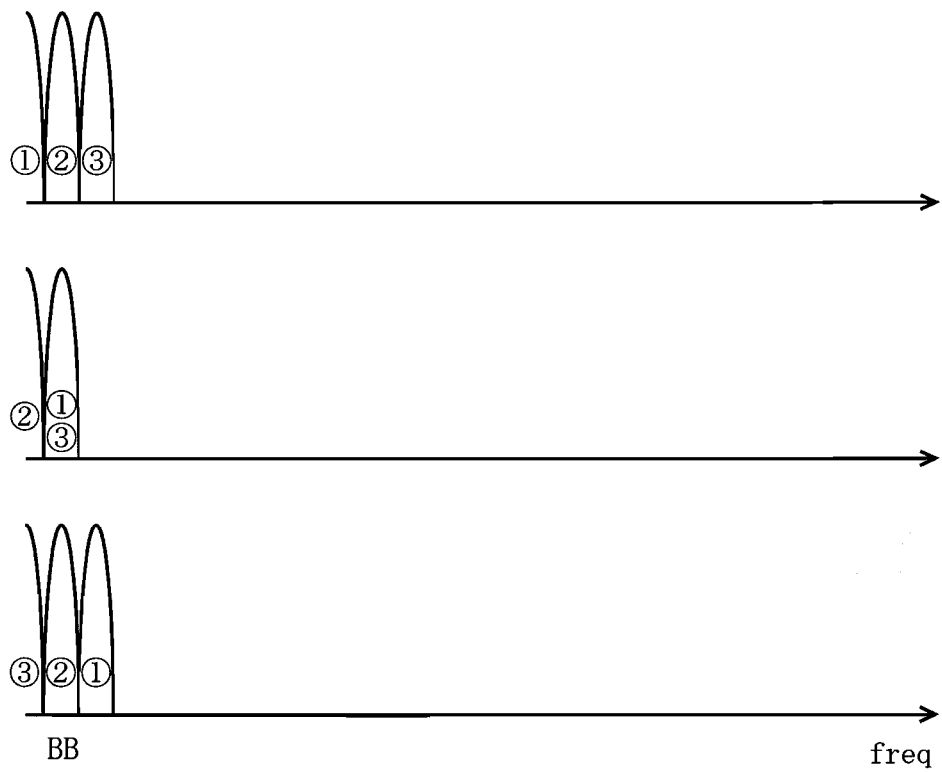
FIG. 22D is a diagram illustrating a state where a channel selecting section 730 down-converts the desired channel to the baseband bandwidth.
Figure 22E:
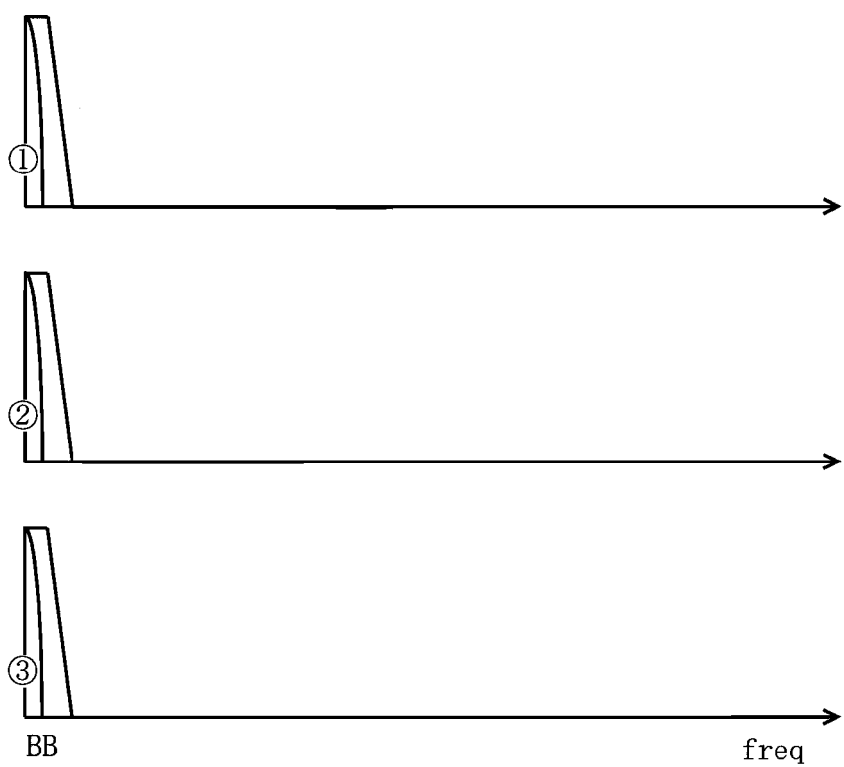
FIG. 22E is a diagram illustrating a state where the channel selecting section 730 passes the desired channel therethrough.

FIG. 22C is a diagram illustrating a spectrum of the digital signal outputted from the ADC 720. As shown in FIG. 22C, the digital signal outputted from the ADC 720 has been down-converted so as to have a frequency band of 0 to fs/2 Hz. Therefore, in the channel selecting section, a clock frequency for down-converting the digital signal so as to have the baseband bandwidth can be reduced. FIG. 22D is a diagram illustrating a state where the channel selecting section 730 down-converts the desired channel to the baseband bandwidth. FIG. 22E is a diagram illustrating a state where the channel selecting section 730 passes the desired channel therethrough.

As described above, according to the fifth embodiment, it is possible to reduce the clock frequency for down-converting the digital signal so as to have the baseband bandwidth, thereby realizing the low electric power consumption.

Sixth Embodiment

Figure 23A:
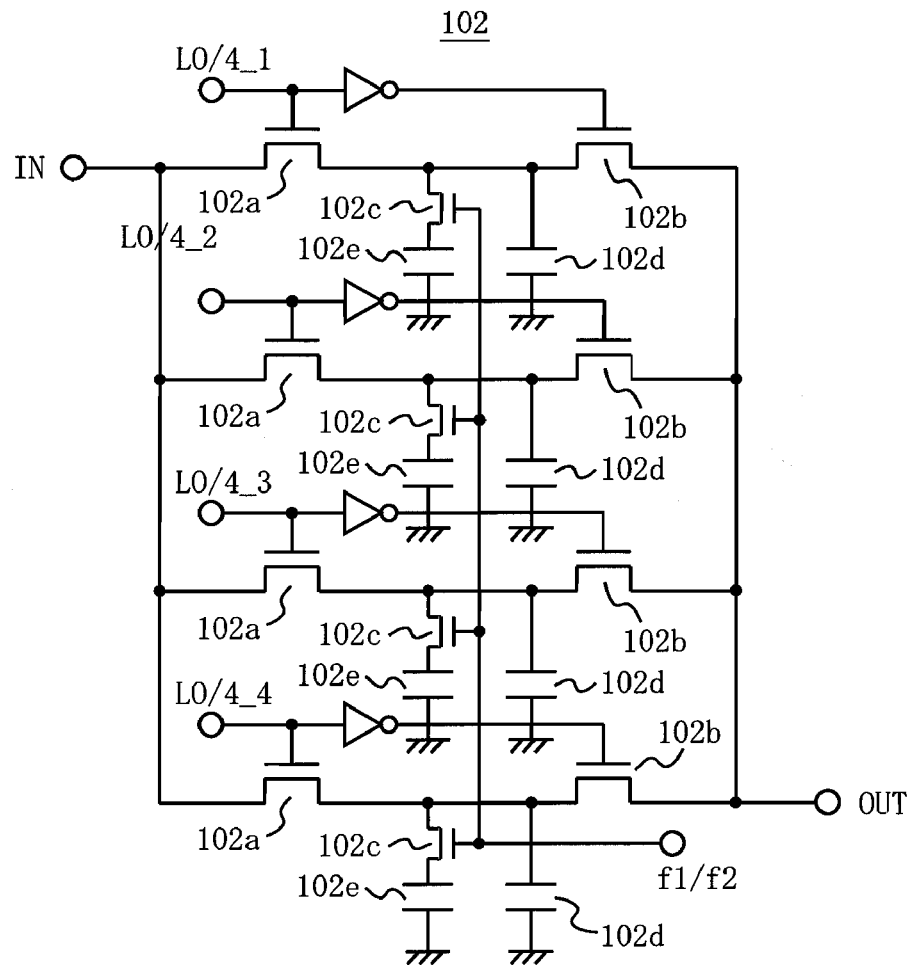
FIG. 23A is a circuit diagram illustrating a configuration of the frequency converter 102 according to a sixth embodiment of the present invention.
Figure 23B:
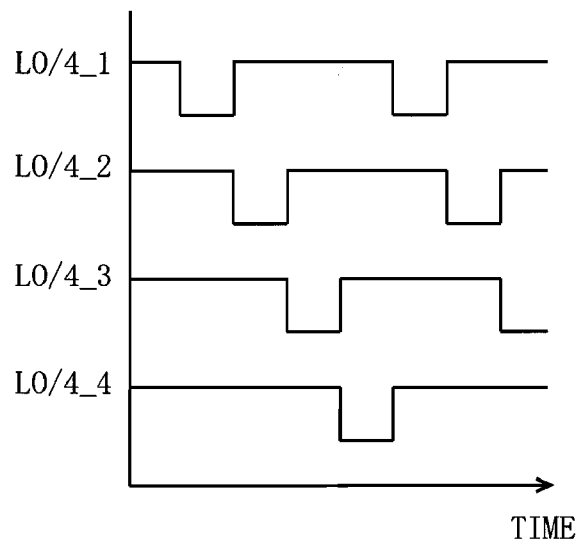
FIG. 23B is a diagram illustrating clocks inputted to terminals LO/4_1 to LO/4_4 as shown in FIG. 23A.

FIG. 23A is a circuit diagram illustrating a configuration of the frequency converter 102 according to a sixth embodiment of the present invention. FIG. 23B is a diagram illustrating clocks inputted to terminals LO/4_1 to LO/4_4 as shown in FIG. 23A.

The frequency converter 102 includes four circuits, each having a first switch 102a, a second switch 102b, a third switch 102c, a first capacitor 102d and a second capacitor 102e. The plurality of third switches 102c are connected so as to be simultaneously turned on and off. The RF signal is inputted to the first switch 102a from an input terminal IN. An output signal of the first switch 102a is inputted to the second switch 102b. An output signal of the second switch 102b is inputted to the demodulator. The first capacitor 102d is inserted between a GND and a connection point of the first switch 102a and the second switch 102b. The second capacitor 102e and the third switch 102c are inserted in series between the GND and the connection point of the first switch 102a and the second switch 102b. As shown in FIG. 23B, the first switch 102a is turned on and off in accordance with a frequency of the output signal of the local oscillator 101. With a NOT circuit, the second switch 102b is turned off when the first switch is on, and is turned on when the first switch is off. The third switch 102c is turned on and off in accordance with a frequency band of the radio frequency signal.

The wireless receiver acceding to the present invention must be applicable to a multi-band application. Therefore, a wide bandwidth characteristic is also required for the frequency converter 102. In the frequency converter 102 shown in FIG. 10A, a capacity value for holding a charge is fixed. However, a capacity value to be held is determined to be an appropriate value in accordance with a frequency. Thus, the frequency converter 102 shown in FIG. 23A can change the capacity value to be held by simultaneously turning the plurality of third switches 102c on and off in accordance with a band to be used, f1 (800 MHz, for example) or f2 (2 GHz, for example). In the case of f1 having a low frequency, the plurality of third switches 102c are turned on in order to increase the capacity value. In the case of f2 having a high frequency, the plurality of third switches 102c are turned off in order to decrease the capacity value. With such a configuration, the capacity value to be held can be changed in accordance with the band to be used, thereby realizing the frequency converting circuit 102 which can use a wide bandwidth.

Note that in the sixth embodiment, two bands are provided to be switched between each other. However, three or more bands may be provided. In this case, the circuit has a configuration in which the number of switches are increased so as to correspond to the number of bands.

Seventh Embodiment

Figure 24A:
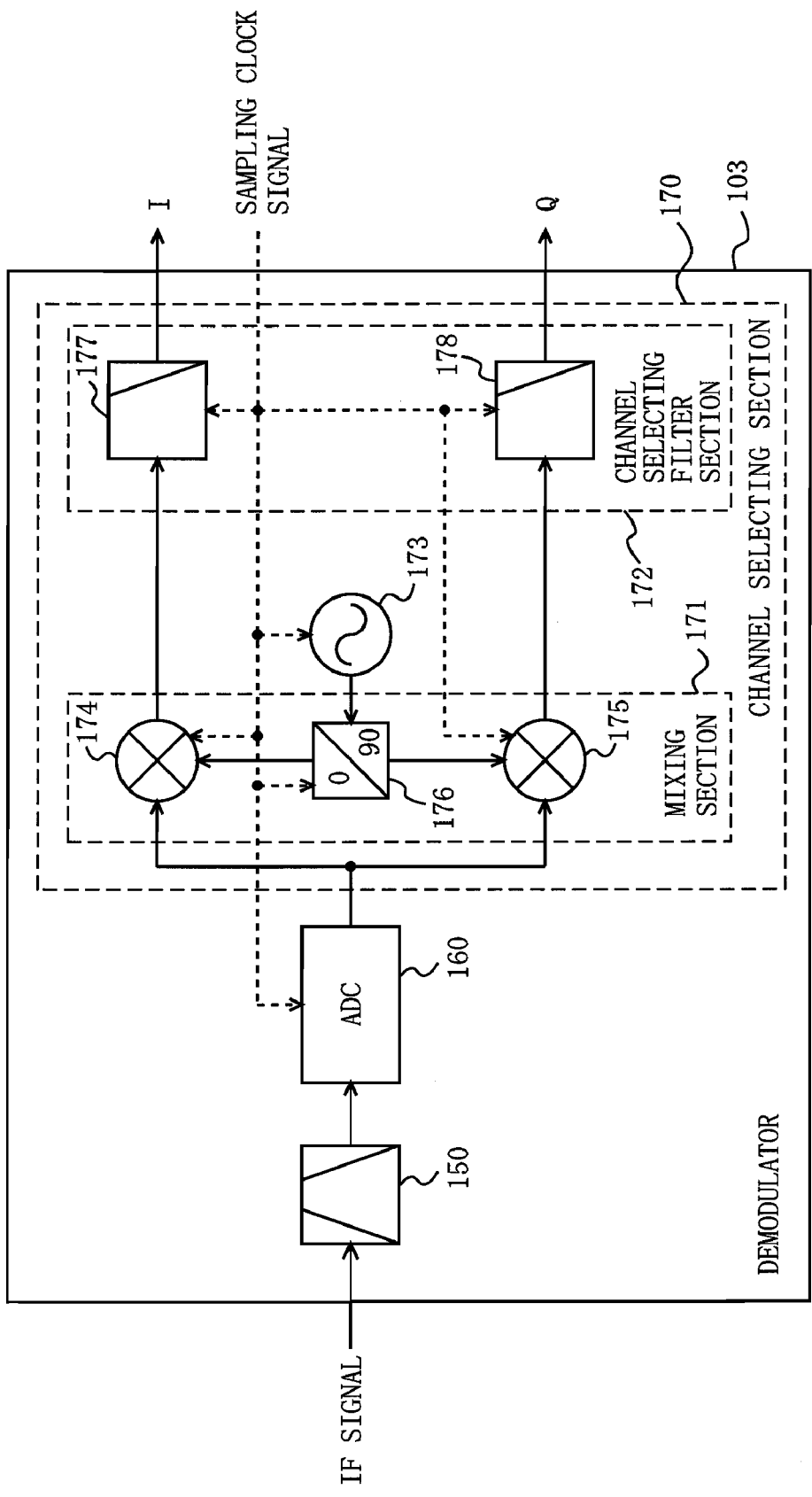
FIG. 24A is a block diagram illustrating a configuration of the demodulator 103 according to a seventh embodiment of the present invention.
Figure 24B:
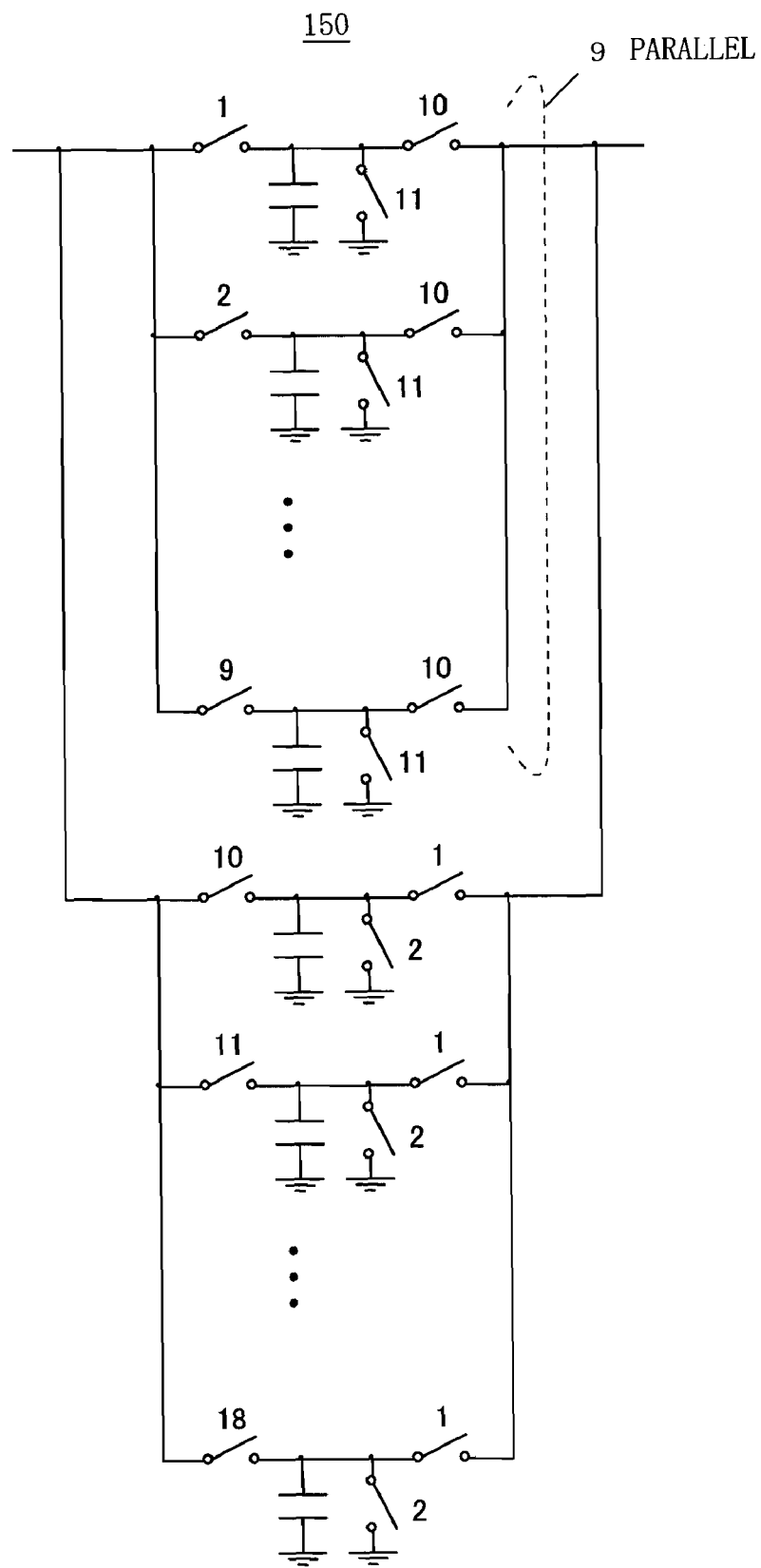
FIG. 24B is a circuit diagram illustrating a configuration of the bandpass filter 150 shown in FIG. 24A.

FIG. 24A is a block diagram illustrating a configuration of the demodulator 103 according to a seventh embodiment of the present invention. In FIG. 24A, the demodulator 103 according to the seventh embodiment has a characteristic of a configuration of the bandpass filter 150. FIG. 24B is a circuit diagram illustrating the configuration of the bandpass filter 150 shown in FIG. 24A. In FIG. 24B, the bandpass filter 150 is a discrete-time filter in which the plurality of switched capacitors are connected in parallel to each other. In FIG. 24B, nine switched capacitors are connected in parallel to each other.

FIG. 25 is a diagram illustrating a frequency response of the bandpass filter 150. In FIG. 25, the horizontal axis represents a frequency, $f_{clock}$ represents a frequency for turning the bandpass filter 150 on and off, and $f_{sampling}$ represents a sampling frequency of the ADC 160. A relationship represented by (formula 1) is satisfied between $f_{sampling}$ and $f_{clock}$. As shown in FIG. 25, the bandpass filter 150 turns each of the switches on and off sequentially from a switch 1, thereby suppressing a frequency to be returned, due to aliasing, from the subsequent ADC 160 to the same frequency as that of the desired IF signal.

$$f_{sampling} = \frac{1}{2} \cdot f_{clock} \qquad \text{(formula 1)}$$

Note that the configuration of the bandpass filter 150 is not limited to the nine switched capacitors connected in parallel to each other. The bandpass filter 150 may be configured so as to pass an IF signal corresponding to a desired band to be received, thereby suppressing a frequency to be returned, due to aliasing, to the same frequency as that of the desired IF signal.

As described above, according to the seventh embodiment, the discrete-time filter which is designed in an optimum manner is used as the bandpass filter 150, thereby making it possible to effectively suppress the frequency to be returned, due to aliasing, to the same frequency as that of the desired IF signal.

INDUSTRIAL APPLICABILITY

A wireless receiver of the present invention is applicable to a mobile terminal, more particularly to a multi-mode or multi-band mobile terminal and the like.

The invention claimed is:
1. A wireless receiver which converts a received radio frequency signal into an intermediate frequency signal and demodulates the intermediate frequency signal, comprising:
a local oscillator for discontinuously changing a band of a local oscillation signal corresponding to a frequency band of the radio frequency signal to be received in accordance with the frequency band, and outputting the local oscillation signal;
a frequency converter for converting the radio frequency signal into the intermediate frequency signal by using the local oscillation signal outputted from the local oscillator, and outputting the intermediate frequency signal; and
a demodulator for demodulating the intermediate frequency signal outputted from the frequency converter, wherein
the local oscillator detects a frequency variation range of the local oscillation signal within the frequency band, obtains a frequency equivalent to an integral multiple of a symbol rate from the frequency variation range, and outputs the local oscillation signal having a local oscillatory frequency, causing a center frequency of a channel to be received, which channel is included in the intermediate frequency signal, to be equivalent to an integral multiple of the symbol rate.

2. The wireless receiver according to claim 1, wherein the local oscillator includes:
a PLL (Phase Locked Loop) circuit for locking a signal outputted from a voltage controlled oscillator having a band switching function as the local oscillation signal;
a frequency controlling section for sweeping the signal outputted from the voltage controlled oscillator when the band of the local oscillation signal is changed;
a detection section for detecting the frequency variation range based on a result of sweeping performed by the frequency controlling section; and
a determination section for determining the frequency, equivalent to an integral multiple of the symbol rate, which is included in the frequency variation range detected by the detection section, wherein
the frequency controlling section controls the local oscillatory frequency of the local oscillation signal outputted from the PLL circuit based on the frequency, equivalent to an integral multiple of the symbol rate, which is determined by the determination section.

3. The wireless receiver according to claim 2, wherein
the frequency controlling section controls the local oscillatory frequency by controlling a dividing number of a variable divider included in the PLL circuit, and
the detection section detects the frequency variation range based on a voltage of a charge pump included in the PLL circuit.

4. The wireless receiver according to claim 2, wherein the voltage controlled oscillator includes:
a switch circuit for changing the band of the local oscillation signal by changing a connection number of capacitors; and
a variable capacitor circuit having a varactor diode for changing a frequency of the local oscillation signal within the frequency variation range.

5. The wireless receiver according to claim 2, wherein the voltage controlled oscillator includes:
a first switch circuit for changing the band of the local oscillation signal by changing a connection number of capacitors; and
a second switch circuit for changing a frequency of the local oscillation signal within the frequency variation range by changing the connection number of the capacitors.

6. The wireless receiver according to claim 1, wherein the demodulator includes:
a bandpass filter for passing the intermediate frequency signal corresponding to a band to be received;
an ADC for converting the intermediate frequency signal, which has been passed through the bandpass filter, into a digital signal based on a sampling clock signal having a sampling frequency equivalent to an integral multiple of the symbol rate; and
a channel selecting section for selecting a desired channel included in the digital signal obtained by the ADC.

7. The wireless receiver according to claim 6, wherein the channel selecting section includes:
a clock generating section for generating a channel selecting clock signal for down-converting the desired channel, included in the digital signal outputted from the ADC, to a baseband bandwidth;
a mixing section for mixing the channel selecting clock signal generated by the clock generating section with the digital signal obtained by the ADC so as to down-convert the desired channel to the baseband bandwidth; and
a channel selecting filter section for passing only the desired channel included in the digital signal mixed by the mixing section.

8. The wireless receiver according to claim 6, wherein the channel selecting section includes:
a channel selecting filter section for selecting the desired channel included in the digital signal obtained by the ADC based on the sampling clock signal;
a clock generating section for generating a channel selecting clock signal for down-converting the digital signal including the desired channel selected by the channel selecting filter section so as to have a baseband bandwidth; and
a mixing section for mixing the channel selecting clock signal generated by the clock generating section with the digital signal obtained by the ADC so as to down-convert the desired channel to the baseband bandwidth.

9. The wireless receiver according to claim 6, wherein the channel selecting section includes:
a digital Fourier transform section for performing a digital Fourier transform on the digital signal obtained by the ADC;
a frequency component selecting section for selecting at least one frequency component obtained by the digital Fourier transform section;
a frequency shifting section for shifting the at least one frequency component selected by the frequency component selecting section to a baseband bandwidth; and
an inverse digital Fourier transform section for selecting the desired channel by performing an inverse digital Fourier transform on the at least one frequency component whose frequency has been shifted by the frequency shifting section.

10. The wireless receiver according to claim 6, wherein
the sampling frequency is less than twice the center frequency of the channel to be received, which channel is included in the intermediate frequency signal, and
the ADC converts the intermediate frequency signal, which has been passed through the bandpass filter, into the digital signal having half the sampling frequency.

11. The wireless receiver according to claim 6, wherein
the sampling frequency is less than twice the center frequency of the channel to be received, which channel is included in the intermediate frequency signal, and
the intermediate frequency signal has a frequency more than or equal to N times (N is an integer of 1 or greater) half the sampling frequency and less than or equal to (N+1) times half the sampling frequency.

12. The wireless receiver according to claim 1, wherein the demodulator includes:
a center frequency variable bandpass filter in which a passing bandwidth is greater than a bandwidth of one channel and smaller than a bandwidth of one band of the radio frequency signal, and a center frequency of the passing bandwidth is variable;
an ADC for converting the intermediate frequency signal, which has been passed through the center frequency variable bandpass filter, into a digital signal based on a sampling clock signal having a sampling frequency equivalent to an integral multiple of the symbol rate; and
a channel selecting section for selecting a desired channel included in the digital signal obtained by the ADC.

13. The wireless receiver according to claim 12, wherein the demodulator further includes:
a level detecting section for detecting an electric power level of an output signal of the center frequency variable bandpass filter; and
an offset controlling section for controlling an offset of the center frequency variable bandpass filter based on a detection result outputted from the level detecting section, wherein
the offset controlling section controls the offset such that a level of the output signal of the center frequency variable bandpass filter is to be maximum.

14. The wireless receiver according to claim 12, wherein the center frequency variable bandpass filter changes the center frequency of the passing bandwidth by changing a capacity value of a varactor diode and a current value of an operation amplifier.

15. The wireless receiver according to claim 12, wherein the center frequency variable bandpass filter is a switched capacitor circuit having at least two switching elements and at least one capacitor, and changes the center frequency by changing a switching cycle of either of the switching elements.

16. The wireless receiver according to claim 1, wherein the frequency converter includes:
a first phase shifter for generating a first signal by rotating a phase of the local oscillation signal outputted from the local oscillator by 0 degrees and generating a second signal by rotating the phase of the local oscillation signal outputted from the local oscillator by 90 degrees;
a first down-converter for down-converting the radio frequency signal based on the first signal;
a second down-converter for down-converting the radio frequency signal based on the second signal; and
a second phase shifter for combining two signals obtained by rotating a phase of the signal outputted from the first down-converter by 0 degrees and by rotating a phase of the signal outputted from the second down-converter by 90 degrees, and inputting the combined signal to the demodulator.

17. The wireless receiver according to claim 1, wherein the frequency converter includes:
a phase shifter for generating a first signal by rotating a phase of the local oscillation signal outputted from the local oscillator by 0 degrees and generating a second signal by rotating the phase of the local oscillation signal outputted from the local oscillator by 90 degrees;
a first down-converter for down-converting the radio frequency signal based on the first signal, and inputting the down-converted signal to the demodulator; and
a second down-converter for down-converting the radio frequency signal based on the second signal, and inputting the down-converted signal to the demodulator, wherein
the demodulator has a configuration for removing an image frequency.

18. The wireless receiver according to claim 17, wherein the demodulator includes:
a first bandpass filter for passing the intermediate frequency signal, corresponding to a band to be received, which is included in an output signal of the first down-converter;
a first ADC for converting the intermediate frequency signal, which has been passed through the first bandpass filter, into a digital signal based on a sampling clock signal having a sampling frequency equivalent to an integral multiple of the symbol rate;
a first channel selecting filter for selecting a desired channel included in the digital signal obtained by the first ADC;
a second bandpass filter for passing the intermediate frequency signal, corresponding to the band to be received, which is included in an output signal of the second down-converter;
a second ADC for converting the intermediate frequency signal, which has been passed through the second bandpass filter, into a digital signal based on the sampling clock signal having the sampling frequency equivalent to an integral multiple of the symbol rate;
a second channel selecting filter for selecting the desired channel included in the digital signal obtained by the second ADC;
a channel selecting clock generating section for generating first and second channel selecting clock signals used for down-converting the desired channel to a baseband bandwidth;
a second phase shifter for outputting the first channel selecting clock signal whose phase is shifted by 0 degrees and outputting the first channel selecting clock signal whose phase is shifted by 90 degrees;
a third phase shifter for outputting the second channel selecting clock signal whose phase is rotated by −90 degrees and outputting the second channel selecting signal whose phase is rotated by 0 degrees;
a first synthesis section for mixing an output of the first channel selecting filter with the first channel selecting clock signal, whose phase has been rotated by 0 degrees, outputted from the second phase shifter and mixing an output of the second channel selecting filter with the first channel selecting clock signal, whose phase has been rotated by 90 degrees, outputted from the second phase shifter, and combining two signals obtained from the mixings; and
a second synthesis section for mixing the output of the second channel selecting filter with the second channel selecting clock signal, whose phase has been rotated by 0 degrees, outputted from the third phase shifter and mixing the output of the first channel selecting filter with the second channel selecting clock signal, whose phase has been rotated by −90 degrees, outputted from the third phase shifter, and combining two signals obtained from the mixings.

19. The wireless receiver according to claim 17, wherein the demodulator includes:
a first bandpass filter for passing the intermediate frequency signal, corresponding to a band to be received, which is included in an output signal of the first down-converter;
a first ADC for converting the intermediate frequency signal, which has been passed through the first bandpass filter, into a digital signal based on a sampling clock signal having a sampling frequency equivalent to an integral multiple of the symbol rate;
a first channel selecting filter for selecting a desired channel included in the digital signal obtained by the first ADC;
a second bandpass filter for passing the intermediate frequency signal, corresponding to the band to be received, which is included in an output signal of the second down-converter;
a second ADC for converting the intermediate frequency signal, which has been passed through the second bandpass filter, into a digital signal based on the sampling clock signal having the sampling frequency equivalent to an integral multiple of the symbol rate;

a second channel selecting filter for selecting the desired channel included in the digital signal obtained by the second ADC;

a channel selecting clock generating section for generating a channel selecting clock signal used for down-converting the desired channel to a baseband bandwidth;

a second phase shifter for rotating a phase of an output of the first channel selecting filter by −90 degrees;

a third phase shifter for rotating a phase of an output of the second channel selecting filter by 90 degrees;

a first synthesis section for combining an output of the second phase shifter and the output of the second channel selecting filter;

a second synthesis section for combining an output of the third phase shifter and the output of the first channel selecting filter;

a third down-converter for down-converting an output of the second synthesis section based on the channel selecting clock signal; and a fourth down-converter for down-converting an output of the first synthesis section based on the channel selecting clock signal.

20. The wireless receiver according to claim 17, wherein the demodulator includes:

a first bandpass filter for passing the intermediate frequency signal, corresponding to a band to be received, which is included in an output signal of the first down-converter;

a first ADC for converting the intermediate frequency signal, which has been passed through the first bandpass filter, into a digital signal based on a sampling clock signal having a sampling frequency equivalent to an integral multiple of the symbol rate;

a first digital Fourier transform section for performing a digital Fourier transform on the digital signal obtained by the first ADC;

a second bandpass filter for passing the intermediate frequency signal, corresponding to the band to be received, which is included in an output signal of the second down-converter;

a second ADC for converting the intermediate frequency signal, which has been passed through the second bandpass filter, into a digital signal based on the sampling clock signal having the sampling frequency equivalent to an integral multiple of the symbol rate;

a second digital Fourier transform section for performing the digital Fourier transform on the digital signal obtained by the second ADC;

a first frequency component selecting section for selecting at least one frequency component from among a plurality of frequency components obtained by the first digital Fourier transform section;

a first multiplication section for multiplying the at least one frequency component selected by the first frequency component selecting section by −j (j is an imaginary number);

a second frequency component selecting section for selecting at least one frequency component from among a plurality of frequency components obtained by the second digital Fourier transform section;

a second multiplication section for multiplying the at least one frequency component selected by the second frequency component selecting section by −j (j is an imaginary number);

a first synthesis section for combining a multiplication result outputted from the first multiplication section and the at least one frequency component selected by the second frequency component selecting section;

a second synthesis section for combining a multiplication result outputted from the second multiplication section and the at least one frequency component selected by the first frequency component selecting section;

a first frequency shifting section for shifting a combined result outputted from the first synthesis section to a baseband bandwidth;

a second frequency shifting section for shifting a combined result outputted from the second synthesis section to the baseband bandwidth;

a first inverse digital Fourier transform section for selecting a desired channel by performing an inverse digital Fourier transform on the at least one frequency component whose frequency has been shifted by the first frequency shifting section; and a second inverse digital Fourier transform section for selecting the desired channel by performing the inverse digital Fourier transform on the at least one frequency component whose frequency has been shifted by the second frequency shifting section.

21. The wireless receiver according to claim 1, wherein the frequency converter includes a first switch, a second switch, a third switch, a first capacitor, and a second capacitor, the radio frequency signal is inputted to the first switch, an output signal of the first switch is inputted to the second switch, an output signal of the second switch is inputted to the demodulator, the first capacitor is inserted between a GND and a connection point of the first switch and the second switch, the second capacitor and the third switch are inserted in series between the GND and the connection point of the first switch and the second switch, the first switch is turned on and off in accordance with a frequency of an output signal of the local oscillator, the second switch is turned on when the first switch is on, and is turned off when the first switch is off, and the third switch is turned on and off in accordance with a frequency band of the radio frequency signal.

22. The wireless receiver according to claim 21, wherein the third switch is turned on when the frequency band of the radio frequency signal is low, and is turned off when the frequency band of the radio frequency signal is high.

23. The wireless receiver according to claim 21, comprising a plurality of circuits having same configurations as those of the first to third switches and the first and second capacitors, wherein the plurality of circuits are connected in parallel to each other, and the plurality of the third switches are turned on and off simultaneously in accordance with the frequency band of the radio frequency signal.

24. The wireless receiver according to claim 1, wherein the local oscillator selects, when a plurality of the local oscillatory frequencies each causing the center frequency to be equivalent to an integral multiple of the symbol rate exist, one local oscillatory frequency which is placed at a center of the variable frequency range from among the plurality of the local oscillatory frequencies.

* * * * *